United States Patent
Suzuki et al.

(10) Patent No.: US 12,068,243 B2
(45) Date of Patent: Aug. 20, 2024

(54) SEMICONDUCTOR STORAGE DEVICE AND METHOD FOR MANUFACTURING THE SAME

(71) Applicant: KIOXIA CORPORATION, Tokyo (JP)

(72) Inventors: Ryota Suzuki, Yokkaichi Mie (JP); Ken Komiya, Nagoya Aichi (JP); Katsuyuki Kitamoto, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 446 days.

(21) Appl. No.: 17/466,807

(22) Filed: Sep. 3, 2021

(65) Prior Publication Data

US 2022/0310509 A1    Sep. 29, 2022

(30) Foreign Application Priority Data

Mar. 24, 2021 (JP) .................................. 2021-049444

(51) Int. Cl.
    *H01L 23/522*    (2006.01)
    *H01L 21/768*    (2006.01)
    *H10B 41/27*     (2023.01)
    *H10B 43/27*     (2023.01)

(52) U.S. Cl.
    CPC .... *H01L 23/5226* (2013.01); *H01L 21/76831* (2013.01); *H01L 21/76877* (2013.01); *H10B 41/27* (2023.02); *H10B 43/27* (2023.02); *H01L 2221/1063* (2013.01)

(58) Field of Classification Search
    None
    See application file for complete search history.

(56) References Cited

U.S. PATENT DOCUMENTS

| | | | |
|---|---|---|---|
| 10,748,926 B2 | 8/2020 | Nishikawa et al. | |
| 10,763,276 B2 | 9/2020 | Takekida | |
| 10,796,776 B2 | 10/2020 | Suzuki et al. | |
| 2020/0066346 A1 | 2/2020 | Li et al. | |
| 2020/0075100 A1 | 3/2020 | Yagi | |
| 2020/0075607 A1 | 3/2020 | Kasashima | |
| 2020/0075615 A1 | 3/2020 | Oga et al. | |
| 2022/0302138 A1* | 9/2022 | Mitsuno | H10B 43/20 |

FOREIGN PATENT DOCUMENTS

JP    2020-035930 A    3/2020

* cited by examiner

*Primary Examiner* — Hsien Ming Lee
(74) *Attorney, Agent, or Firm* — Kim & Stewart LLP

(57) ABSTRACT

A semiconductor storage device includes a first wiring layer, a first insulating layer on the first wiring layer, a second wiring layer on the first insulating layer, a second insulating layer on the second wiring layer, a third wiring layer on the second insulating layer, and a first pillar that passes through the first, second, and third wiring layers and the first and second insulating layers along a first direction and includes a first semiconductor layer. A first distance between side surfaces of the first wiring layer and the first insulating layer facing the first pillar is greater than a second distance between side surfaces of the second wiring layer and the second insulating layer facing the first pillar and a third distance between the side surfaces of the second insulating layer and the third wiring layer facing the first pillar.

10 Claims, 43 Drawing Sheets

SEMICONDUCTOR STORAGE DEVICE AND METHOD FOR MANUFACTURING THE SAME

CROSS-REFERENCE TO RELATED APPLICATION

This application is based upon and claims the benefit of priority from Japanese Patent Application No. 2021-049444, filed Mar. 24, 2021, the entire contents of which are incorporated herein by reference.

FIELD

Embodiments described herein relate generally to a semiconductor storage device and a method for manufacturing the same.

BACKGROUND

As a semiconductor storage device, a NAND flash memory is known.

DETAILED DESCRIPTION

Figure 1:
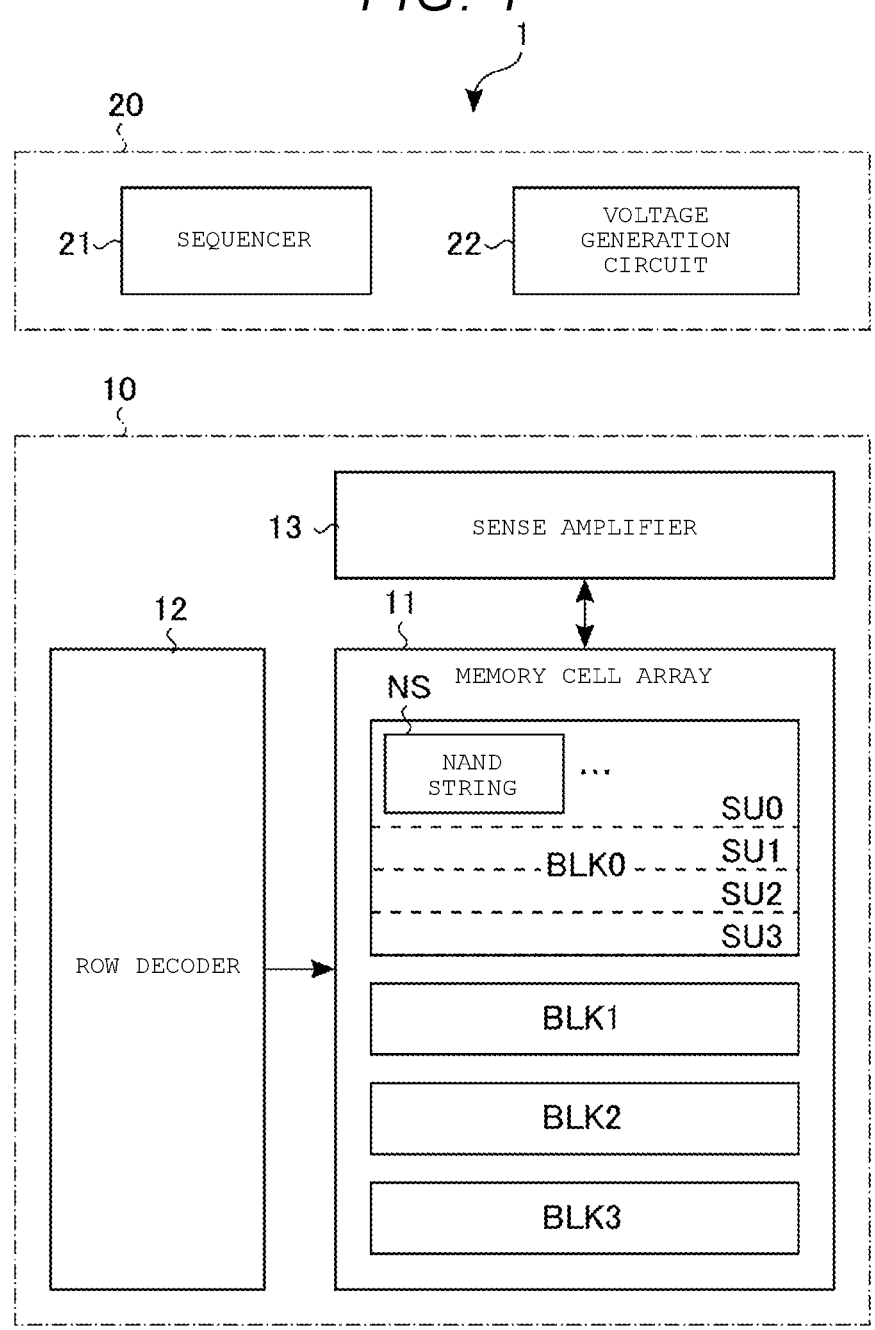
FIG. 1 is a block diagram of a semiconductor storage device according to a first embodiment.

Embodiments provide a semiconductor storage device having improved reliability.

In general, according to one embodiment, a semiconductor storage device includes a first wiring layer, a first insulating layer on the first wiring layer, a second wiring layer on the first insulating layer, a second insulating layer on the second wiring layer, a third wiring layer on the second insulating layer, and a first pillar that passes through the first, second, and third wiring layers and the first and second insulating layers along a first direction and includes a first semiconductor layer. A first distance between a side surface of the first wiring layer facing the first pillar and a side surface of the first insulating layer facing the first pillar in a second direction perpendicular to the first direction is greater than a second distance between a side surface of the second wiring layer facing the first pillar and a side surface of the second insulating layer facing the first pillar in the second direction and a third distance between the side surface of the second insulating layer and a side surface of the third wiring layer facing the first pillar in the second direction.

In the following, a plurality of embodiments will be described with reference to the drawings. Further, in the following description, components having substantially the same functions are designated by the same reference numerals. A redundant description may be omitted. In addition, each of the following embodiments also provides a device and a method for implementing the technical concept of this disclosure. The technical concept of this disclosure does not limit the material, shape, structure, arrangement, and the like of the components to those described below. Various changes may be made to the technical concept of the embodiment without departing from the gist of the disclosure. These embodiments and modifications thereof are included in the scope of the disclosure disclosed in the claims and the equivalent scope thereof.

1. First Embodiment

A semiconductor storage device according to a first embodiment will be described.

1.1 Configuration

1.1.1 Overall Configuration of Semiconductor Storage Device

First, an example of an overall configuration of a semiconductor storage device 1 will be described with reference to FIG. 1. FIG. 1 is a block diagram of the semiconductor storage device 1.

As shown in FIG. 1, the semiconductor storage device 1 is, for example, a three-dimensional stacked NAND flash memory. In the three-dimensional stacked NAND flash memory, nonvolatile memory cell transistors are arranged three-dimensionally on a semiconductor substrate. The semiconductor storage device 1 includes a memory core part 10 and a controller part 20. The memory core part 10 is a circuitry configured to execute writing, reading, and erasing operations in the semiconductor storage device 1. The controller part 20 is a circuitry disposed around or below the memory core part 10. The controller part 20 executes data input/output to the memory core part 10, control of the operation in the memory core part 10, and the like.

Next, an internal configuration of the memory core part 10 will be described. The memory core part 10 includes a memory cell array 11, a row decoder 12, and a sense amplifier 13.

The memory cell array 11 is a region in which nonvolatile memory cell transistors are arranged three-dimensionally.

The memory cell array 11 includes a plurality of blocks BLK. In the example of FIG. 1, the memory cell array 11 includes the blocks BLK0, BLK1, BLK2, and BLK3. Each block BLK is, for example, a set of a plurality of memory cell transistors from which data is erased at once. Each block BLK includes a plurality of memory cell transistors corresponding to rows and columns. Each block BLK includes a plurality of string units SU. In the example of FIG. 1, the block BLK0 includes four string units SU0, SU1, SU2, and SU3. Each string unit SU includes, for example, a set of a plurality of NAND strings NS that are selected at once in a write operation or a read operation. Each NAND string NS includes a set of a plurality of memory cell transistors connected in series. Further, the number of blocks BLK in the memory cell array 11 and the number of string units SU in the block BLK are any numbers. Details of the memory cell array 11 will be described below.

The row decoder 12 is a circuit that decodes a row address. The row decoder 12 receives information on a row address received from an external controller. The row decoder 12 selects any one of the blocks BLK based on a result of decoding the information on the row address. Then, the row decoder 12 applies a voltage to a wiring (e.g., a word line and a select gate line) in a row direction of the selected block BLK.

The sense amplifier 13 is a circuit that writes and reads data. When reading data, the sense amplifier 13 reads data from a memory cell transistor of any one block BLK. When writing data, the sense amplifier 13 also applies a voltage corresponding to the written data to the memory cell array 11.

Next, an internal configuration of the controller part 20 will be described. The controller part 20 includes a sequencer 21 and a voltage generation circuit 22.

The sequencer 21 is a circuit that controls the semiconductor storage device 1. More specifically, the sequencer 21 controls the voltage generation circuit 22, the row decoder 12, the sense amplifier 13, and the like during the write operation, the read operation, and the erasing operation.

The voltage generation circuit 22 generates a voltage used for the write operation, the read operation, and the erasing operation. The voltage generation circuit 22 applies the voltage to the row decoder 12, the sense amplifier 13, and the like, for example.

1.1.2 Circuit Configuration of Memory Cell Array

Next, an example of a circuit configuration of the memory cell array 11 will be described with reference to FIG. 2. Further, the example of FIG. 2 shows a circuit configuration of one block BLK.

Figure 2:
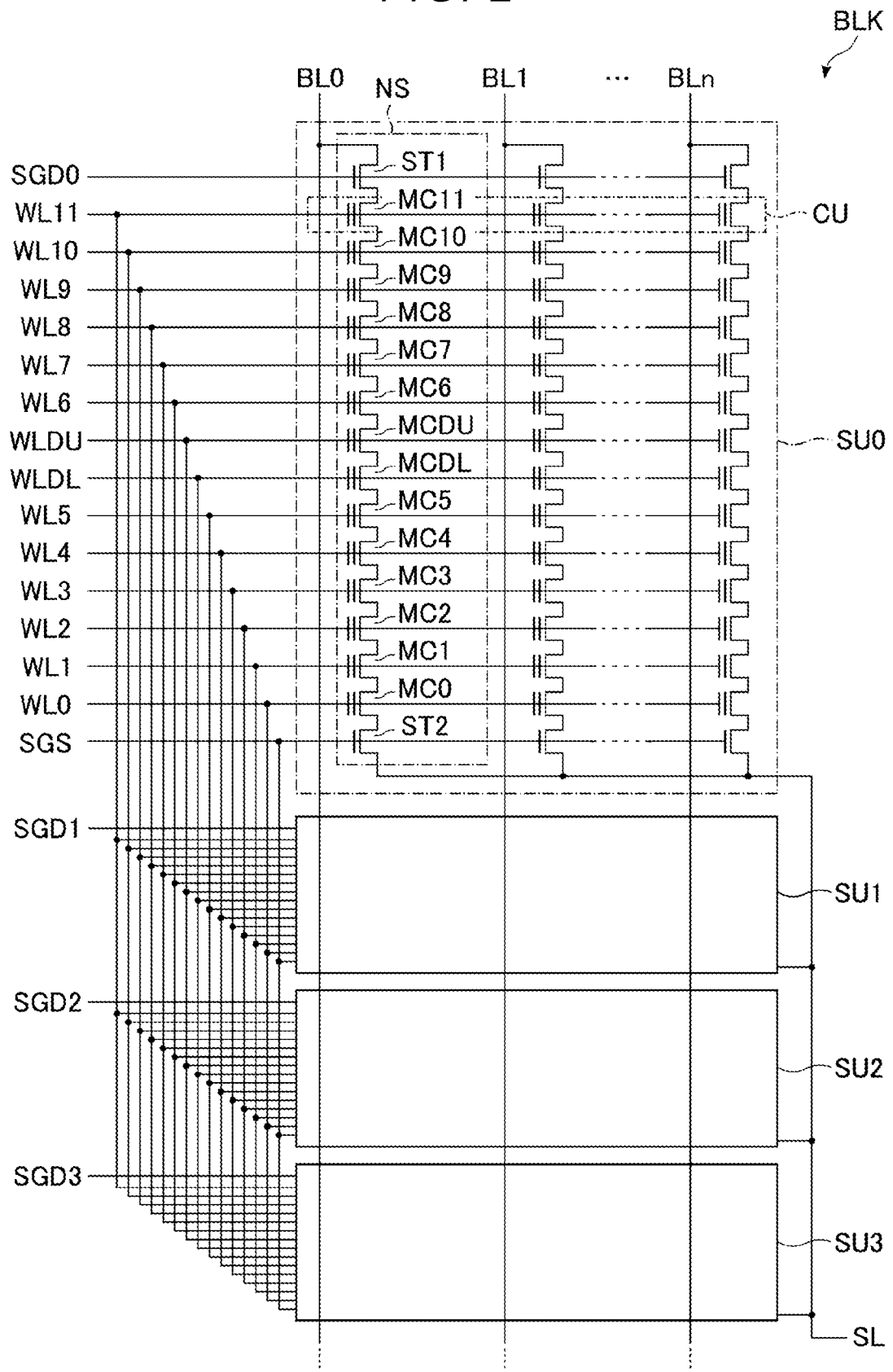
FIG. 2 is a circuit diagram of a memory cell array according to a first embodiment.

As shown in FIG. 2, the block BLK includes, for example, four string units SU0, SU1, SU2, and SU3. Each string unit SU includes a plurality of NAND strings NS. For example, n+1 NAND strings NS (where n is an integer of 1 or more) in the string unit SU are connected to n+1 bit lines BL0 to BLn, respectively.

Each NAND string NS includes a plurality of memory cell transistors MC, a plurality of dummy memory cell transistors MCD, and select transistors ST1 and ST2. In the example of FIG. 2, the NAND string NS includes twelve memory cell transistors MC0 to MC11. The NAND string NS also includes two dummy memory cell transistors MCDL and MCDU. The numbers of memory cell transistors MC and dummy memory cell transistors MCD are any numbers. The number of dummy memory cell transistors MCD may be zero.

The memory cell transistor MC stores data in a nonvolatile manner. The dummy memory cell transistor MCD has the same configuration as the memory cell transistor MC. The dummy memory cell transistor MCD may not be used to store valid data. Furthermore, data read from the dummy memory cell transistor MCD is not treated as valid data. The memory cell transistor MC and the dummy memory cell transistor MCD include a control gate and a charge storage layer.

The memory cell transistor MC and the dummy memory cell transistor MCD may be a metal-oxide-nitride-oxide-silicon (MONOS) type or a floating gate (FG) type. The MONOS type uses an insulating layer as the charge storage layer. The FG type uses a conductor layer as the charge storage layer. In the following, a case where the memory cell transistor MC and the dummy memory cell transistor MCD are the MONOS type will be described.

The select transistors ST1 and ST2 are used to select the string unit SU during various operations. The numbers of select transistors ST1 and ST2 are any number. One or more select transistors ST1 and ST2 may be included in each NAND string NS.

The current paths of the memory cell transistors MC, the dummy memory cell transistors MCD, and the select transistors ST1 and ST2 in each NAND string NS are connected in series. More specifically, the current paths are connected in series in order of the select transistor ST2, the memory cell transistors MC0 to MC5, the dummy memory cell transistor MCDL, the dummy memory cell transistor MCDU, the memory cell transistors MC6 to MC11, and the select transistor ST1. The drain of the select transistor ST1 is connected to any one bit line BL. The source of the select transistor ST2 is connected to the source line SL.

The control gates of the memory cell transistors MC0 to MC11 in the same block BLK are connected to word lines WL0 to WL11, respectively. Similarly, the control gates of the dummy memory cell transistors MCDL and MCDU are connected to dummy word lines WLDL and WLDU, respectively. More specifically, the block BLK includes four string units SU0 to SU3 in this example. Thus, each of the string units SU0 to SU3 includes a plurality of memory cell transistors MC0. The control gates of these plurality of memory cell transistors MC0 in the block BLK are commonly connected to one word line WL0. The same applies to the memory cell transistors MC1 to MC11 and the dummy memory cell transistors MCDL and MCDU.

The gates of the plurality of select transistors ST1 in the string unit SU are commonly connected to one select gate line SGD. More specifically, the string unit SU0 includes the plurality of select transistors ST1. The gates of the plurality of select transistors ST1 in the string unit SU0 are commonly connected to a select gate line SGD0. Similarly, the gates of the plurality of select transistors ST1 in the string unit SU1 are commonly connected to a select gate line SGD1. The gates of the plurality of select transistors ST1 in the string unit SU2 are commonly connected to a select gate line SGD2. The gates of the plurality of select transistors ST1 in the string unit SU3 are commonly connected to a select gate line SGD3.

The gates of the plurality of select transistors ST2 in the same block BLK are commonly connected to one select gate line SGS. More specifically, for example, the block BLK includes four string units SU0 to SU3. Thus, each of the string units SU0 to SU3 includes the plurality of select transistors ST2. The gates of these plurality of select transistors ST2 in the block BLK are commonly connected to one select gate line SGS.

The word lines WL0 to WL11, the dummy word lines WLDL and WLDU, the select gate lines SGD0 to SGD3, and the select gate line SGS are each connected to the row decoder 12.

The bit line BL is commonly connected to one NAND string NS in each string unit SU of a block BLK. The same column address is assigned to the plurality of NAND strings NS connected to one bit line BL. Each bit line BL is connected to the sense amplifier 13.

For example, a single source line SL is connected to each of the plurality of blocks BLK.

A set of the plurality of memory cell transistors MC connected to one word line WL in one string unit SU is referred to as, for example, a "cell unit CU". For example, in a case where the memory cell transistor MC stores 1-bit data, a storage capacitance of the cell unit CU is defined as "one page data". The cell unit CU may store two or more pages of data based on the number of bits of data stored in the memory cell transistors MC.

1.1.3 Cross-Sectional Configuration of Memory Cell Array

Figure 3:
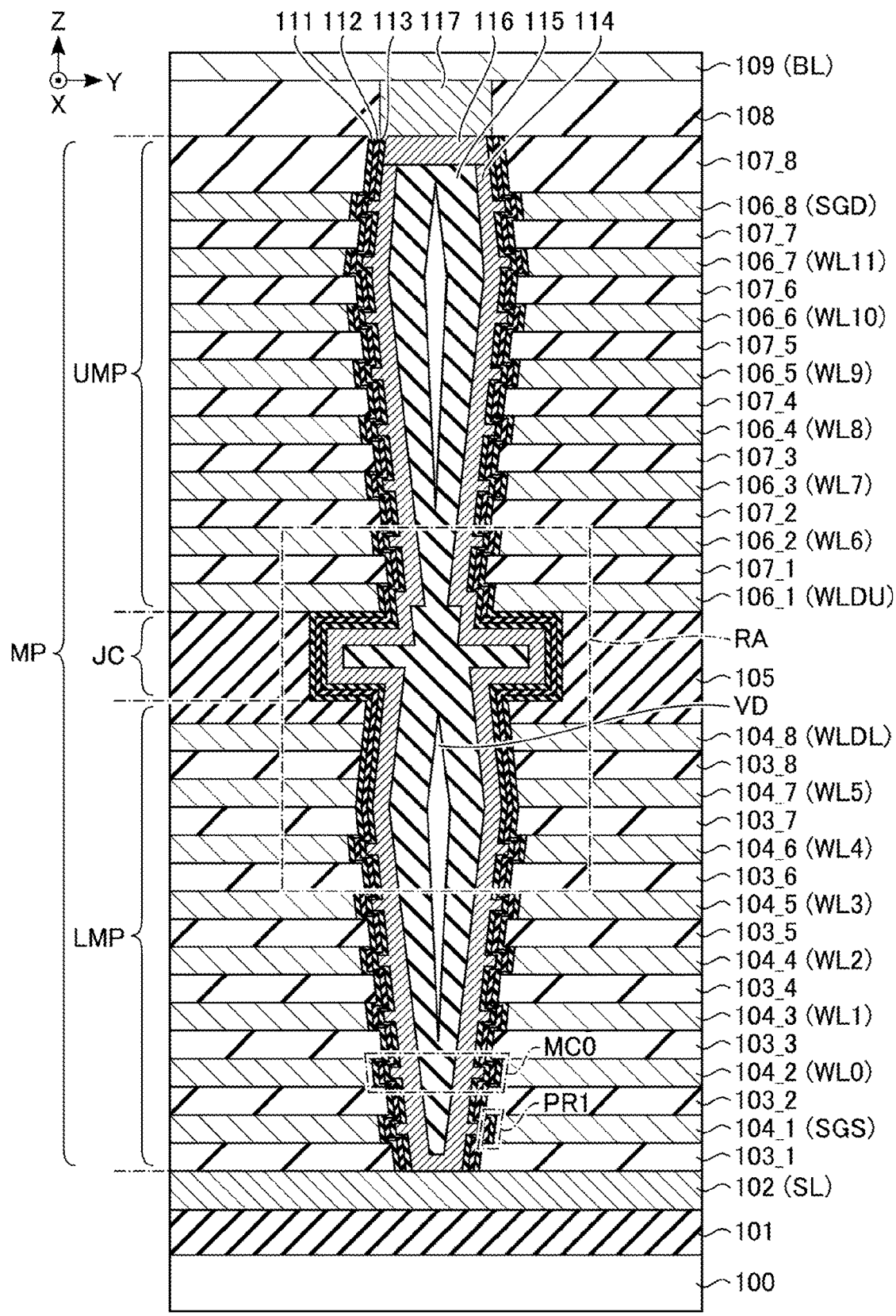
FIG. 3 is a cross-sectional view of a memory cell array according to a first embodiment.

Next, an example of a cross-sectional configuration of the memory cell array 11 will be described with reference to FIG. 3. FIG. 3 shows a cross-sectional diagram of one NAND string NS. In the following description, a direction substantially parallel to a semiconductor substrate 100 is referred to as an X direction. A direction that is substantially parallel to the semiconductor substrate 100 and intersects the X direction is referred to as a Y direction. Furthermore, a direction that intersects the X direction and the Y direction and is substantially perpendicular to the semiconductor substrate 100 is referred to as a Z direction.

As shown in FIG. 3, an insulating layer 101 is formed above the semiconductor substrate 100. A wiring layer 102 is disposed on the insulating layer 101. The insulating layer 101 includes silicon and oxygen, for example, silicon oxide (SiO). Further, a circuit such as the row decoder 12 or the sense amplifier 13 may be disposed in a region where the insulating layer 101 is formed, that is, between the semiconductor substrate 100 and the wiring layer 102.

The wiring layer 102 extends along each of the X direction and the Y direction. The wiring layer 102 functions as the source line SL. The wiring layer 102 includes a conductive material. The conductive material includes, for example, a metal material or an n-type semiconductor. The n-type semiconductor is a semiconductor in which impurities such as phosphor (P), arsenic (As) or the like are added to a semiconductor material such as silicon (Si).

On the wiring layer 102, a plurality of insulating layers 103 and a plurality of wiring layers 104 are alternately stacked one by one. In an example of FIG. 3, eight insulating layers 103_1 to 103_8 and eight wiring layers 104_1 to 104_8 are alternately stacked one by one. More specifically, the wiring layer 104_1 is disposed on the insulating layer 103_1. The insulating layer 103_2 is disposed on the wiring layer 104_1. The wiring layer 104_2 is disposed on the insulating layer 103_2. The insulating layer 103_3 is disposed on the wiring layer 104_2. The wiring layer 104_3 is disposed on the insulating layer 103_3. The insulating layer 103_4 is disposed on the wiring layer 104_3. The wiring layer 104_4 is disposed on the insulating layer 103_4. The insulating layer 103_5 is disposed on the wiring layer 104_4. The wiring layer 104_5 is disposed on the insulating layer 103_5. The insulating layer 103_6 is disposed on the wiring layer 104_5. The wiring layer 104_6 is disposed on the insulating layer 103_6. The insulating layer 103_7 is disposed on the wiring layer 104_6. The wiring layer 104_7 is disposed on the insulating layer 103_7. The insulating layer 103_8 is disposed on the wiring layer 104_7. The wiring layer 104_8 is disposed on the insulating layer 103_8.

For example, the wiring layer 104_1 functions as a select gate line SGS. The wiring layers 104_2 to 104_7 function as word lines WL0 to WL5, respectively. The wiring layer 104_8 functions as a dummy word line WLDL.

An insulating layer 105 is disposed on the wiring layer 104_8.

On the insulating layer 105, a plurality of wiring layers 106 and a plurality of insulating layers 107 are alternately stacked one by one. In the example of FIG. 3, eight wiring layers 106_1 to 106_8 and eight insulating layers 107_1 to 107_8 are alternately stacked one by one. More specifically, the insulating layer 107_1 is disposed on the wiring layer 106_1. The wiring layer 106_2 is disposed on the insulating layer 107_1. The insulating layer 107_2 is disposed on the wiring layer 106_2. The wiring layer 106_3 is disposed on the insulating layer 107_2. The insulating layer 107_3 is disposed on the wiring layer 106_3. The wiring layer 106_4 is disposed on the insulating layer 107_3. The insulating layer 107_4 is disposed on the wiring layer 106_4. The wiring layer 106_5 is disposed on the insulating layer 107_4. The insulating layer 107_5 is disposed on the wiring layer 106_5. The wiring layer 106_6 is disposed on the insulating layer 107_5. The insulating layer 107_6 is disposed on the wiring layer 106_6. The wiring layer 106_7 is disposed on the insulating layer 107_6. The insulating layer 107_7 is disposed on the wiring layer 106_7. The wiring layer 106_8 is disposed on the insulating layer 107_7. The insulating layer 107_8 is disposed on the wiring layer 106_8.

For example, the wiring layer 106_1 functions as a dummy word line WLDU. The wiring layers 106_2 to 106_7 function as word lines WL6 to WL11, respectively. The wiring layer 106_8 functions as a select gate line SGD.

On the insulating layer 107_8, an insulating layer 108 is disposed.

For the insulating layers 103_1 to 103_8, 105, 107_1 to 107_8, and 108 include silicon and oxygen, for example, silicon oxide. The wiring layers 104_1 to 104_8 and 106_1 to 106_8 include a conductive material. The conductive material includes, a metal material, an n-type semiconductor, a p-type semiconductor, or the like. The p-type semiconductor is a semiconductor in which impurities such as boron (B) are added to a semiconductor material such as silicon. In the following, a case where a stacked structure of titanium nitride (TiN)/tungsten (W) is used for the conductive material of the wiring layers 104_1 to 104_8 and 106_1 to 106_8 will be described. Titanium nitride is formed to cover the tungsten. Titanium nitride functions as a barrier layer to inhibit a reaction between tungsten and Silicon oxide or as an adhesive layer to improve the adherence of tungsten when the tungsten is formed by chemical vapor deposition (CVD), for example. The wiring layers 104_1 to 104_8 and 106_1 to 106_8 may include a high dielectric constant material such as aluminum oxide (AlO). In such a case, the high dielectric constant material is formed to cover the conductive material. For example, in each of the wiring layers 104 and 106, such as aluminum oxide (AlO) is disposed to be in contact with the insulating layers disposed above and below the wiring layer and a side surface of the memory pillar MP. Then, titanium nitride is disposed to be in contact with such as aluminum oxide (AlO). Then, tungsten is disposed to be in contact with titanium nitride to fill an inside of the wiring layer.

A plurality of memory pillars MP are arranged in the memory cell array 11. One memory pillar MP corresponds to one NAND string NS. The memory pillar MP penetrates the wiring layers 104_1 to 104_8 and 106_1 to 106_8. The bottom surface of the memory pillar MP reaches the wiring layer 102. For example, which memory pillar MP includes a lower memory pillar LMP, a connecting portion JC, and an upper memory pillar UMP. Further, any number of pillars and portions may be included in the memory pillar MP.

The lower memory pillar LMP passes through or penetrates the insulating layers 103_1 to 103_8 and the wiring layers 104_1 to 104_8. The bottom surface of the lower memory pillar LMP reaches the wiring layer 102. The height position of the upper end of the lower memory pillar LMP of the present embodiment is higher than that of the lower surface of the insulating layer 105. In addition, the height position of the upper end of the lower memory pillar LMP is lower than that of the upper surface of the insulating layer 105. The lower memory pillar LMP has a substantially cylindrical shape extending along the Z direction. Further, the lower memory pillar LMP may have a circular shape or rectangular shape in the XY plane. The shape of a cross section of the lower memory pillar LMP depends on a manufacturing process (e.g., dry etching process characteristics). For example, a length of the lower memory pillar LMP in the Y direction is longer in the central part (near the insulating layer 103_7 and the wiring layer 104_7 in the example of FIG. 3) than in the end part. Moreover, the length of the lower memory pillar LMP in the Y direction is shorter at the lower end than at the upper end.

The lower memory pillar LMP of the present embodiment has a plurality of protrusion parts PR1 on the side surface thereof in the wiring layers 104_1 to 104_6. The respective protrusion parts PR1 protrude from the center of the lower memory pillar LMP (i.e., the central axis extending along the Z direction) toward the wiring layers 104_1 to 104_6. On the other hand, the lower memory pillar LMP does not have the protrusion parts PR1 on side surfaces thereof in the wiring layer 104_8, which is the uppermost layer, and the wiring layer 104_7, which is the second layer from the uppermost layer. Further, the number of the wiring layers 104 in which the protrusion part PR1 is not disposed may be two or more layers, counting from the uppermost wiring layer 104 (i.e., the wiring layer 104_8 in the present embodiment) Furthermore, the lower memory pillar LMP may have an uneven portion finer than that of the protrusion part PR1 in the same layers as the wiring layer 104_7 and the uppermost wiring layer 104_8 due to manufacturing variations and the like.

The connecting portion JC is disposed on the lower memory pillar LMP in the insulating layer 105. The connecting portion JC may have a circular shape or rectangular shape in the XY plane. A length of the connecting portion JC in the Y direction is longer than that of the upper end of the lower memory pillar LMP. The connecting portion JC and the lower memory pillar LMP in the uppermost wiring layer 104_8 are adjacent to each other via the insulating layer 105 in the Z direction.

The upper memory pillar UMP passes through or penetrates the wiring layers 106_1 to 106_8 and the insulating layers 107_1 to 107_8. The bottom surface of the upper memory pillar UMP is in contact with the connecting portion JC. The upper memory pillar UMP has a substantially cylindrical shape extending along the Z direction. Alternatively, the upper memory pillar UMP may have a circular shape or rectangular shape in the XY plane. The shape of a cross section of the upper memory pillar UMP depends on a manufacturing process. For example, a length of the upper memory pillar UMP in the Y direction is longer in the central part (which is near the insulating layer 107_6 and the wiring layer 106_7 in the example of FIG. 3) than in the end part, similar to the lower memory pillar LMP. Furthermore, the length of the upper memory pillar UMP in the Y direction is shorter at the lower end than at the upper end. The upper memory pillar UMP of the present embodiment has protrusion parts PR1 on its side surface in the wiring layers 106_1 to 106_8. The respective protrusion parts PR1 of the upper memory pillar UMP protrude from the center of the upper memory pillar UMP toward the wiring layers 106_1 to 106_8.

Next, the internal structure of the memory pillar MP will be described. The memory pillar MP includes a block insulating film 111, a charge storage layer 112, a tunnel insulating film 113, a semiconductor layer 114, a core layer 115, and a cap layer 116.

More specifically, on the side surface of the memory pillar MP (the lower memory pillar LMP, the connecting portion JC, and the upper memory pillar UMP), the block insulating film 111, the charge storage layer 112, and the tunnel insulating film 113 are stacked in order from the outside. The semiconductor layer 114 is disposed to be in contact with the side surface of the tunnel insulating film 113 and the wiring layer 102. The semiconductor layer 114 is a region where channels of the memory cell transistors MC, the dummy memory cell transistors MCD, and the select transistors ST1 and ST2 are formed. The inside of the semiconductor layer 114 is filled by the core layer 115. In the example of FIG. 3, voids VD are disposed inside the core layer 115. The shape of the voids VD depends on the shape of the memory pillars MP and the manufacturing process. Alternatively, the voids VD may not be formed. In the upper part of the memory pillar MP (i.e., the upper memory pillar UMP), the cap layer 116 is disposed on the semiconductor layer 114 and the core layer 115. The height position of the bottom surface of the cap layer 116 is higher than that of the upper surface of the uppermost wiring layer 106_8. The side surface of the cap layer 116 is in contact with the tunnel insulating film 113.

The memory pillar MP and the wiring layers 104_2 to 104_7 and 106_2 to 106_7 form the memory cell transistors MC0 to MC11. Therefore, the memory cell transistors MC0 to MC4 and MC6 to MC11 include the protrusion parts PR1. Similarly, the memory pillar MP and the wiring layers 104_8 and 106_1 form the dummy memory cell transistors MCDL and MCDU. Accordingly, the dummy memory cell transistor MCDU includes the protrusion part PR1. The memory pillar MP ad the wiring layer 104_1 form the select transistor ST2. The memory pillar MP and the wiring layer 106_8 form the select transistor ST1. Therefore, the select transistors ST1 and ST2 include the protrusion parts PR1.

The block insulating film 111, the tunnel insulating film 113, and the core layer 115 include silicon and oxygen, for example, silicon oxide. The charge storage layer 112 includes silicon and nitrogen, for example, silicon nitride (SiN). The semiconductor layer 114 includes, for example, polysilicon. The cap layer 116 includes, for example, an n-type semiconductor.

In the insulating layer 108, a contact plug 117 is disposed on the cap layer 116. A wiring layer 109 is disposed on the contact plug 117. The wiring layer 109 functions as a bit line BL. The wiring layer 109 extends along the Y direction. The contact plug 117 and the wiring layer 109 include a conductive material. For the conductive material, for example, a titanium (Ti)/TiN/W-stacked structure, a copper wiring, or the like is used.

Figure 4:
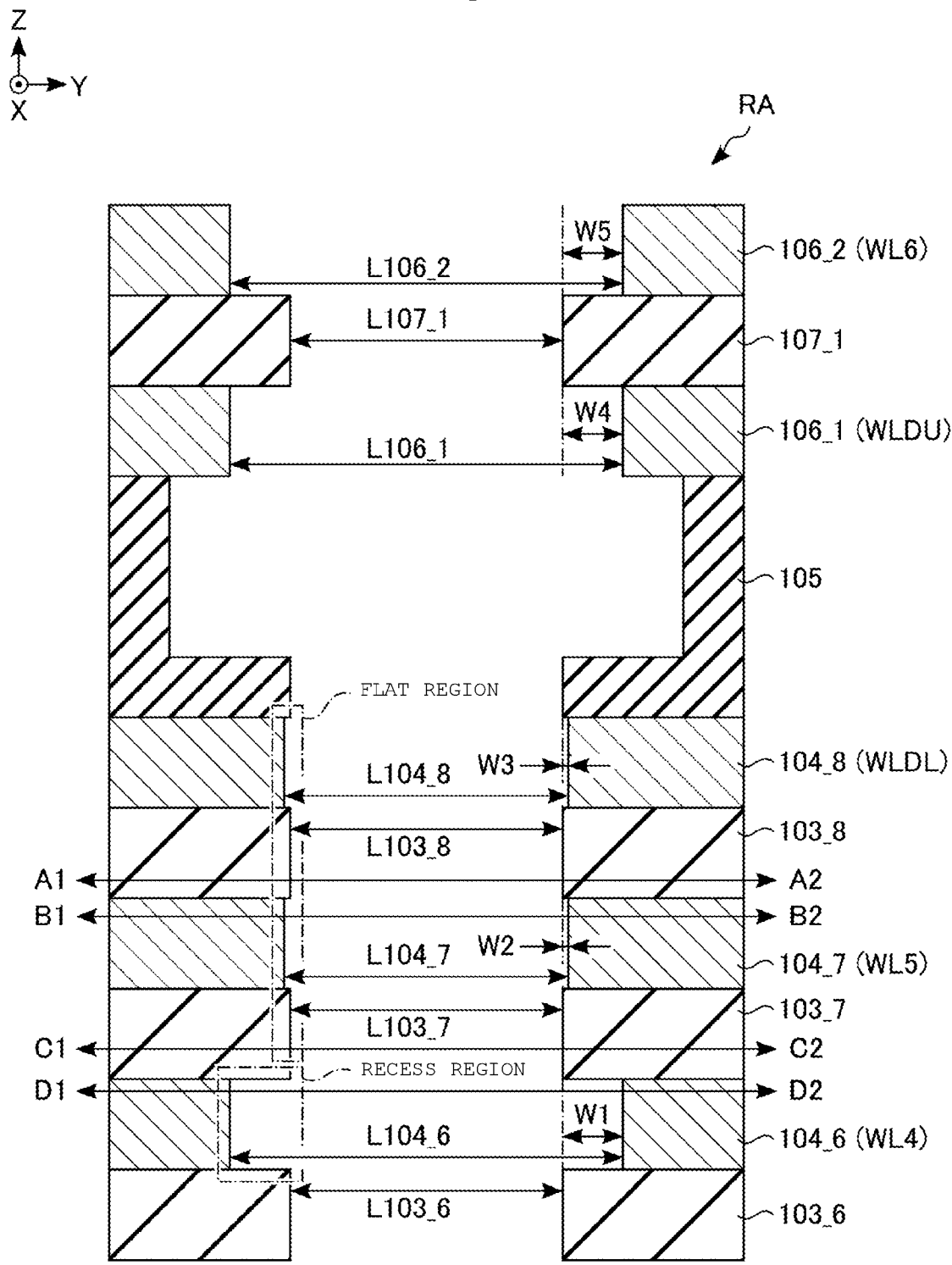
FIG. 4 is an enlarged view of region RA in FIG. 3.
Figure 5:
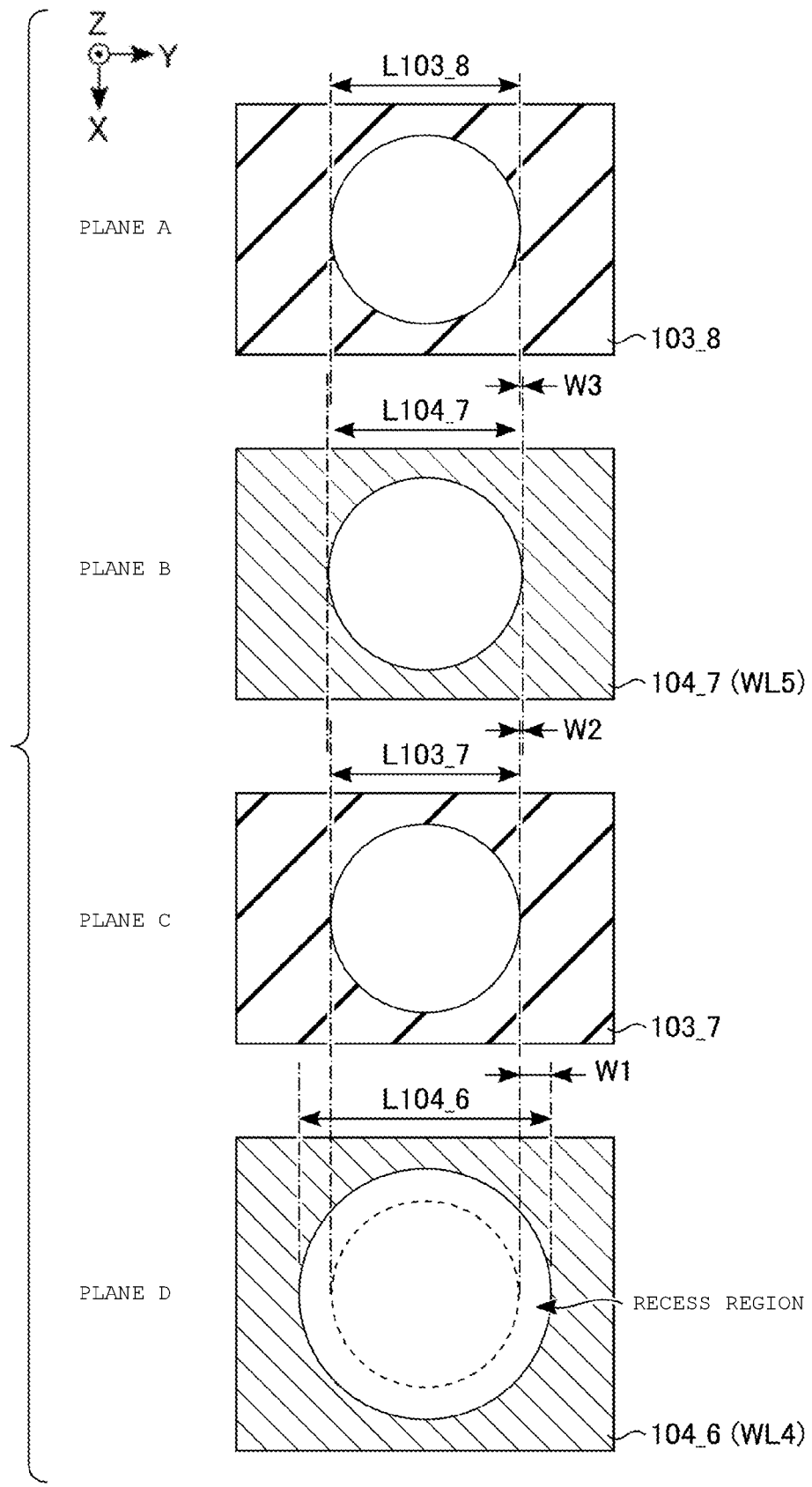
FIG. 5 depicts planes along line A1-A2, line B1-B2, line C1-C2, and line D1-D2 in FIG. 4.

1.1.4 Shape of Wiring Layers and Insulating Layers in Contact with Memory Pillar MP Next, the shapes of the wiring layers and the insulating layers in contact with the memory pillar MP will be described with reference to FIGS. 4 and 5. FIG. 4 is an enlarged view of region RA in FIG. 3. FIG. 5 shows plan views along lines A1-A2, B1-B2, C1-C2, and D1-D2 in FIG. 4. Further, in examples of FIGS. 4 and 5, the memory pillar MP is not illustrated for sake of convenience of explanation. The side surface of each layer faces the memory pillar MP.

In addition, in an example of FIG. 4, for the sake of convenience of explanation, a case where the side surface of each layer extends along the Z direction is shown.

In the following, a plane along the line A1-A2 is referred to as plane A. A plane along the line B1-B2 is referred to as plane B. A plane along the line C1-C2 is referred to as plane C. A plane along the line D1-D2 is referred to as plane D. The plane A refers to a plane along the insulating layer 103_8. The plane B refers to a plane along the wiring layer 104_7. The plane C refers to a plane along the insulating layer 103_7. The plane D refers to a plane along the wiring layer 104_6. Furthermore, in the following description, in a case where the term "substantially the same" is used, it may include variations in shape due to an etching process or the like.

As shown in FIGS. 4 and 5, the widths between the side surfaces of the insulating layers 103_6, 103_7, and 103_8 in the Y direction are referred to as L103_6, L103_7, and L103_8, respectively. The widths between the side surfaces of the wiring layers 104_6, 104_7, and 104_8 in the Y direction are referred to as L104_6, L104_7, and L104_8, respectively. The widths L104_6, L104_7, and L104_8 indicate the diameters of the memory pillar MP in portions of the memory cell transistors MC4 and MC5 and the dummy memory cell transistor MCDL, respectively, in a case where the cross section of the memory pillar MP on the XY plane has a circular shape. Moreover, the widths between the side surfaces of the wiring layers 106_1 and 106_2 in the Y direction are referred to as L106_1 and L106_2, respectively. The widths L106_1 and L106_2 indicates the diameters of the memory pillar MP in portions of the dummy memory cell transistor MCDU and the memory cell transistor MC6, respectively, in a case where the cross section of the memory pillar MP on the XY plane has a circular shape. The width between the side surfaces of the insulating layer 107_1 in the Y direction is referred to as L107_1.

In the present embodiment, the width L103_6, the width L103_7, and the width L103_8 are substantially the same. Further, the width L104_7 and the width L104_8 are substantially the same, and the width L104_6 is greater than the widths L104_7 and L104_8.

In the wiring layers 104_1 to 104_6, the protrusion parts PR1 are disposed on side surfaces of the lower memory pillar LMP. Therefore, the width L104_6 is greater than the width L103_6 and the width L103_7. Accordingly, the side surfaces of the insulating layers 103_6 and 103_7 protrude with respect to the side surface of the wiring layer 104_6. That is, the side surface of the wiring layer 104_6 is recessed with respect to the side surfaces of insulating layers 103_6 and 103_7. In the following, a concave region formed by the wiring layer and the insulating layers disposed above and below the wiring layer is referred to as a "recess region". The recess region corresponds to a shape of a protrusion part of the memory pillar MP. More specifically, the recess region is formed by the side surface of the wiring layer 104_6, and the step between the lower end of the wiring layer 104_6 and the upper end of the insulating layer 103_6, and the step between the upper end of the wiring layer 104_6 and the lower end of the insulating layer 103_7. As shown in the plane D of FIG. 5, the recess region has, for example, a circularly annular shape in a case where the cross section of the memory pillar MP on the XY plane has a circular shape. Hereinafter, the step width or a recess width of the recess region between the wiring layer 104_6 and the insulating layer 103_7 (or 103_6) is referred to as W1. The step W1 may be expressed as $W1=((L104\_6)-(L103\_7))/2$.

In the wiring layer 104_7, the protrusion part PR1 is not disposed on the side surface of the lower memory pillar LMP. Accordingly, there is almost no step between the upper end of the insulating layer 103_7 and the lower end of the wiring layer 104_7, and between the upper end of the wiring layer 104_7 and the lower end of the insulating layer 103_8. That is, the side surface of the insulating layer 103_7, the side surface of the wiring layer 104_7, and the side surface of the insulating layer 103_8 are arranged substantially flat along the Z direction. Alternatively, the side surface of the insulating layer 103_7, and the side surface of the wiring layer 104_7, and the side surface of the insulating layer 103_8 have substantially the same position in the Y direction. Therefore, the width L103_7, the width L104_7, and the width L103_8 are substantially the same. Hereinafter, the step width between the wiring layer 104_7 and the insulating layer 103_8 (or 103_7) is referred to as W2. The step width W2 is substantially zero. Accordingly, the step W2 may be expressed as $W2=((L104\_7)-(L103\_8))/2=((L104\_7)-(L103\_7))/2 \approx 0$. Furthermore, ideally, W2 may be expressed as $((L104\_7)-(L103\_8))/2=((L104\_7)-(L103\_7))/2=0$.

Similarly, there is almost no step between the upper end of the insulating layer 103_8 and the lower end of the wiring layer 104_8. That is, the side surface of the wiring layer 104_8, and the side surface of the insulating layer 103_8 are arranged substantially flat along the Z direction. Alternatively, the side surface of the wiring layer 104_8 and the side surface of the insulating layer 103_8 have substantially the same position in the Y direction. Therefore, the width L103_8 and the width L104_8 are substantially the same. Hereinafter, the step width between the insulating layer 103_8 and the wiring layer 104_8 is referred to as W3. The step width W3 is substantially zero. Accordingly, the step W3 may be expressed as $W3=((L104\_8)-(L103\_8))/2 \approx 0$. Moreover, ideally, W3 may be expressed as $((L104\_8)-(L103\_8))/2=0$. Therefore, the recess widths W1, W2, and W3 have a relationship of W1>W2 and W1>W3. In the following, a region in which there is almost no step between the insulating layers 103 and the wiring layers 104 on their side surfaces is referred to as a "flat region". In the example of FIG. 4, the side surface of the insulating layer 103_7, the side surface of the wiring layer 104_7, the side surface of the insulating layer 103_8, and the side surface of the wiring layer 104_8 are included in the flat region.

In the wiring layers 106_1 to 106_8, the protrusion parts PR1 are disposed on the side surface of the upper memory pillar UMP. A step width between the wiring layer 106_1 and the insulating layer 107_1 is referred to as W4. The step width W4 may be expressed as $W4=((L106\_1)-(L107\_1))/2$. Further, a step width between the wiring layer 106_2 and the insulating layer 107_1 is referred to as W5. The step width W5 may be expressed as $W5=((L106\_2)-(L107\_1))/2$. The protrusions having the step widths W4 and W5 correspond to the protrusion parts PR1 of the upper memory pillar UMP. Therefore, the step width W4 and the step width W5 are substantially the same. Further, the recess region corresponding to the lower memory pillar LMP and the recess region corresponding to the upper memory pillar UMP are differently formed in the manufacturing processes. Therefore, the step width W1, the step width W4, and the step width W5 may have the same length or may have different lengths. Furthermore, the step widths W2 and W3 and the step widths W4 and W5 have a relationship of W2<W4, W3<W4, W2<W5, and W3<W5.

1.2 Method for Manufacturing Memory Cell Array

Next, a method for manufacturing the memory cell array 11 will be described with reference to FIGS. 6 to 24. FIGS.

6 and 7 are flowcharts of a manufacturing method of the memory cell array 11. FIGS. 8 to 24 are cross-sectional views of the memory cell array 11 corresponding to steps S1 to S17 in the flowcharts of FIGS. 6 and 7, respectively. In the following, as a method for forming the wiring layers 104 and 106, a case of using a replacement method for forming a structure corresponding to the wiring layers 104 and 106 with sacrificial layers, and then subsequently removing the sacrificial layers and replacing them with the wiring layers 104 and 106 will be described. Furthermore, in the following description, the details of the associated photolithography processes will not be described.

Figure 6:
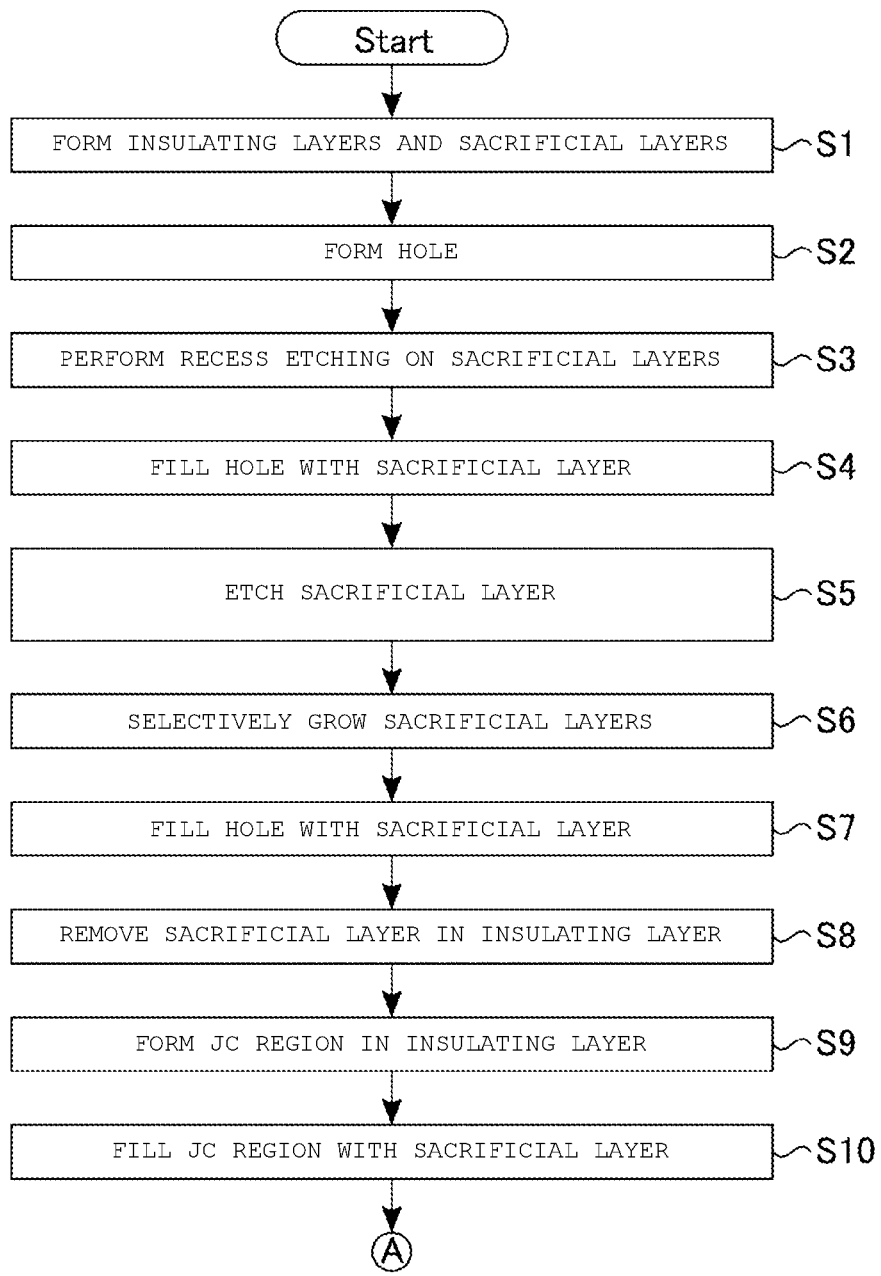
FIG. 6 is a flowchart of a manufacturing method of a memory cell array according to a first embodiment.
Figure 8:
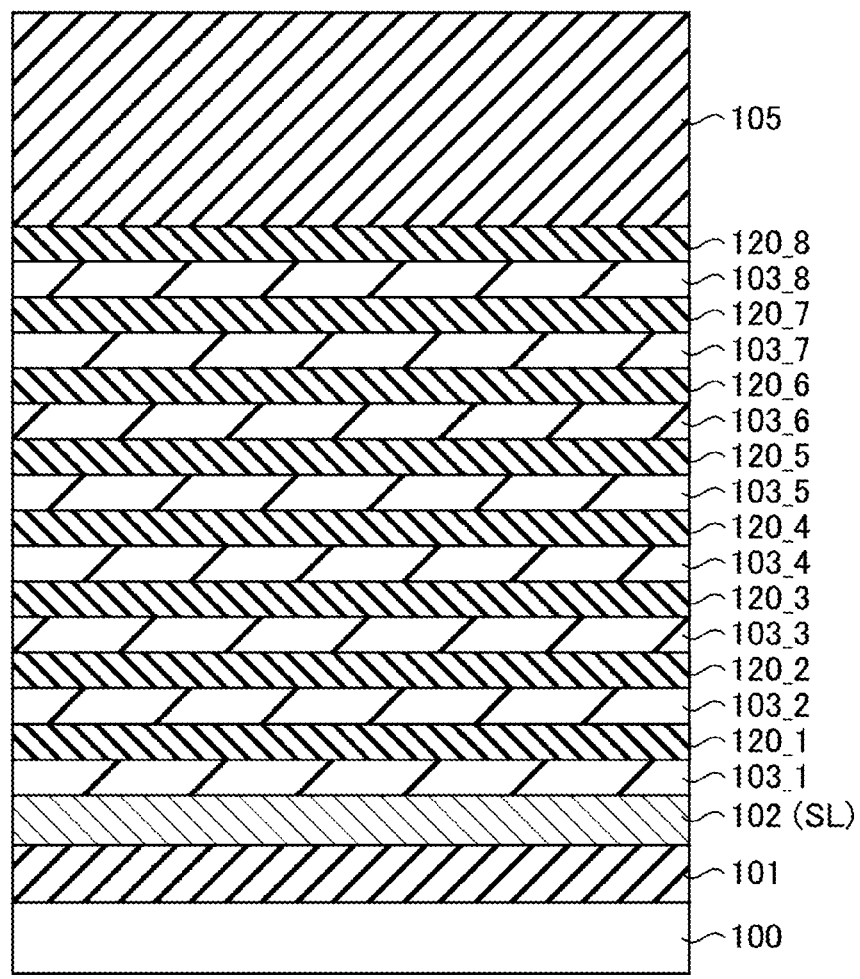
FIG. 8 through FIG. 24 depict a manufacturing method of a memory cell array according to a first embodiment.

As shown in FIG. 8, first, the plurality of insulating layers 103, the plurality of sacrificial layers 120, and the insulating layer 105 are formed (step S1 in FIG. 6). More specifically, the insulating layer 101 is formed on the semiconductor substrate 100. Furthermore, the wiring layer 102 is formed on the insulating layer 101. For example, eight insulating layers 103_1 to 103_8 and eight sacrificial layers 120_1 to 120_8 are alternately stacked one by one on the wiring layer 102. For example, the insulating layer 103_1 is formed on the wiring layer 102. The sacrificial layer 120_1 is formed on the insulating layer 103_1. The insulating layer 103_2 is formed on the sacrificial layer 120_1. The sacrificial layer 120_2 is formed on the insulating layer 103_2. The insulating layer 103_3 is formed on the sacrificial layer 120_2. The sacrificial layer 120_3 is formed on the insulating layer 103_3. The insulating layer 103_4 is formed on the sacrificial layer 120_3. The sacrificial layer 120_4 is formed on the insulating layer 103_4. The insulating layer 103_5 is formed on the sacrificial layer 120_4. The sacrificial layer 120_5 is formed on the insulating layer 103_5. The insulating layer 103_6 is formed on the sacrificial layer 120_5. The sacrificial layer 120_6 is formed on the insulating layer 103_6. The insulating layer 103_7 is formed on the sacrificial layer 120_6. The sacrificial layer 120_7 is formed on the insulating layer 103_7. The insulating layer 103_8 is formed on the sacrificial layer 120_7. The sacrificial layer 120_8 is formed on the insulating layer 103_8. Finally, the insulating layer 105 is formed on the sacrificial layer 120_8 as the uppermost layer.

The sacrificial layers 120_1 to 120_8 correspond in position to the wiring layers 104_1 to 104_8, respectively. The sacrificial layers 120_1 to 120_8 will be later replaced with the wiring layers 104_1 to 104_8, respectively. For the sacrificial layers 120 (120_1 to 120_8), any material capable of providing a sufficient wet etching selectivity with respect to the insulating layers 103 (103_1 to 103_8) can be used. In the following, a case where silicon nitride (SiN) is used for the sacrificial layers 120 will be described.

Figure 9:
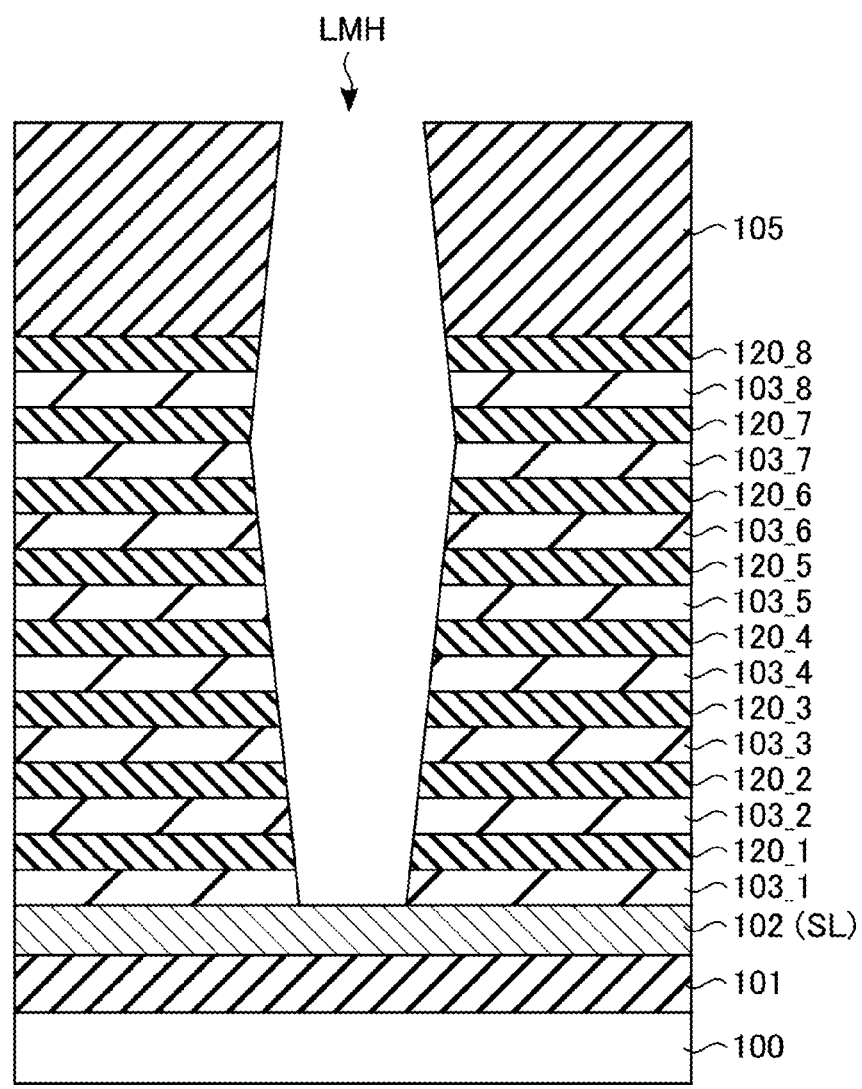

As shown in FIG. 9, a hole LMH is formed (step S2 in FIG. 6). The hole LMH corresponds to the lower memory pillar LMP. More specifically, the hole LMH penetrates the eight insulating layers 103_1 to 103_8, the eight sacrificial layers 120_1 to 120_8, and the insulating layer 105. The bottom surface of the hole LMH reaches the wiring layer 102. Further, the shape of the opening part of the hole LMH is not limited to a perfect circular shape. The shape of the opening part of the hole LMH may be an elliptical shape or a rectangular shape. In addition, the cross section of the hole LMH may have a taper shape, a straight shape on the side surface along the Z direction, or a bowing shape.

Figure 10:
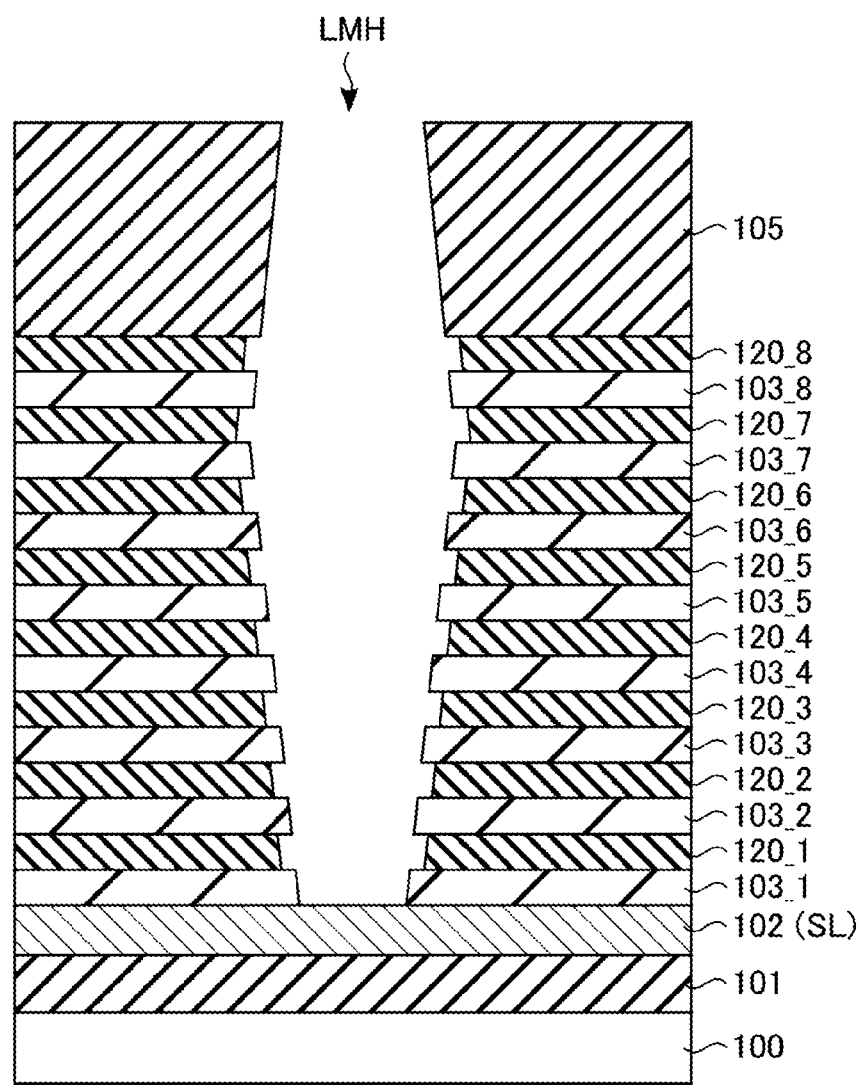

As shown in FIG. 10, recess etching on the sacrificial layers 120 is performed (step S3 in FIG. 6). More specifically, the side surfaces of the sacrificial layers 120 exposed in the hole LMH are wet-etched. Then, recess regions extending from the hole LMH are formed. In a case where the cross section of the hole LMH on the XY plane has a circular shape, the recess regions extend concentrically from the hole LMH. At this time, the wet etching condition is a condition in which an etching rate of the sacrificial layers 120 is higher than that of the insulating layers 103. For example, in a case where the sacrificial layers 120 is SiN, wet etching is performed using phosphoric acid ($H_3PO_4$). In the following, a process of wet etching the side surface of the hole to form the recess regions is referred to as "recess etching".

Figure 11:
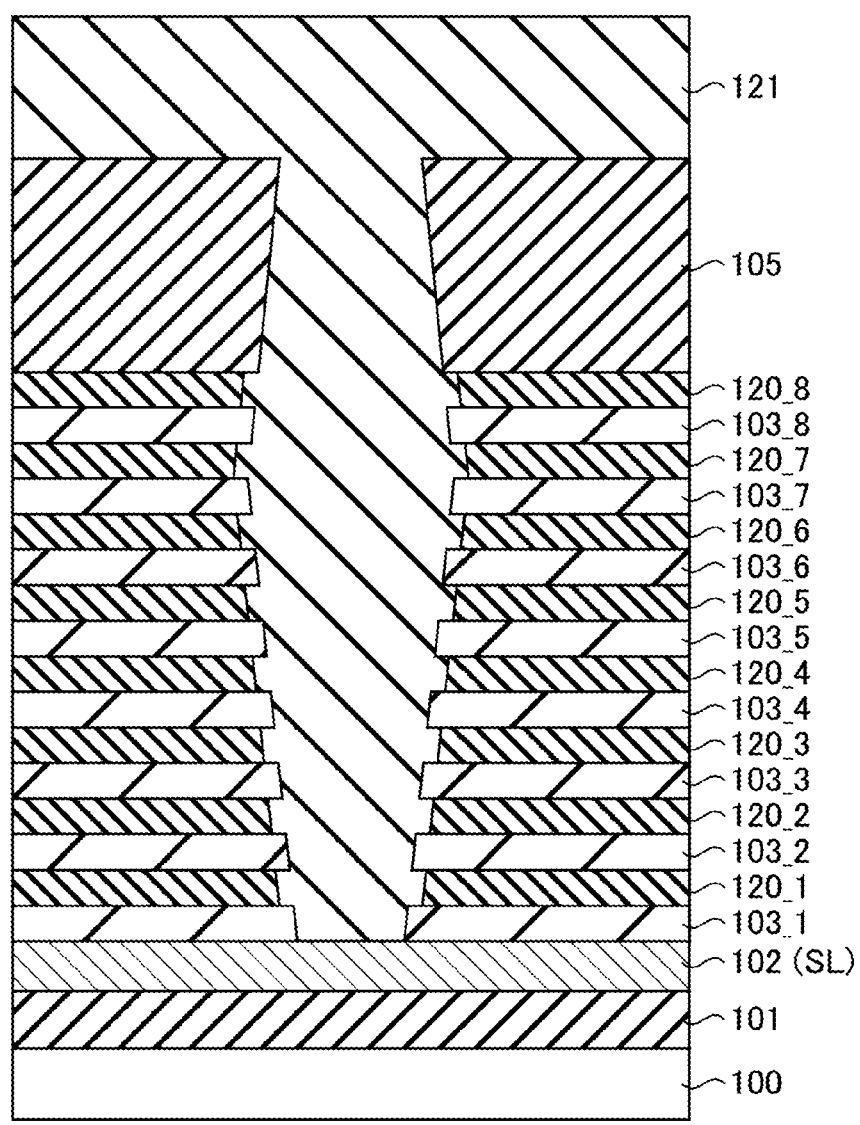

As shown in FIG. 11, the hole LMH is filled with the sacrificial layer 121 (step S4 in FIG. 6). For the sacrificial layer 121, a material capable of obtaining a sufficient wet etching selectivity with respect to the insulating layers 103 and the sacrificial layers 120 is used. In the following, a case where amorphous silicon is used for the sacrificial layer 121 will be described.

Figure 12:
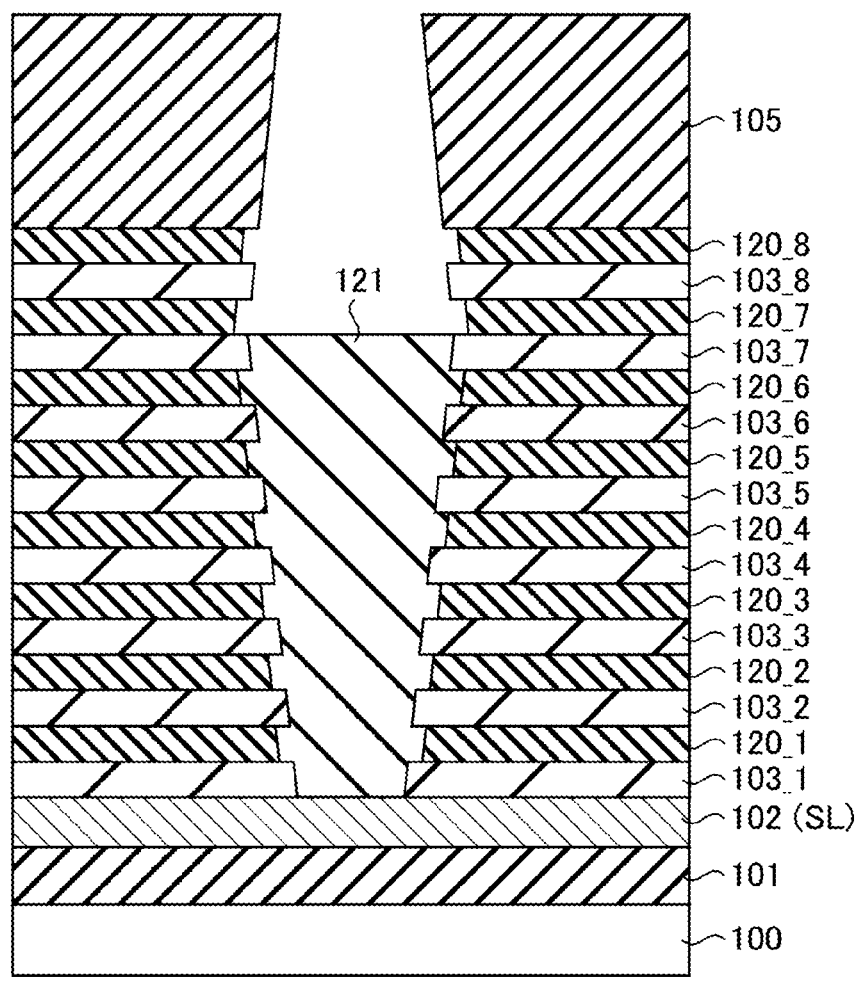

As shown in FIG. 12, the sacrificial layer 121 is etched until the sacrificial layers 120_7 and 120_8 are exposed (step S5 in FIG. 6). More specifically, the sacrificial layer 121 is etched by, for example, wet etching or isotropic etching such as chemical dry etching (CDE) until the sacrificial layers 120_7 and 120_8 are exposed to the hole LMH. The sacrificial layers 120_7 and 120_8 correspond to the wiring layers 104_7 and 104_8 in the flat region. At this time, the etching condition is a condition in which an etching rate of the sacrificial layer 121 is higher than those of the insulating layers 103, the insulating layer 105, and the sacrificial layers 120. For example, in a case where the sacrificial layer 121 is amorphous silicon, wet etching using hydrofluoric acid (HF) is performed.

Figure 13:
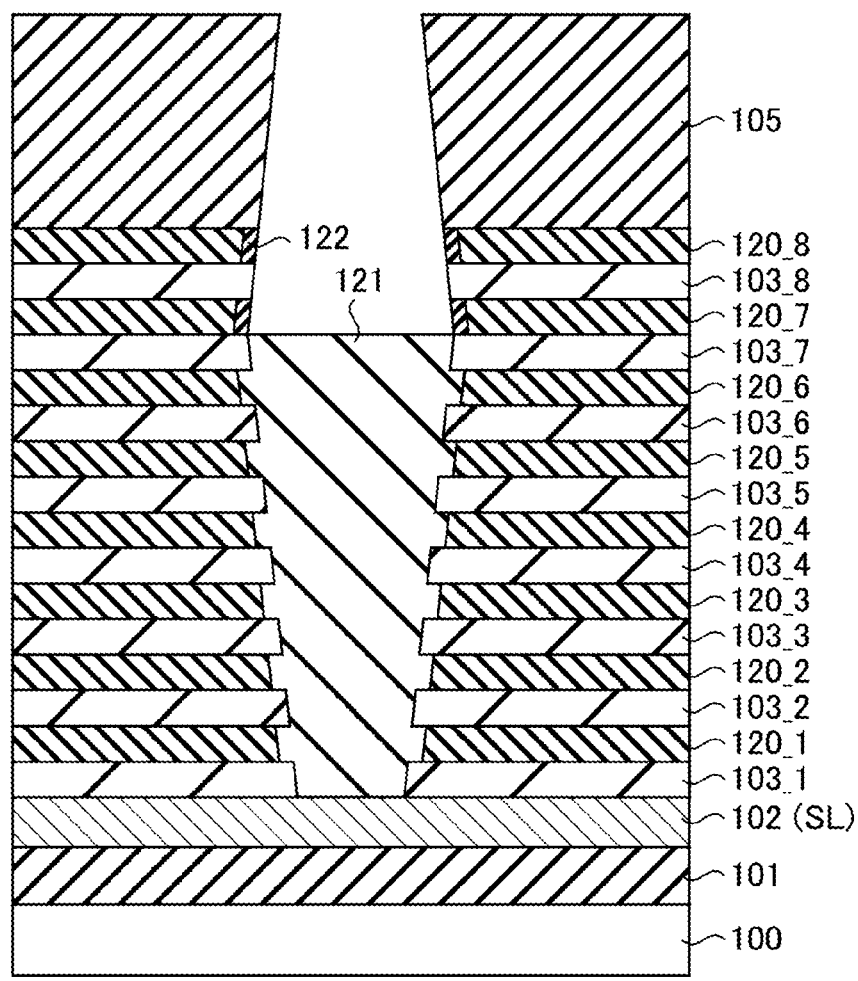

As shown in FIG. 13, sacrificial layers 122 are selectively grown on the sacrificial layers 120_7 and 120_8 (step S6 in FIG. 6). More specifically, for example, by selective CVD, the sacrificial layers 122 are formed on the side surfaces of the sacrificial layers 120_7 and 120_8 exposed to the hole LMH. In such a case, a layer thickness of the sacrificial layers 122 is preferably a layer thickness that there is effectively no step between the side surfaces of the sacrificial layers 122 exposed in the hole LMH and the side surface of the insulating layer 103_8. That is, the side surface of the insulating layer 103_6, the side surface of the sacrificial layer 122 on the sacrificial layer 120_7, the side surface of the insulating layer 103_7, the side surface of the sacrificial layer 122 on the sacrificial layer and 120_8, and the side surface of the insulating layer 103_8 are arranged so as to be substantially flat along the Z direction. In other words, the position of each of the side surfaces of the sacrificial layers 122 in the Y direction and the position of each of the side surfaces of the insulating layers 103_6, 103_7, and 103_8 in the Y direction are substantially the same. For the sacrificial layers 122, a material capable of obtaining a sufficient wet etching selectivity with respect to the insulating layers 103 is used. The sacrificial layers 122 are preferably made of the same material as the sacrificial layer 120. Using the same material for the sacrificial layers 120 and the sacrificial layers 122, the sacrificial layers 120 and 122 can be collectively removed by wet etching. In the following, a case where SiN is used for the sacrificial layers 122 will be described.

Figure 14:
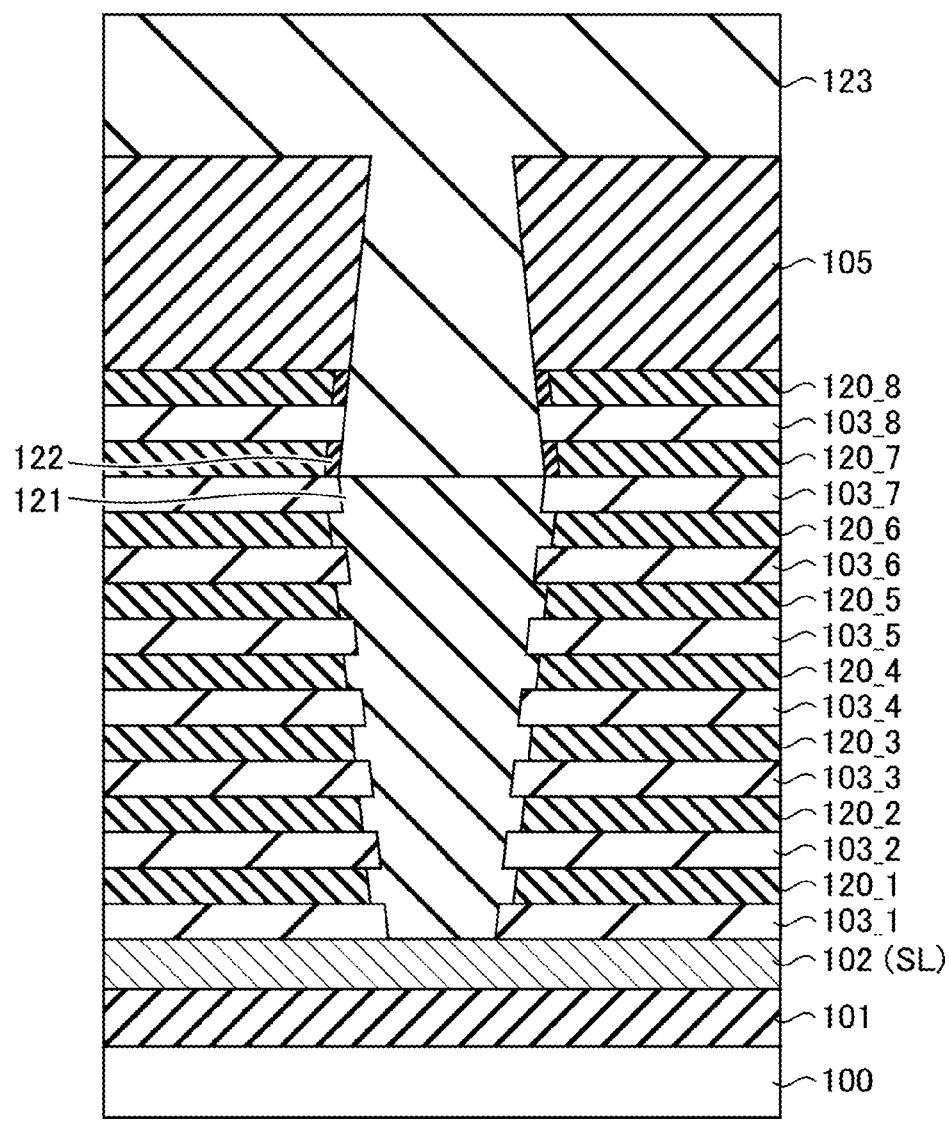

As shown in FIG. 14, the upper end part of the hole LMH is filled with a sacrificial layer 123 (step S7 in FIG. 6). For the sacrificial layer 123, a material capable of providing a sufficient wet etching selectivity with respect to the insulating layers 103 and the sacrificial layers 120 is used. The sacrificial layer 123 is preferably made of the same material as the sacrificial layer 121. Using the same material for the sacrificial layer 121 and the sacrificial layer 123, the sacrificial layers 121 and 123 can be removed together by wet etching. In the following, a case where amorphous silicon is used for the sacrificial layer 123 will be described.

Figure 15:
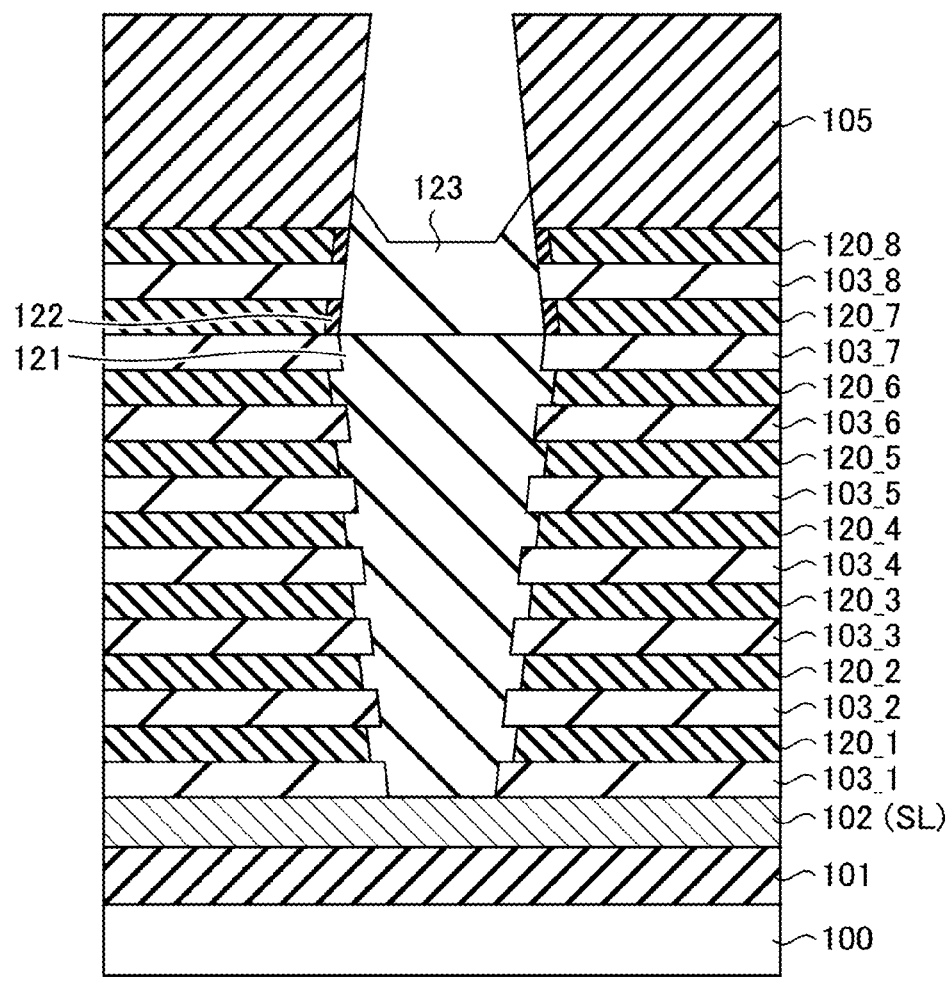

As shown in FIG. 15, part of the sacrificial layer 123 in the insulating layer 105 is removed by, for example, wet etching or CDE (step S8 in FIG. 6). At this time, the etching amount of the sacrificial layer 123 is adjusted such that the height position of the upper end of the sacrificial layer 123 in contact with the side surface of the insulating layer 105 is higher than the bottom surface of the insulating layer 105. That is, the sacrificial layer 123 in the insulating layer 105 is not all removed. As a result, the side surface of the uppermost sacrificial layer 120_8 is not exposed to the hole LMH. The etching condition is a condition in which an etching rate of the sacrificial layer 123 is higher than that of the insulating layer 105.

Figure 16:
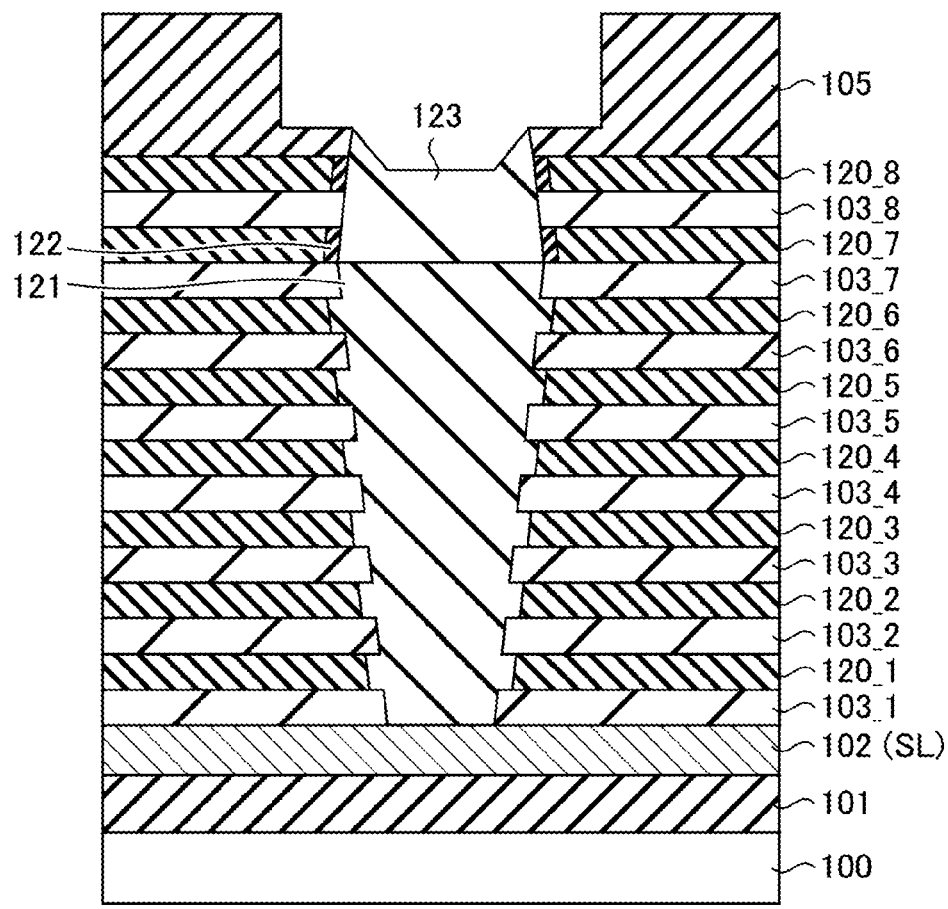

As shown in FIG. 16, a region corresponding to the connecting portion JC (in the following, referred to as "JC region") is formed in the insulating layer 105 (step S9 in FIG. 6). For example, isotropic etching of the insulating layer 105 is performed by wet etching. As a result, the thickness of the insulating layer 105 is reduced. Further, the width of the hole LMH in the insulating layer 105 increases. Furthermore, in a case where the cross section of the hole LMH in the insulating layer 105 on the XY plane has a circular shape, the width of the hole LMH in the insulating layer 105 is concentrically expanded. At this time, the etching condition is a condition in which an etching rate of the insulating layer 105 is higher than that of the sacrificial layer 123.

Figure 17:
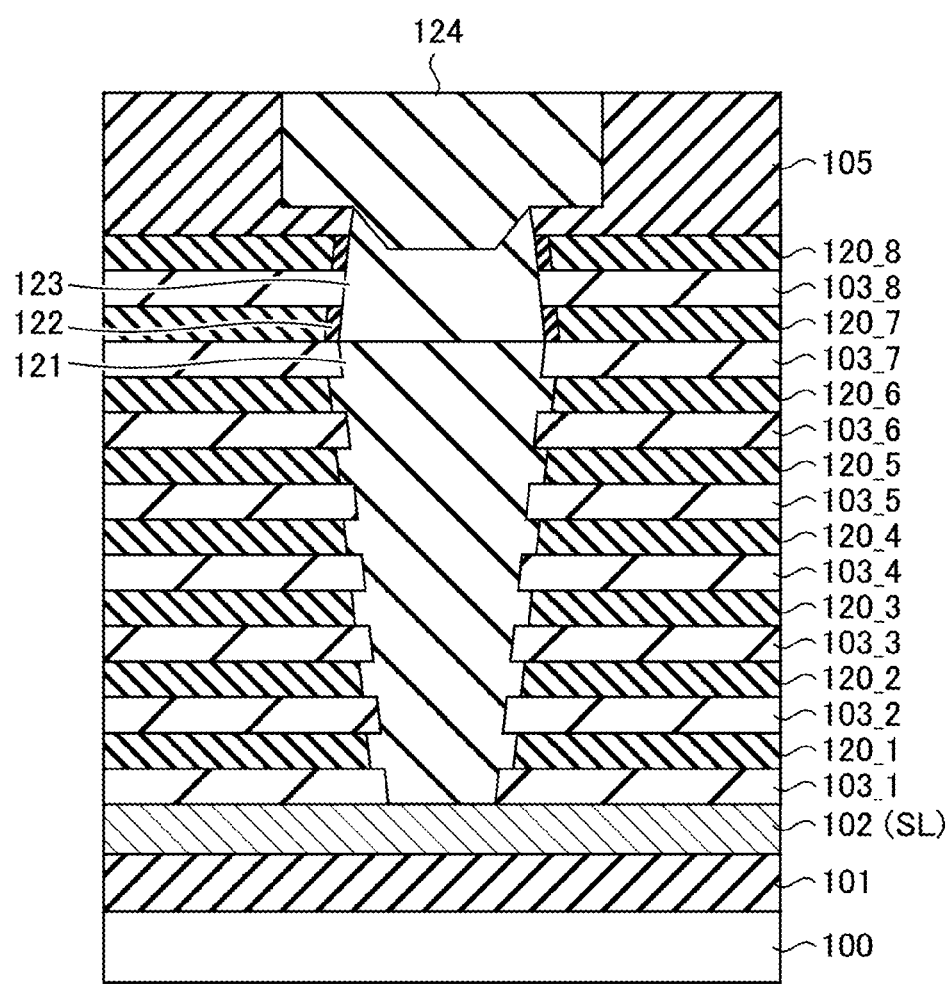

As shown in FIG. 17, the JC region is filled with a sacrificial layer 124 (step S10 in FIG. 6). For the sacrificial layer 124, a material capable of obtaining a sufficient wet etching selectivity with respect to the insulating layers 103 and the sacrificial layers 120 is used. The sacrificial layer 124 is preferably made of the same material as the sacrificial layers 121 and 123. Using the same material for the sacrificial layers 121, 123, and 124, the sacrificial layers 121, 123, and 124 can be collectively removed by wet etching. In the following, a case where amorphous silicon is used for the sacrificial layer 124 will be described. After forming the sacrificial layer 124, the sacrificial layer 124 on the insulating layer 105 is removed using, for example, chemical mechanical polishing (CMP).

Figure 7:
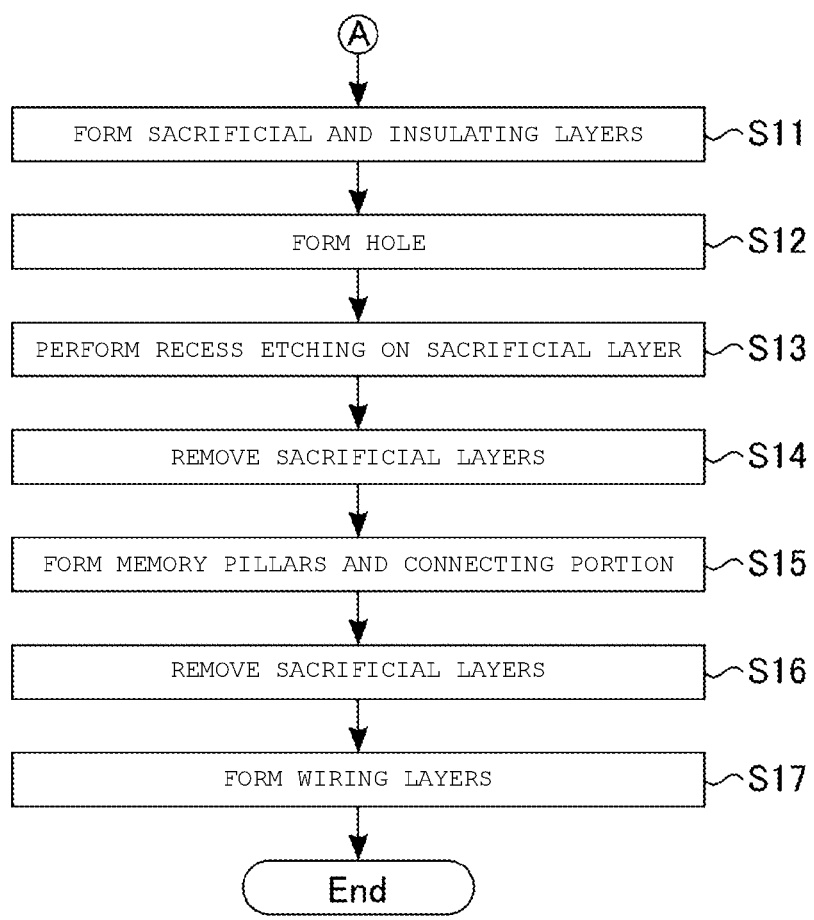
FIG. 7 is a flowchart of a manufacturing method of a memory cell array according to a first embodiment.
Figure 18:
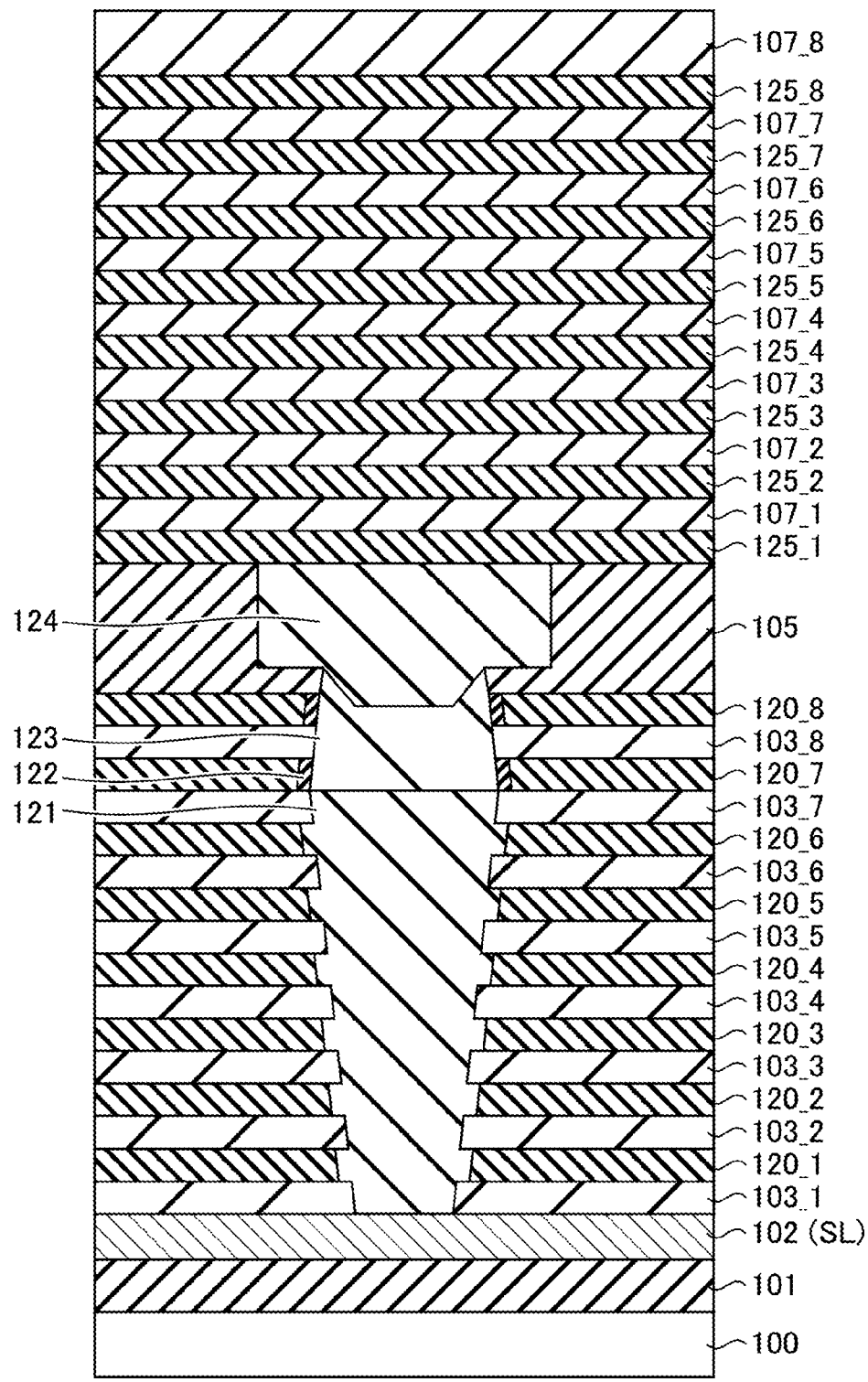

As shown in FIG. 18, a plurality of sacrificial layers 125 and the plurality of insulating layers 107 are alternately stacked one by one on the insulating layer 105 and the sacrificial layer 124 (step S11 in FIG. 7). More specifically, for example, eight sacrificial layers 125_1 to 125_8 and eight insulating layers 107_1 to 107_8 are alternately stacked one by one. For example, the sacrificial layer 125_1 is formed on the insulating layer 105 and the sacrificial layer 124. The insulating layer 107_1 is formed on the sacrificial layer 125_1. The sacrificial layer 125_2 is formed on the insulating layer 107_1. The insulating layer 107_2 is formed on the sacrificial layer 125_2. The sacrificial layer 125_3 is formed on the insulating layer 107_2. The insulating layer 107_3 is formed on the sacrificial layer 125_3. The sacrificial layer 125_4 is formed on the insulating layer 107_3. The insulating layer 107_4 is formed on the sacrificial layer 125_4. The sacrificial layer 125_5 is formed on the insulating layer 107_4. The insulating layer 107_5 is formed on the sacrificial layer 125_5. The sacrificial layer 125_6 is formed on the insulating layer 107_5. The insulating layer 107_6 is formed on the sacrificial layer 125_6. The sacrificial layer 125_7 is formed on the insulating layer 107_6. The insulating layer 107_7 is formed on the sacrificial layer 125_7. The sacrificial layer 125_8 is formed on the insulating layer 107_7. The insulating layer 107_8 is formed on the sacrificial layer 125_8.

The sacrificial layers 125_1 to 125_8 correspond to the wiring layers 106_1 to 106_8, respectively. The sacrificial layers 125_1 to 125_8 will be later replaced with the wiring layers 106_1 to 106_8, respectively. For the sacrificial layers 125 (125_1 to 125_8), a material capable of obtaining a sufficient wet etching selectivity with respect to the insulating layers 107 (107_1 to 107_8) is used. The sacrificial layers 125 is preferably made of the same material as the sacrificial layers 120. Using the same material for the sacrificial layers 120 and the sacrificial layers 125, the sacrificial layers 120 and 125 can be collectively removed by wet etching. In the following, a case where SiN is used for the sacrificial layers 125 will be described.

Figure 19:
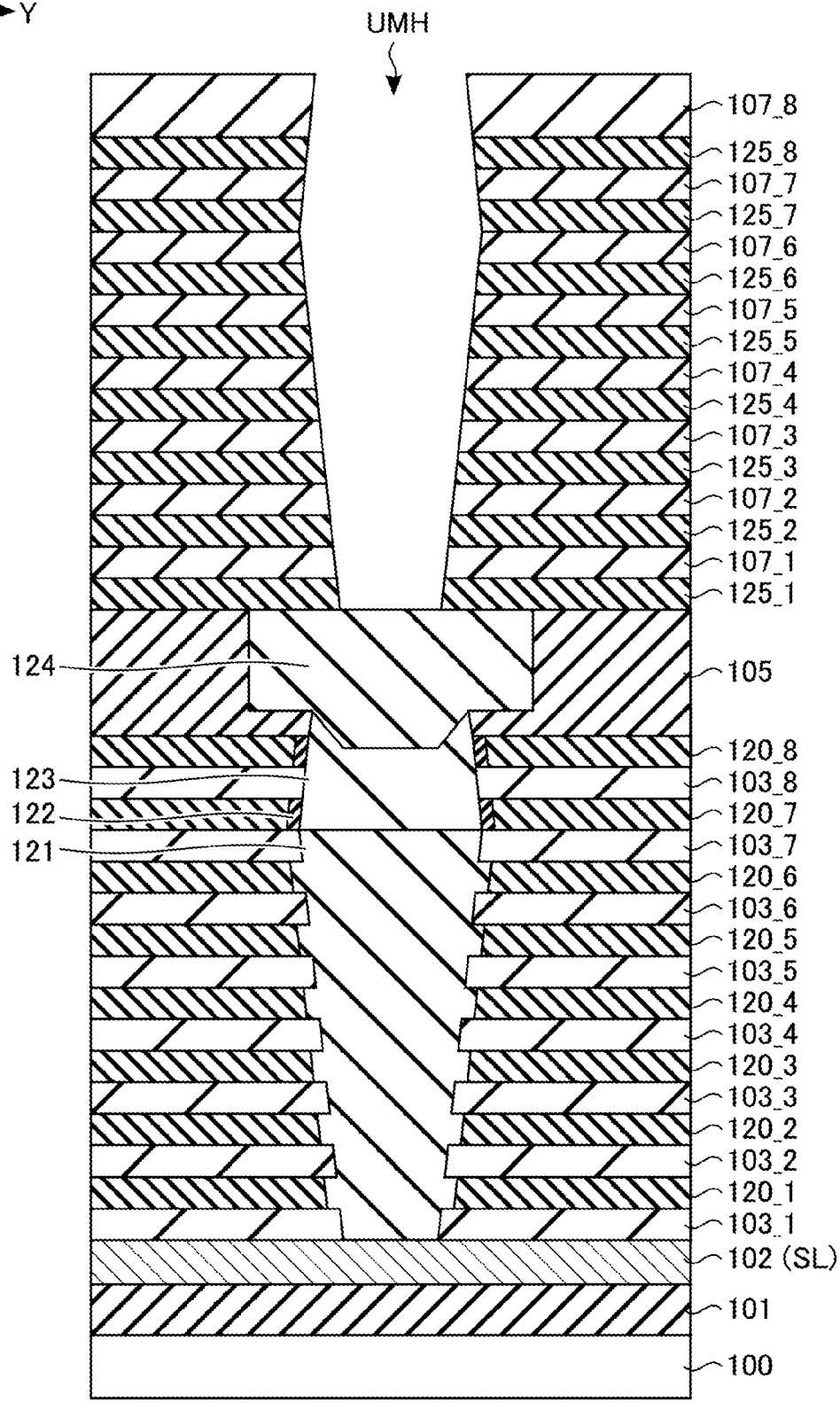

As shown in FIG. 19, a hole UMH is formed on the sacrificial layer 124 (step S12 in FIG. 7). The hole UMH corresponds to the upper memory pillar UMP. More specifically, the hole UMH penetrates the eight sacrificial layers 125_1 to 125_8 and the eight insulating layers 107_1 to 107_8. The bottom surface of the hole UMH reaches the sacrificial layer 124. Further, the shape of the opening part of the hole UMH is not limited to a perfect circular shape. The shape of the opening part of the hole UMH may be an elliptical shape or a rectangular shape. In addition, the cross section of the hole UMH may have a taper shape, a straight shape, or a bowing shape.

Figure 20:
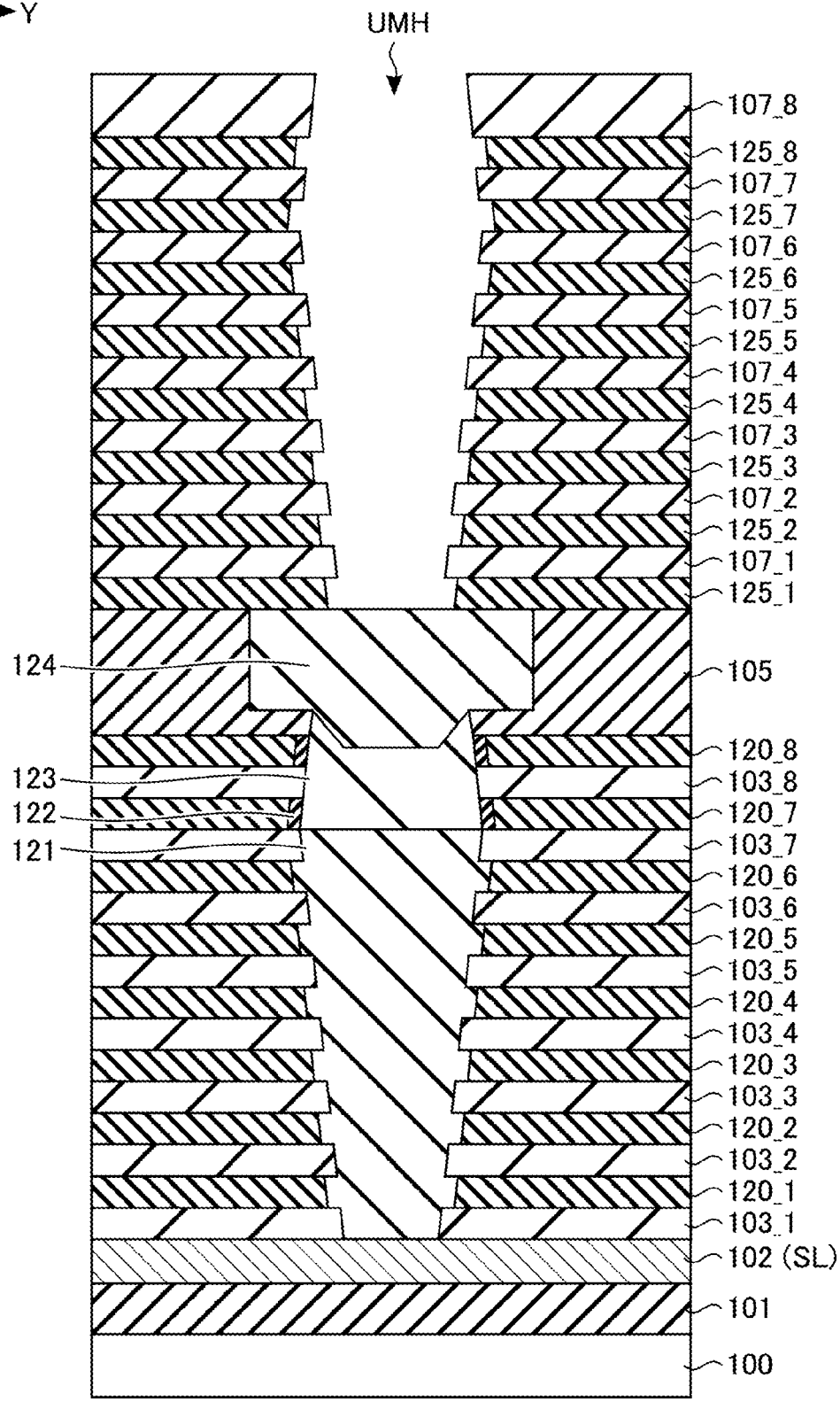

As shown in FIG. 20, recess etching on the sacrificial layers 125 is performed (step S13 in FIG. 7). More specifically, the side surfaces of the sacrificial layers 125 exposed in the hole UMH are wet-etched. Then, recess regions are formed from the hole UMH. In a case where the cross section of the hole UMH on the XY plane has a circular shape, the recess regions extend concentrically from the hole UMH. At this time, the etching condition is a condition in which an etching rate of the sacrificial layers 125 is higher than those of the insulating layers 107 and the sacrificial layer 124. Furthermore, a recess width of the recess region in the hole UMH may be the same as or different from that of the recess region in the hole LMH.

Figure 21:
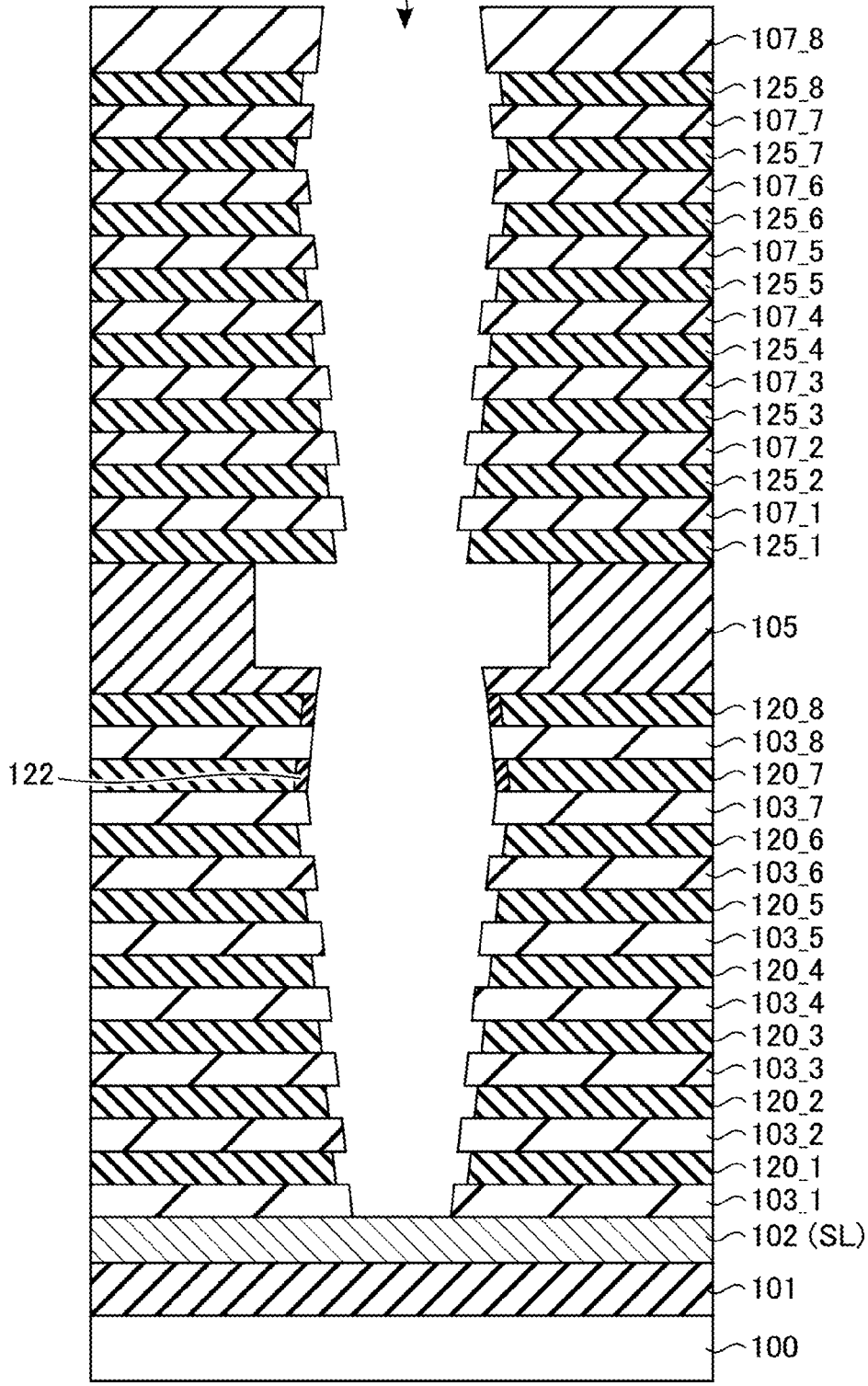

As shown in FIG. 21, the sacrificial layers 121, 123, and 124 are removed by wet etching (step S14 in FIG. 7). At this time, the etching condition is a condition in which etching rates of the sacrificial layers 121, 123, and 124 are higher than those of the wiring layer 102, the insulating layers 103, 105, and 107, and the sacrificial layers 120 and 125. As a result, the hole MH is formed. The hole MH corresponds to the memory pillar MP.

Figure 22:
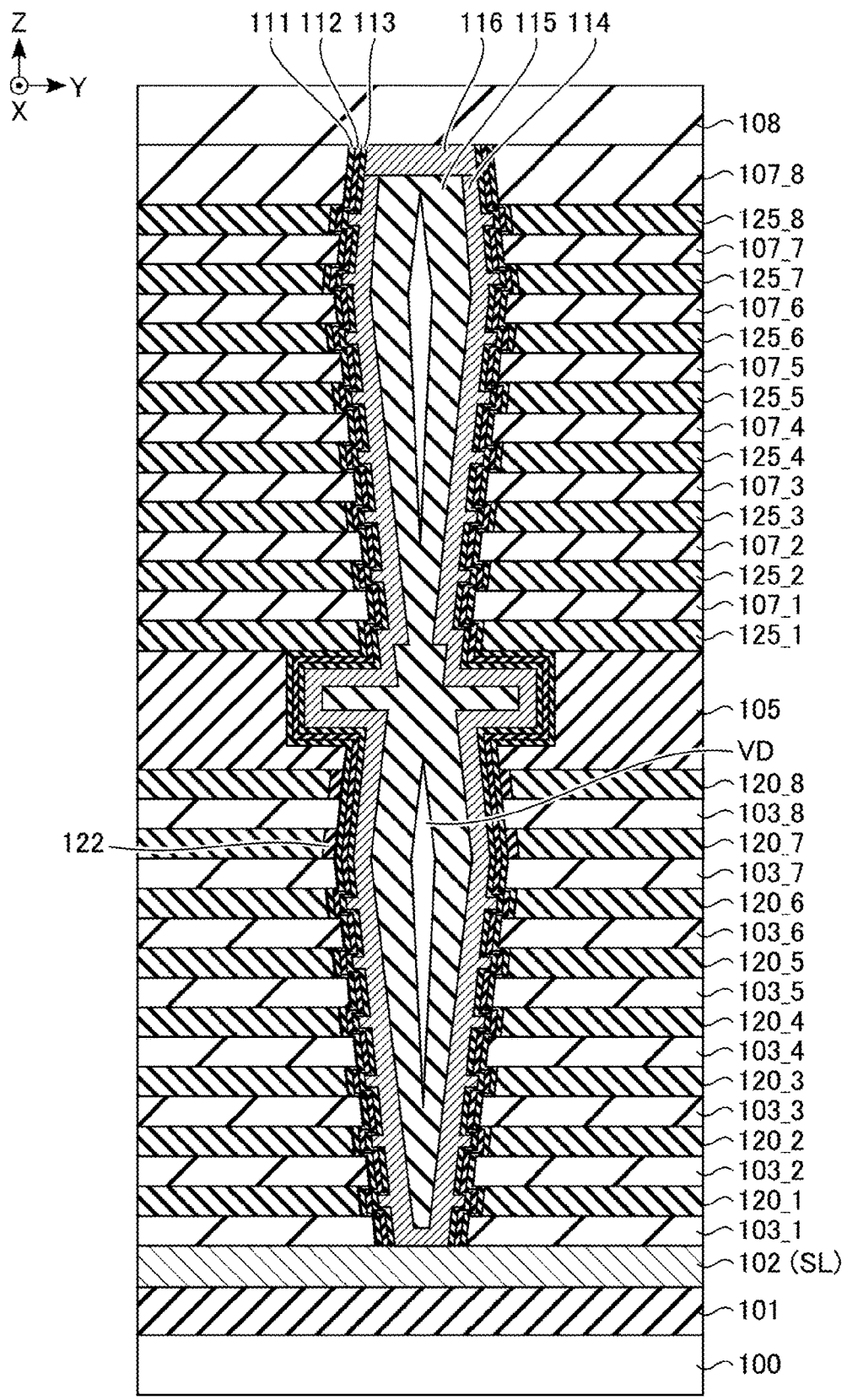

As shown in FIG. 22, the lower memory pillar LMP, the connecting portion JC, and the upper memory pillar UMP are collectively formed (step S15 in FIG. 7). More specifically, first, the block insulating film 111, the charge storage layer 112, and the tunnel insulating film 113 each having a layer thickness that does not fill the hole MH are sequentially stacked. Next, the block insulating film 111, the charge storage layer 112, and the tunnel insulating film 113 on the insulating layer 107_8 and on the bottom surface of the hole MH are removed by, for example, anisotropic etching such as reactive ion etching (RIE). As a result, the wiring layer 102 is exposed to the bottom surface of the hole MH. Next, the semiconductor layer 114 and the core layer 115 are sequentially formed. The semiconductor layer 114 is in contact with the wiring layer 102. As a result, the hole MH is filled. In a case where silicon oxide of the core layer 115 is formed by CVD, voids VD are formed in the core layer 115 depending on the shape of the hole MH and the step coverage of silicon oxide. Next, the semiconductor layer 114 and the core layer 115 on the insulating layer 107_8 are removed. At this time, the semiconductor layer 114 and the core layer 115 at an upper part of the hole MH are also removed. Next, the cap layer 116 is formed to fill the upper part of the hole MH. After forming the cap layer 116, the cap layer 116 on the insulating layer 107_8 is removed by, for example, CMP. As a result, the memory pillar MP is formed. After forming the memory pillar MP, the insulating layer 108 is formed on the insulating layer 107_8 and the memory pillar MP.

Next, replacement is executed in steps S16 and S17 of FIG. 7.

Figure 23:
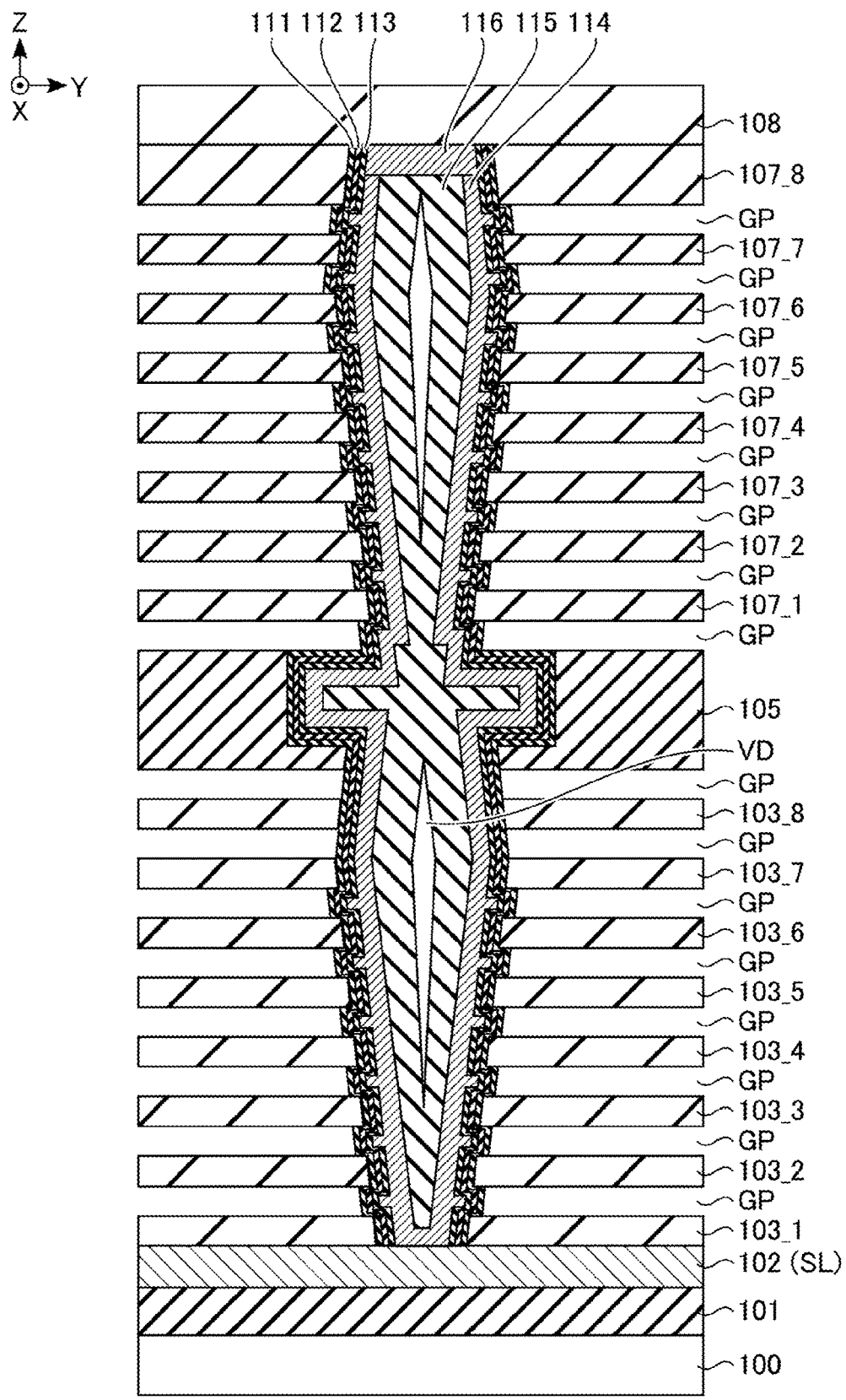

As shown in FIG. 23, first, the sacrificial layers 120, 122, and 125 are removed by wet etching (step S16 in FIG. 7). More specifically, in a region that is not specifically depicted, a slit in which the sacrificial layers 120 and 125 are exposed is formed along the Z direction. That is, the slit penetrates or passes the sacrificial layers 120_1 to 120_8 and the sacrificial layers 125_1 to 125_8. After forming the slit, the sacrificial layers 120, 122, and 125 are removed via the side surface of the slit by wet etching. The etching uses a condition in which etching rates of the sacrificial layers 120, 122, and 125 are higher than those of the insulating layers 103, 105, 107, and the block insulating film 111. As a result, gaps GP corresponding to the wiring layers 104_1 to 104_8 and the wiring layers 106_1 to 106_8 are formed.

Figure 24:
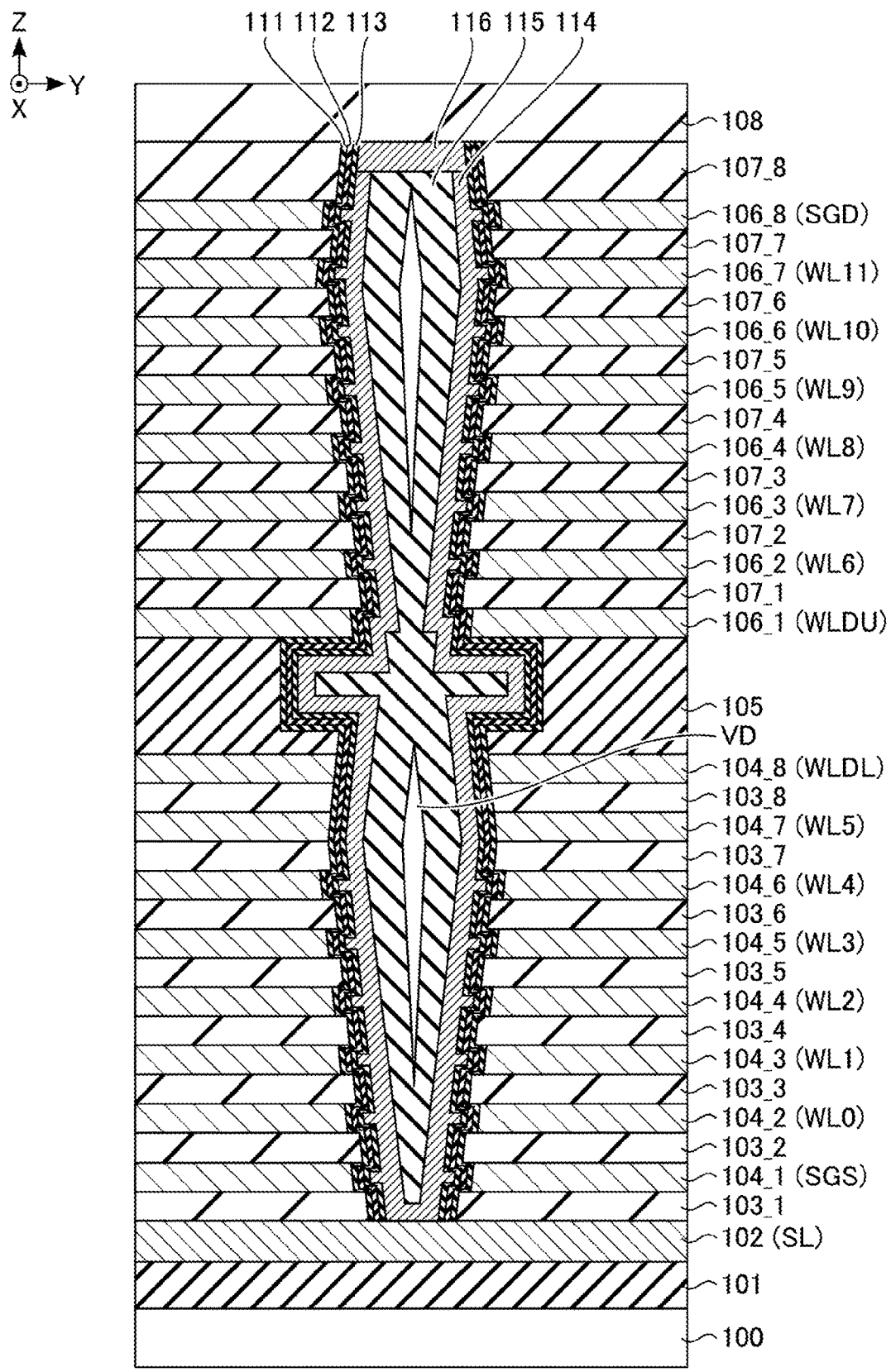

As shown in FIG. 24, the wiring layers 104 and 106 are formed (step S17 in FIG. 7). For example, in a case where a stacked structure of titanium nitride and tungsten is used for the wiring layers 104 and 106, titanium nitride is formed in the gaps GP from through the slit. At this time, TiN does not have a thickness enough to fill the gaps GP. Next, tungsten is formed to fill the gaps GP. Next, tungsten and titanium nitride on the side surface of the slit and the insulating layers 108 are removed. As a result, the wiring layers 104_1 to 104_8 and the wiring layers 106_1 to 106_8 are collectively formed.

1.3 Effect of Present Embodiment

With the configuration according to the present embodiment, a semiconductor storage device with improved reliability may be provided. The effect will be described in detail.

For example, the wiring layer 104 as the uppermost layer (i.e., the dummy word line WLDL) of the lower memory pillar LMP is adjacent to the connecting portion JC in the Z direction. Therefore, when the same voltage is applied to each of the wiring layers 104 during an erasing operation, an electric field strength of the uppermost wiring layer 104 tends to be higher than that of the other wiring layers 104. When the electric field strength of the uppermost wiring layer 104 becomes higher, charges may be injected into the charge storage layer from the gate side of the uppermost wiring layer 104. In the following, such a phenomenon will be referred to as a back tunneling phenomenon. When the back tunneling phenomenon occurs, a threshold of the dummy memory cell transistor MCDL corresponding to the uppermost wiring layer 104 rises even though the erasing operation is performed. Therefore, a malfunction may occur.

As a countermeasure, there is a method in which a voltage applied to the uppermost wiring layer 104 is made higher than that of the other wiring layers 104 during the erasing operation. However, in such a case, a voltage difference occurs between the uppermost wiring layer 104 and the wiring layer 104 located one layer below the uppermost layer. Therefore, for example, in a case where a protrusion part is disposed on the memory pillar MP in the wiring layer 104 located one layer below the uppermost layer, an electric field is concentrated on a corner portion of the protrusion part. Therefore, the back tunneling phenomenon is likely to occur in the wiring layer 104 located one layer below the uppermost layer.

On the other hand, in the present embodiment, the lower memory pillar LMP does not have protrusion parts PR1 on the side surface in the uppermost wiring layer 104 (104_8) and the wiring layer 104 (104_7) located one layer below the uppermost layer. Moreover, the lower memory pillar LMP has protrusion parts PR1 on the side surface in the other wiring layers 104 (104_1 to 104_6). That is, the side surface of the uppermost wiring layer 104 (104_8), the side surface of the insulating layer 103 (103_8) therebelow, and the side surface of the wiring layer 104 (104_7) located one layer below the uppermost layer are flattened. Then, each of the lower wiring layers 104 (104_1 to 104_6) forms a recess region having a step between the insulating layers 103 (103_1 to 103_7) disposed above and below the wiring layers thereof. As a result, the back tunneling phenomenon can be reduced. Therefore, the reliability of the semiconductor storage device 1 can be improved.

2. Second Embodiment

Next, a second embodiment will be described. In the second embodiment, a shape of the memory pillar MP is different from that of the first embodiment. A method for manufacturing a memory cell array 11 according to the second embodiment will be described below. In the following, differences from the first embodiment will be mainly described.

2.1 Cross-Sectional Configuration of Memory Cell Array

Figure 25:
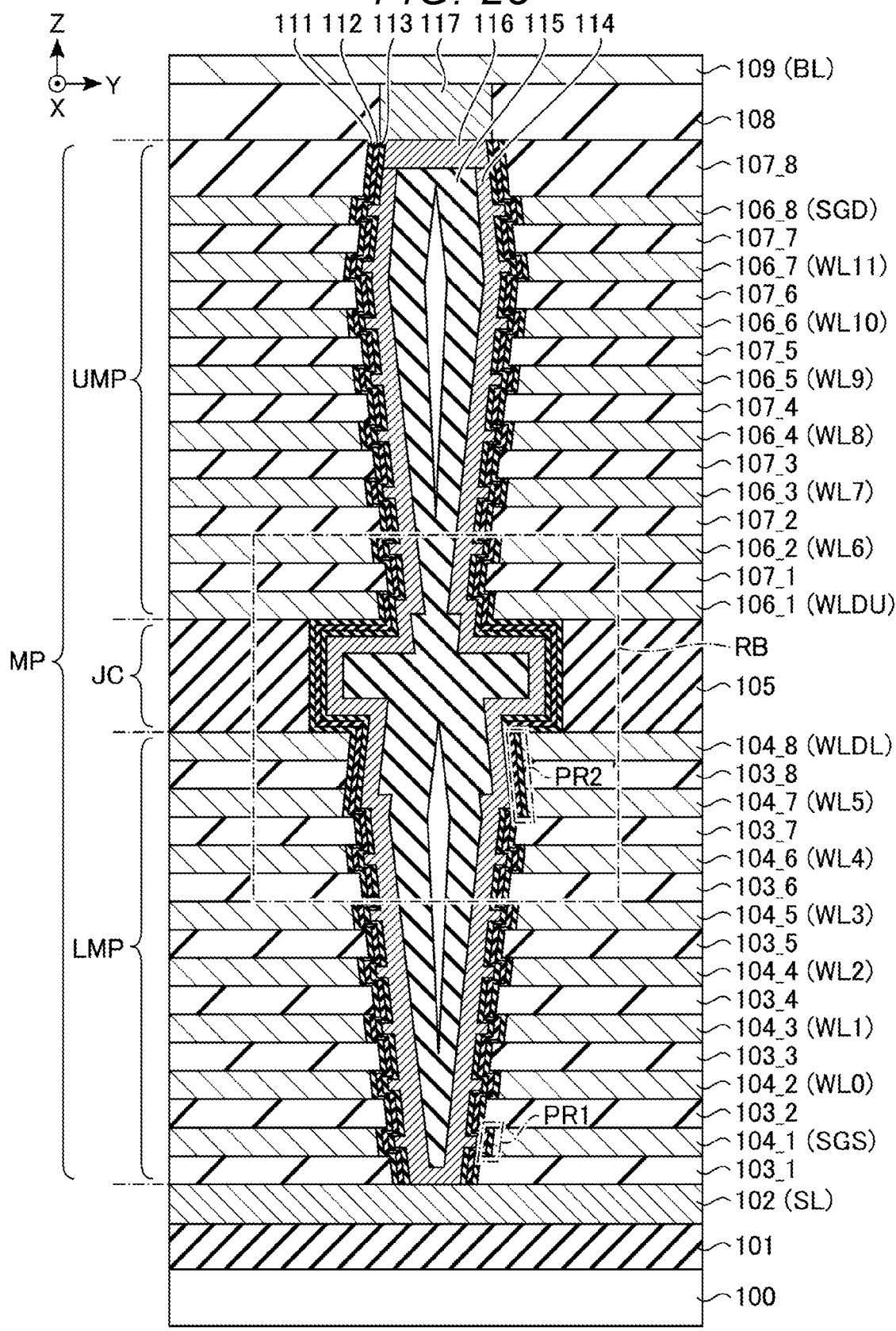
FIG. 25 is a cross-sectional view of a memory cell array according to a second embodiment.

First, an example of the memory cell array 11 according to the second embodiment will be described with reference to FIG. 25. FIG. 25 shows a cross-sectional diagram of one NAND string NS of the memory cell array 11.

As shown in FIG. 25, the lower memory pillar LMP of the present embodiment has one protrusion part PR2 that protrudes in the wiring layer 104_7, the insulating layer 103_8, and the wiring layer 104_8. Further, the height position of the upper end of the lower memory pillar LMP is near the interface between the wiring layer 104_8 and the insulating layer 105. That is, the bottom surface of the connecting portion JC is in contact with the wiring layer 104_8. The other configurations of the memory pillar MP according to the second embodiment is similar to the first embodiment described with reference to FIG. 3.

Figure 26:
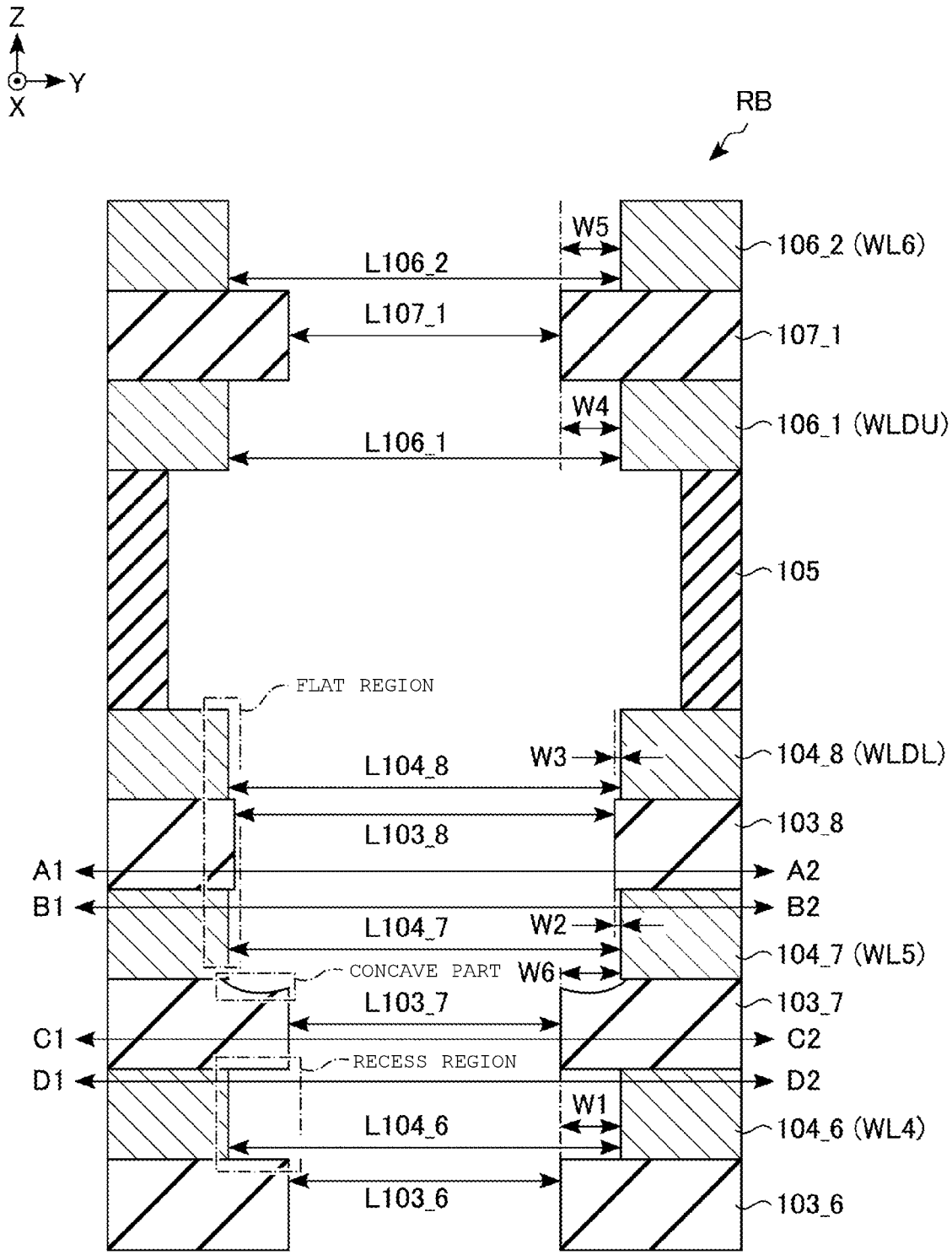
FIG. 26 is an enlarged view of region RB in FIG. 25.
Figure 27:
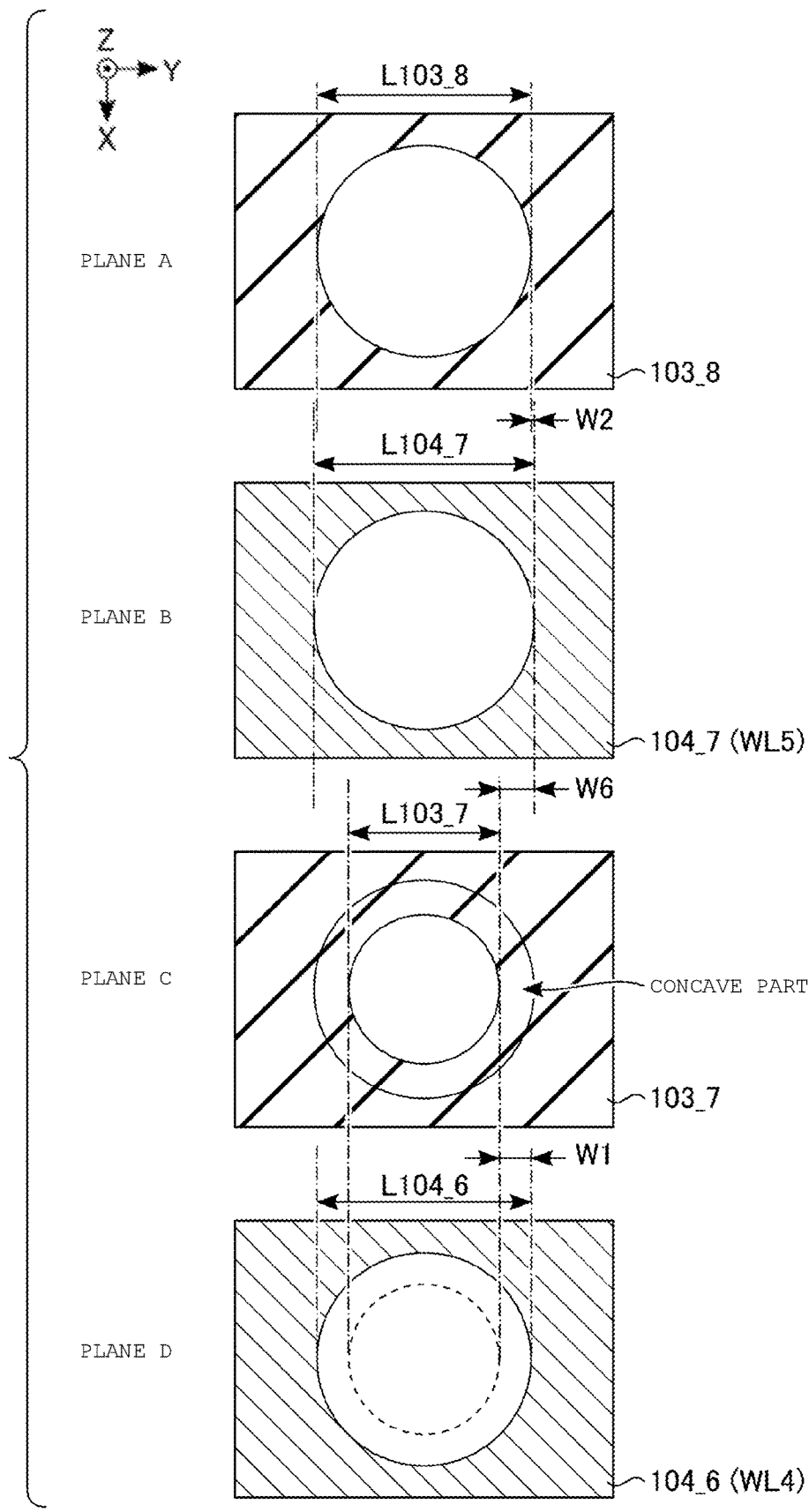
FIG. 27 depicts planes along line A1-A2, line B1-B2, line C1-C2, and line D1-D2 in FIG. 26.

2.2 Shapes of Wiring Layers and Insulating Layers in Contact with Memory Pillar MP Next, the shapes of the wiring layers and the insulating layers in contact with the memory pillar MP will be described with reference to FIGS. 26 and 27. FIG. 26 is an enlarged view of region RB in FIG. 25. FIG. 27 shows plan views along lines A1-A2, B1-B2, C1-C2, and D1-D2 in FIG. 26. Further, in examples of FIGS. 26 and 27, the memory pillar MP is not illustrated for the sake of convenience of explanation. In addition, in the example of FIG. 26, for the sake of convenience of explanation, a case where the side surface of each layer extends along the Z direction is shown.

As shown in FIGS. 26 and 27, in the present embodiment, the width L103_8 is greater than the width L103_6 and the width L103_7. Moreover, the width L104_6, the width L104_7, and the width L104_8 are substantially the same.

In the wiring layer 104_7, the insulating layer 103_8, and the wiring layer 104_8, the protrusion part PR2 is disposed on the side surface of the lower memory pillar LMP. Accordingly, there is almost no step between the upper end of the wiring layer 104_7 and the lower end of the insulating layer 103_8, and between the upper end of the insulating layer 103_8 and the lower end of the wiring layer 104_8. That is, the side surface of the wiring layer 104_7, the side surface of the insulating layer 103_8, and the side surface of the wiring layer 104_8 are arranged substantially flat along the Z direction. In other words, the side surface of the wiring layer 104_7, the side surface of the insulating layer 103_8, and the side surface of the wiring layer 104_8 are located at substantially the same position in the Y direction. Therefore, the width L104_7, the width L103_8, and the width L104_8 are substantially the same.

On the other hand, due to the protrusion part PR2, there is provided a step between the upper end of the insulating layer 103_7 and the lower end of the wiring layer 104_7. Hereinafter the step width between the insulating layer 103_7 and the wiring layer 104_7 is referred to as W6. The step with W6 may be expressed as W6=((L104_7)−(L103_7))/2. The step width W6 and the step with W1 are substantially the same.

At the upper end of the insulating layer 103_7, a concave part is formed near the interface between the wiring layer 104_7 and the insulating layer 103_7. As shown on plane C in FIG. 27, in a case where the cross section of the hole LMH on the XY plane has a circular shape, the concave part has, for example, a circularly annular shape. Alternatively, the concave part may not be provided.

2.3 Method for Manufacturing Memory Cell Array

Figure 28:
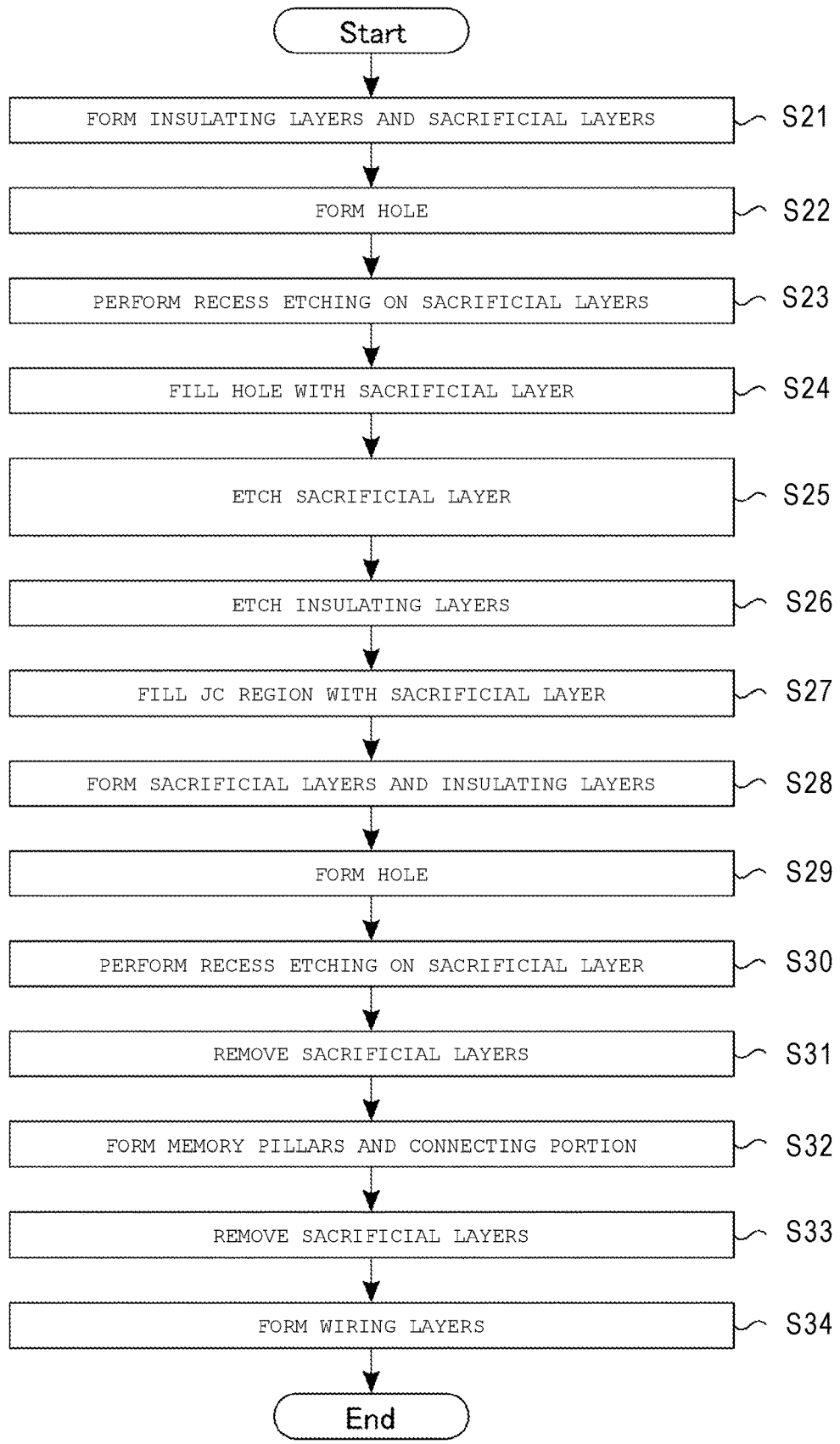
FIG. 28 is a flowchart of a manufacturing method of a memory cell array according to a second embodiment.
Figure 29:
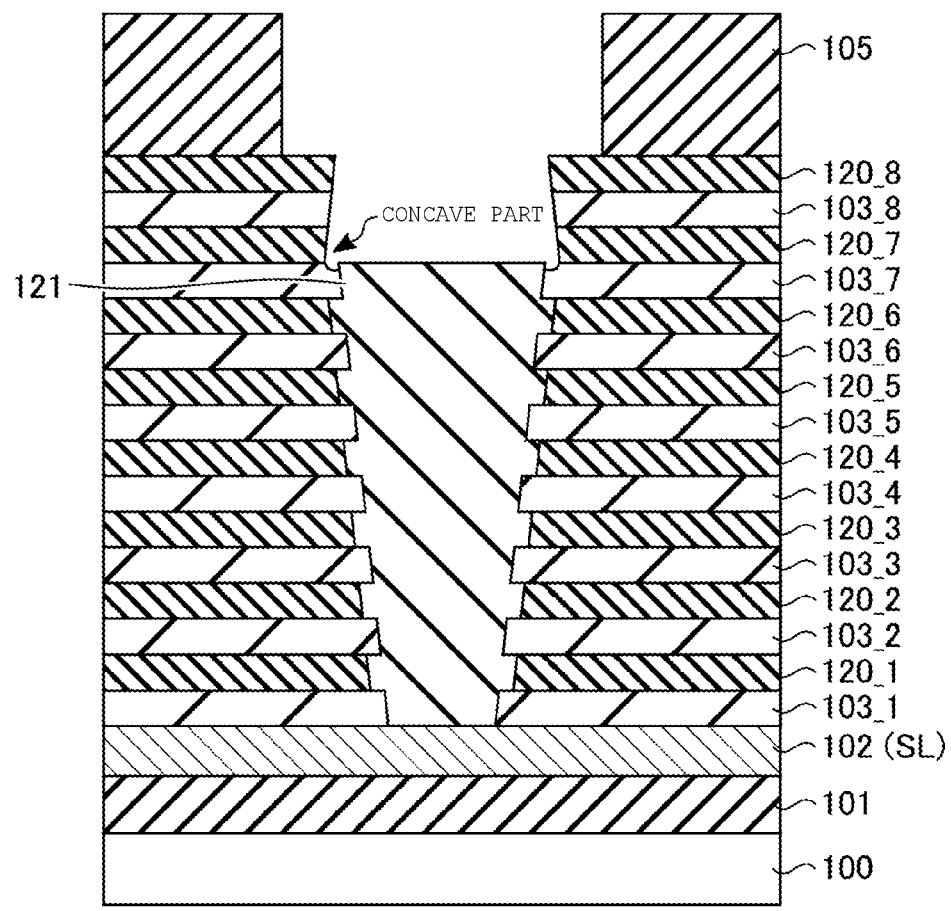
FIG. 29 is a cross-sectional view of a manufacturing method of a memory cell array according to a second embodiment.

Next, a method for manufacturing the memory cell array 11 will be described with reference to FIGS. 28 and 29. FIG. 28 is a flowchart of a manufacturing method of the memory cell array 11. FIG. 29 shows a cross-sectional view of the memory cell array 11 corresponding to step S26 in the flowchart of FIG. 28.

As shown in FIG. 28, steps S21 to S25 are the same as steps S1 to S5 in the first embodiment.

As shown in FIG. 29, the sacrificial layer 121 is etched until the sacrificial layers 120_7 and 120_8 are exposed, and then the insulating layers 103_8 and 105 are etched by, for example, wet etching (step S26 in FIG. 28). A concave part is formed on the insulating layer 103_7 by wet etching. At this time, the etching amount of the insulating layer 103_8 is adjusted such that the step between the upper end of the sacrificial layer 120_7 and the lower end of the insulating layer 103_8 and the step between the upper end of the insulating layer 103_8 and the lower end of the sacrificial layer 120_8 are almost eliminated. The etching condition is a condition in which etching rates of the insulating layers 103_8 and 105 are higher than those of the sacrificial layers 120_7 and 120_8 and the sacrificial layer 121.

Steps S27 to S32 subsequent to the step S26 are the same as steps S10 to S15 in the first embodiment.

In step S32, the lower memory pillar LMP, the connecting portion JC, and the upper memory pillar UMP are formed, and then the sacrificial layers 120 and 125 are removed by wet etching (step S33 in FIG. 28). As a result, gaps GP corresponding to the wiring layers 104_1 to 104_8 and the wiring layers 106_1 to 106_8 are formed.

Then, the wiring layers 104_1 to 104_8 and 106_1 to 106_8 are formed in step S34 in the same manner as in step S17 of the first embodiment.

2.4 Effect of Present Embodiment

With the configuration according to the present embodiment, the same effect as that of the first embodiment may be obtained.

3. Third Embodiment

Next, a third embodiment will be described. In the third embodiment, a shape of the memory pillar MP is different from that of the first and second embodiments. A method for manufacturing the memory cell array 11 will be described below. In the following, differences from the first and second embodiments will be mainly described.

3.1 Cross-Sectional Configuration of Memory Cell Array

Figure 30:
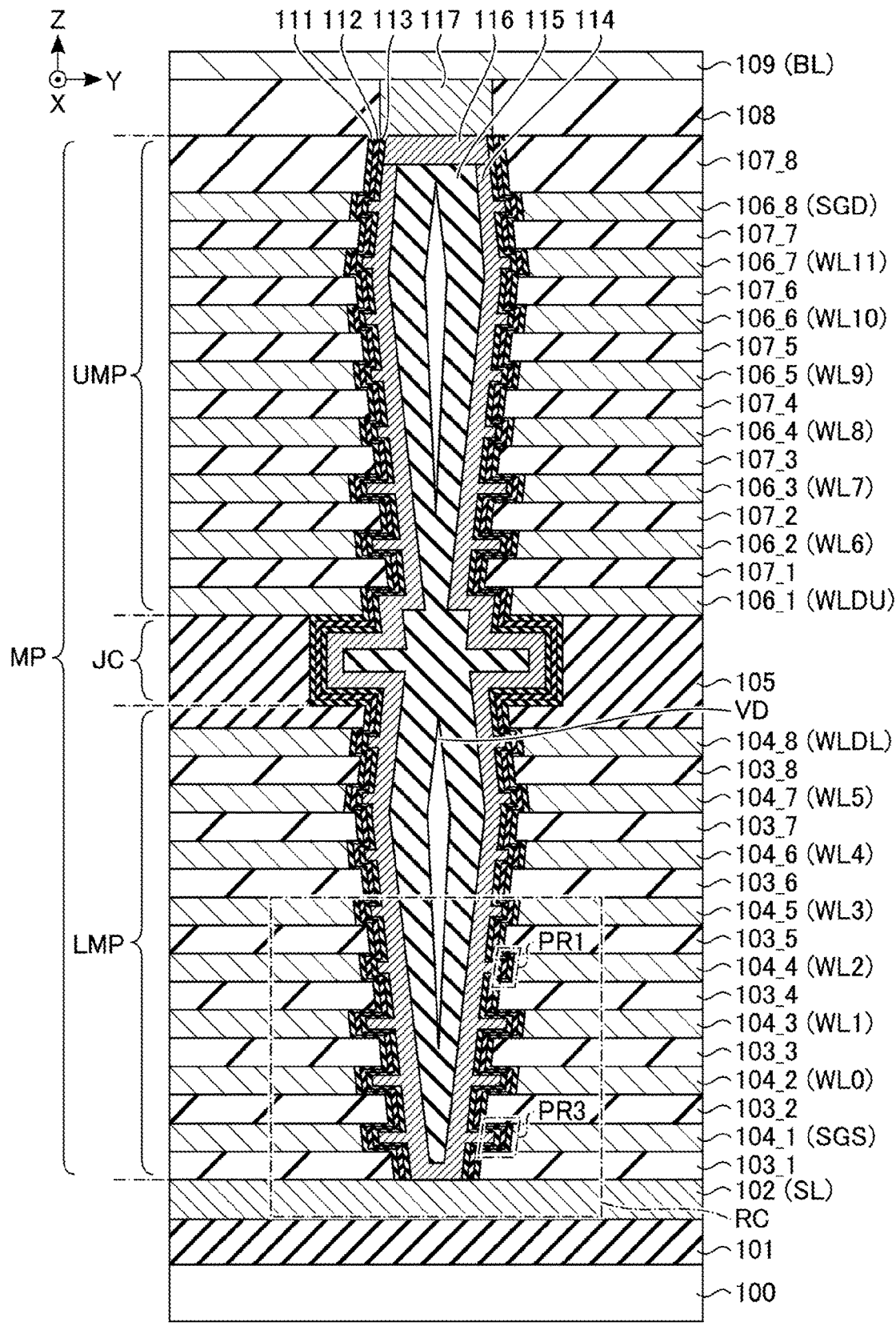
FIG. 30 is a cross-sectional view of a memory cell array according to a third embodiment.

First, an example of the memory cell array 11 according to the third embodiment will be described with reference to FIG. 30. FIG. 30 shows a cross-sectional diagram of one NAND string NS of the memory cell array 11.

As shown in FIG. 30, the lower memory pillar LMP of the present embodiment has protrusion parts PR3 on its side surface in the wiring layers 104_1, 104_2, and 104_3, which are three layers from the lower side. The three protrusion parts PR3 protrude from the center of the lower memory pillar LMP toward the wiring layers 104_1 to 104_3. Further, the number of the wiring layers 104 in which the protrusion parts PR3 are disposed may be two or more, counting from the lowermost wiring layer 104. In addition, the lower memory pillar LMP has protrusion parts PR1 on its side surface in the other wiring layers 104_4 to 104_8. The protruding amount of the protrusion parts PR3 is greater than that of the protrusion parts PR1. Similarly, the upper memory pillar UMP has protrusion parts PR3 on its side surface in the wiring layers 106_1, 106_2, and 106_3, which are three layers from the lower side. Moreover, the upper memory pillar UMP has protrusion parts PR1 on its side surface in the other wiring layers 106_4 to 106_8. The other configurations of the memory pillar MP according to the third embodiment is similar to the first embodiment.

Figure 31:
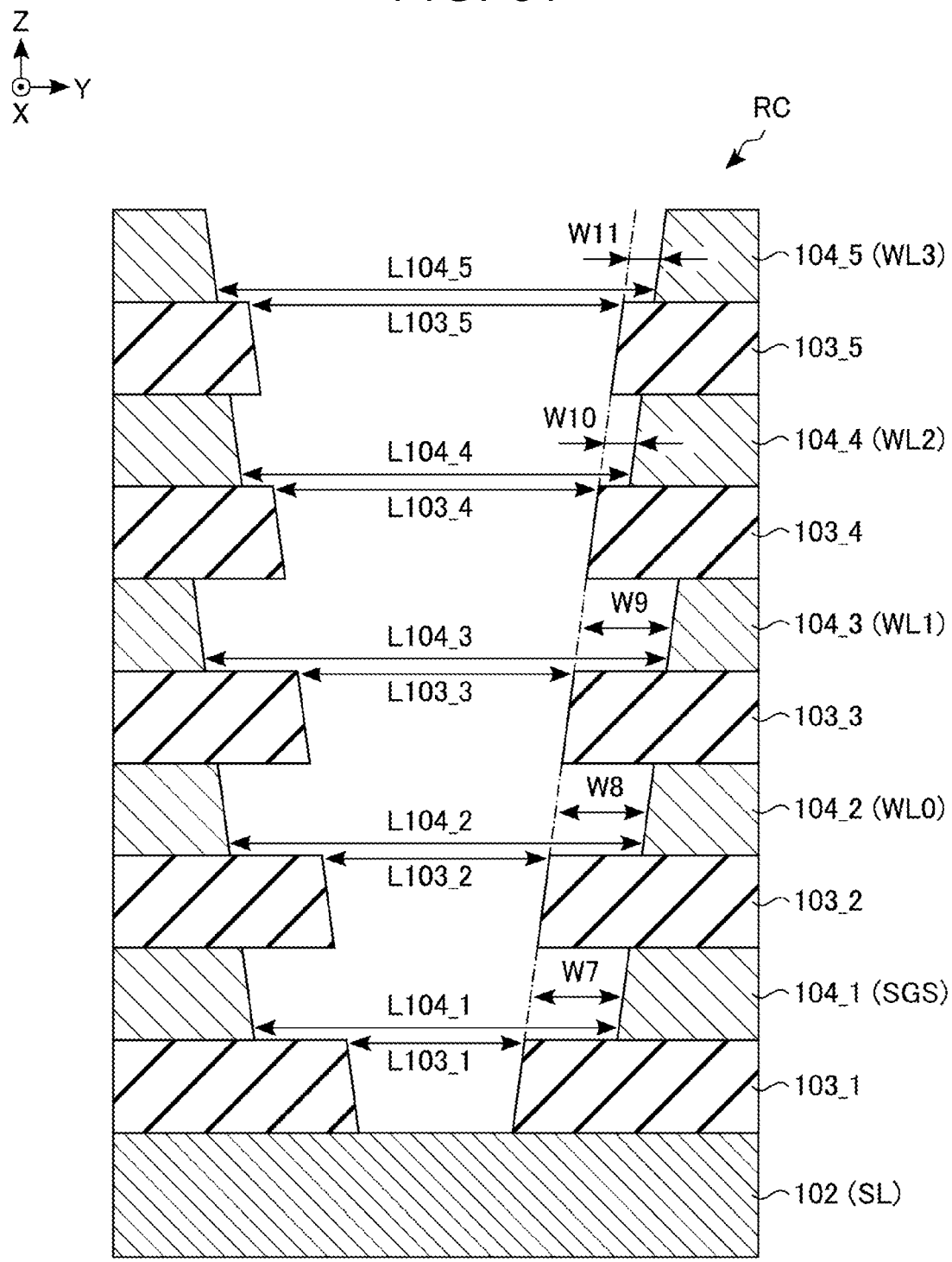
FIG. 31 is an enlarged view of region RC in FIG. 30.

3.2 Shape of Wiring Layers and Insulating Layers in Contact with Memory Pillar MP Next, the shapes of the wiring layers and the insulating layers in contact with the memory pillar MP will be with reference to FIG. 31. FIG. 31 is an enlarged view of region RC in FIG. 30. Further, in the example of FIG. 31, the lower memory pillar LMP is not illustrated for the sake of convenience of explanation. The side surface of each layer faces the memory pillar MP. In addition, the example of FIG. 31 shows a case where the lower memory pillar LMP has a taper shape.

As shown in FIG. 31, the widths between the upper ends of the insulating layers 103_1, 103_2, 103_3, 103_4, and 103_5 facing across the memory pillar MP in the Y direction are referred as L103_1, L103_2, L103_3, L103_4, and L103_5, respectively. The widths between the lower ends of the wiring layers 104_1, 104_2, 104_3, 104_4, and 104_5 facing across the memory pillar MP in the Y direction are referred to as L104_1, L104_2, L104_3, L104_4, and L104_5, respectively. That is, the width L104_1 indicates the diameter of the lower end of the select transistor ST2. In a case where the cross section of the memory pillar MP on the XY plane has a circular shape, the widths L104_2, L104_3, L104_4, and L104_5 indicate the diameters of the lower ends of the memory cell transistors MC0 to MC3.

In the present embodiment, the widths L103_1, L103_2, L103_3, L103_4, and L103_5 have a relationship of L103_1<L103_2<L103_3<L103_4<L103_5. The widths L104_1, L104_2, and L104_3 have a relationship of L103_1<L103_2<L103_3. Further, the widths L104_4 and L104_5 have a relationship of L104_4<L104_5.

In the wiring layers 104_1, 104_2, and 104_3, the protrusion parts PR3 are disposed on the side surface of the lower memory pillar LMP. Hereinafter, the step width between the upper end of the insulating layer 103_1 and the lower end of the wiring layer 104_1 is referred to as W7. The step width W7 may be expressed as W7=((L104_1)−(L103_1))/2. The step width between the upper end of the insulating layer 103_2 and the lower end of the wiring layer 104_2 is referred to as W8. The step width W8 may be expressed as W8=((L104_2)−(L103_2))/2. In addition, the step width between the upper end of the insulating layer 103_3 and the lower end of the wiring layer 104_3 is referred to as W9. The step width W9 may be expressed as W9=((L104_3)−(L103_3))/2. The protrusions having the step widths W7, W8, and W9 correspond to the protrusion parts PR3 of the lower memory pillar LMP. Therefore, the step widths W7, W8, and W9 are substantially the same.

In the wiring layers 104_4 and 104_5, the protrusion parts PR1 are disposed on the side surface of the lower memory pillar LMP. The step width between the upper end of the insulating layer 103_4 and the lower end of the wiring layer 104_4 is referred to as W10. The step width W10 may be expressed as W10=((L104_4)−(L103_4))/2. The step width between the upper end of the insulating layer 103_5 and the lower end of the wiring layer 104_5 is referred to as W11. The step width W11 may be expressed as W11=((L104_5)−(L103_5))/2. The protrusions having the step widths W10 and W11 correspond to the protrusion parts PR1 of the lower memory pillar LMP. Therefore, the steps W10 and W11 are substantially the same. The protruding amount of the protrusion parts PR3 is greater than that of the protrusion parts PR1. Therefore, the step widths W7 to W11 have a relationship of W7>W10, W7>W11, W8>W10, W8>W11, W9>W10, and W9>W11. Therefore, in the example of FIG. 31, the width L104_3 and the width L104_4 have a relationship of L104_3>L104_4. That is, in a case where the cross section of the memory pillar MP on the XY plane has a circular shape, the diameter of the memory cell transistor MC1 is greater than that of the memory cell transistor MC2. The diameters of the corresponding memory cell transistors MC and the select transistors ST2 can be adjusted by changing the difference between the step widths W7 to W9 and the step widths W10 and W11.

3.3 Method for Manufacturing Memory Cell Array

Figure 32:
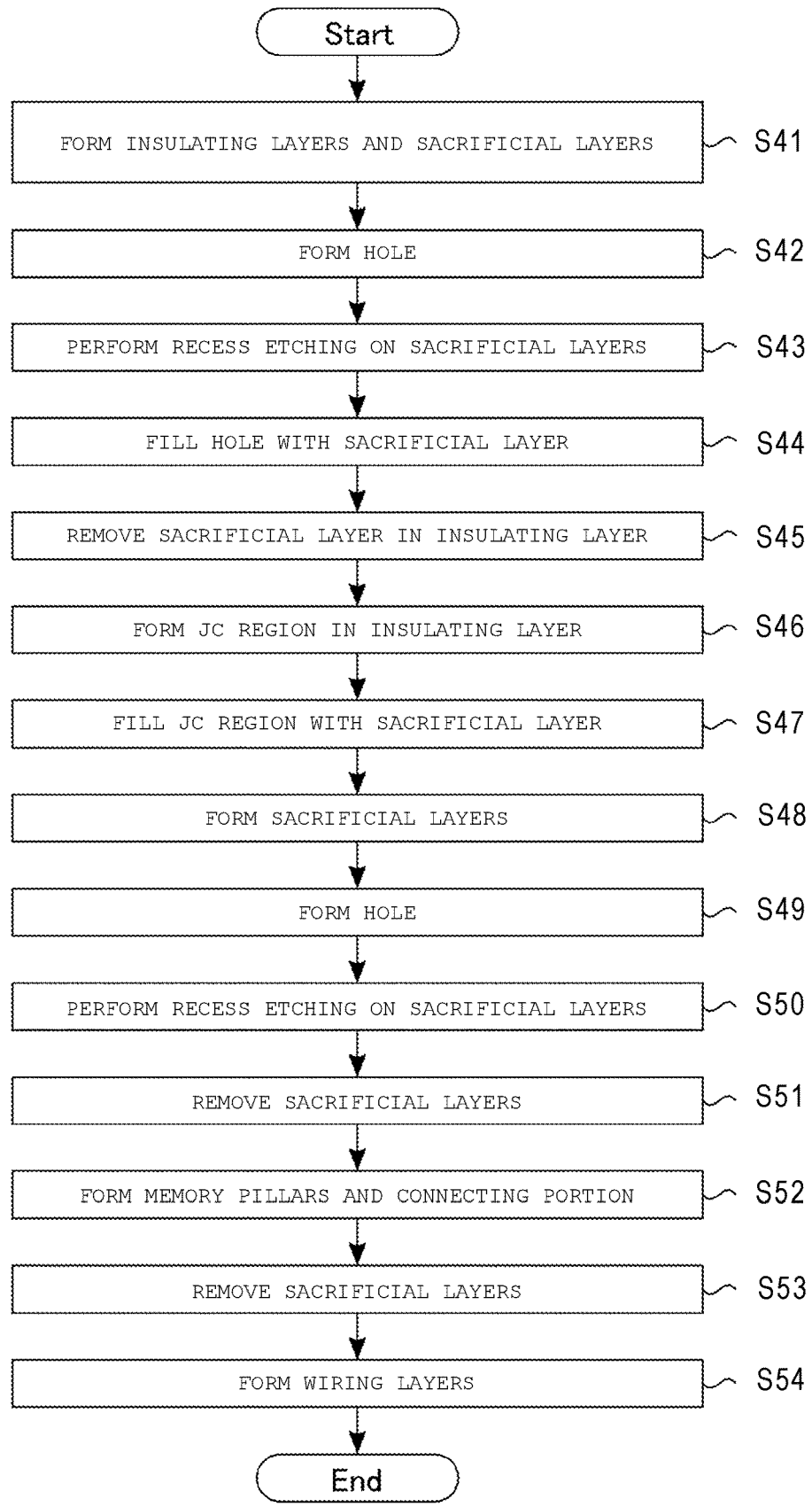
FIG. 32 is a flowchart of a manufacturing method of a memory cell array according to a third embodiment.

Next, a method for manufacturing the memory cell array 11 will be described with reference to FIGS. 32 to 42. FIG. 32 is a flowchart of a manufacturing method of the memory cell array 11. FIGS. 33 to 42 are cross-sectional views of the memory cell array 11 corresponding to steps S41-S44, S48-S51, S53, and S54 in the flowchart of FIG. 32, respectively.

Figure 33:
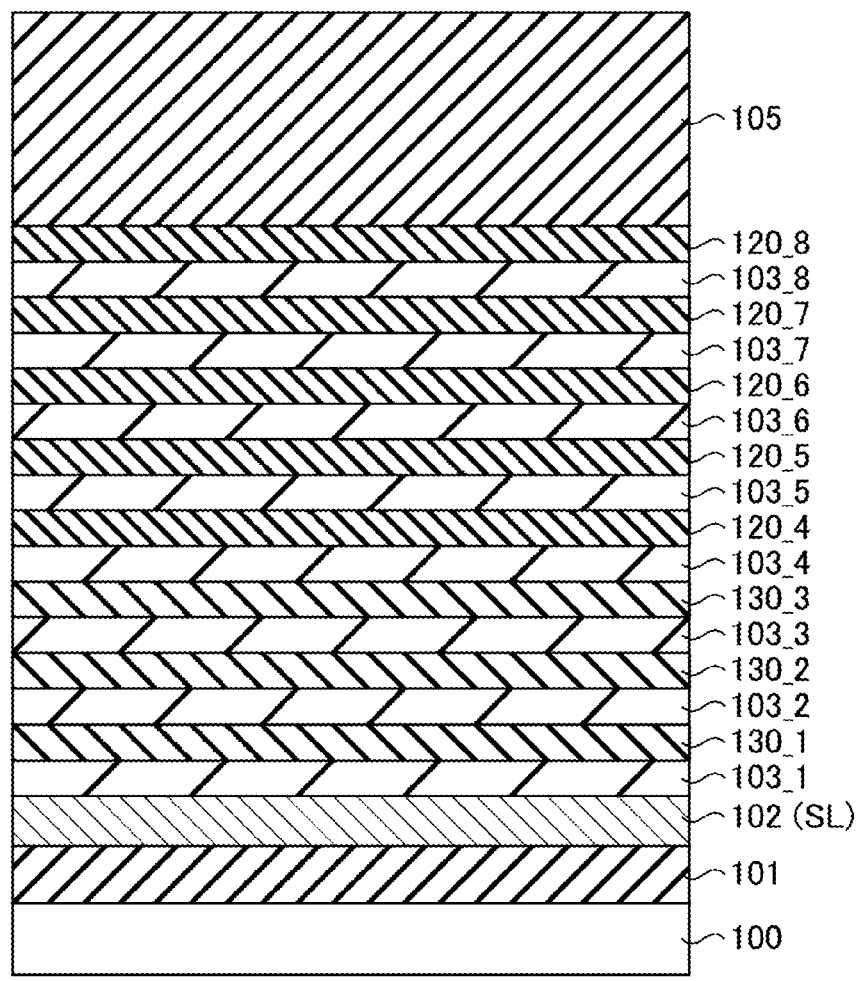
FIG. 33 through FIG. 42 depict a manufacturing method of a memory cell array according to the third embodiment.

As shown in FIG. 33, first, the plurality of insulating layers 103, the plurality of sacrificial layers 120, the plurality of sacrificial layers 130, and the insulating layer 105 are formed (step S41 in FIG. 32). More specifically, the insulating layer 101 is formed on the semiconductor substrate 100. Furthermore, the wiring layer 102 is formed on the insulating layer 101. In this state, the insulating layer 103_1 is formed on the wiring layer 102. The sacrificial layer 130_1 is formed on the insulating layer 103_1. The insulating layer 103_2 is formed on the sacrificial layer 130_1. The sacrificial layer 130_2 is formed on the insulating layer 103_2. The insulating layer 103_3 is formed on the sacrificial layer 130_2. The sacrificial layer 130_3 is formed on the insulating layer 103_3. The insulating layer 103_4 is formed on the sacrificial layer 130_3. The sacrificial layer 120_4 is formed on the insulating layer 103_4. The insulating layer 103_5 is formed on the sacrificial layer 120_4. The sacrificial layer 120_5 is formed on the insulating layer 103_5. The insulating layer 103_6 is formed on the sacrificial layer 120_5. The sacrificial layer 120_6 is formed on the insulating layer 103_6. The insulating layer 103_7 is formed on the sacrificial layer 120_6. The sacrificial layer 120_7 is formed on the insulating layer 103_7. The insulating layer 103_8 is formed on the sacrificial layer 120_7. The sacrificial layer 120_8 is formed on the insulating layer 103_8. Next, the insulating layer 105 is formed on the uppermost sacrificial layer 120_8.

The sacrificial layers 130_1 to 130_3 correspond to the wiring layers 104_1 to 104_3, respectively. The sacrificial layers 130_1 to 130_3 will be later replaced with the wiring layers 104_1 to 104_3, respectively. For the sacrificial layers 130 (130_1 to 130_3), a material capable of obtaining a sufficient wet etching selectivity with respect to the insulating layers 103 is used. Further, for the sacrificial layers 130, a material having a higher etching rate for wet etching than the sacrificial layers 120 is used. For example, in a case where the sacrificial layers 120 are SiN, SiN having a density lower than that of the sacrificial layers 120 or silicon nitride (SiN) containing impurities (e.g., oxygen (O)) may be used for the sacrificial layers 130. For example, in the case of silicon nitride incorporating impurities, a wet etching selectivity between the silicon nitride of the sacrificial layers 120 and the silicon nitride of the sacrificial layers 130 may be controlled by adjusting the density of the silicon nitride or the concentration of impurities in the silicon nitride.

Figure 34:
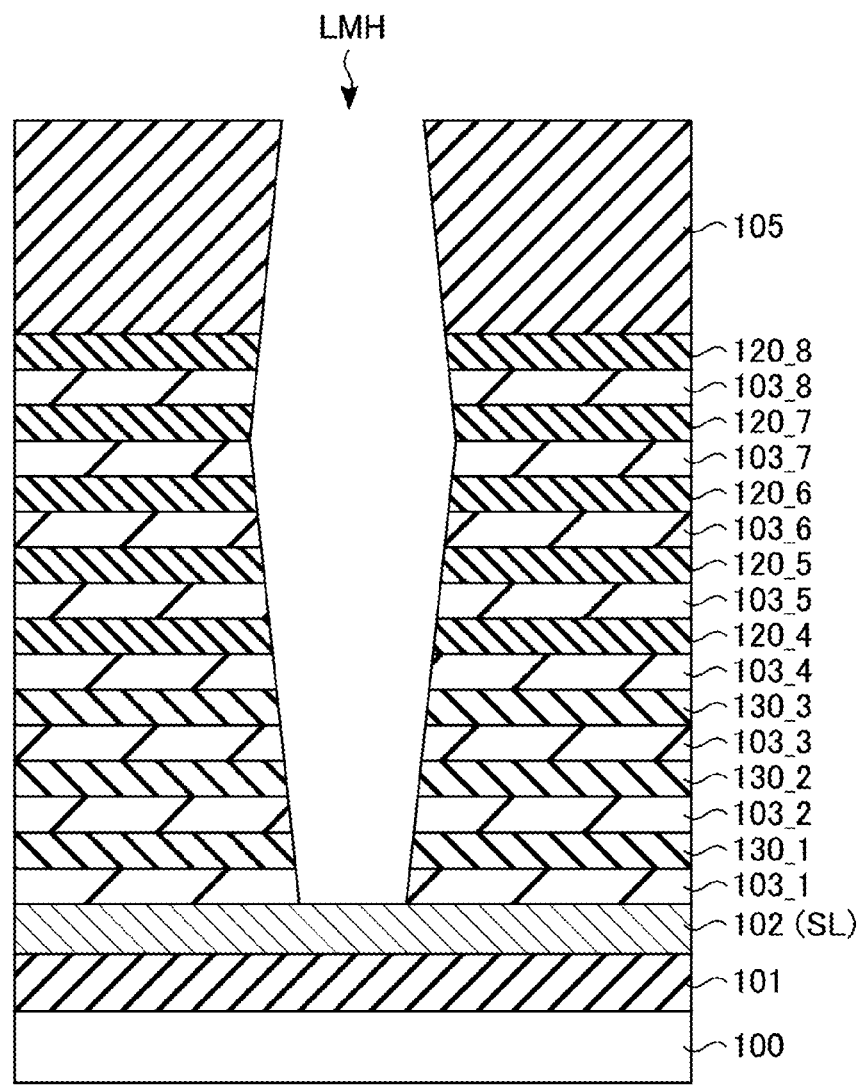

As shown in FIG. 34, the hole LMH is formed (step S42 in FIG. 32). More specifically, the hole LMH penetrates the eight insulating layers 103_1 to 103_8, the three sacrificial layers 130_1 to 130_3, the five sacrificial layers 120_4 to 120_8, and the insulating layer 105. The bottom surface of the hole LMH reaches the wiring layer 102. Further, the shape of the opening part of the hole LMH is not limited to a perfect circular shape. The shape of the opening part of the hole LMH may be an elliptical shape or a rectangular shape. In addition, the cross section of the hole LMH may have a taper shape, a straight shape on the side surface along the Z direction, or a bowing shape.

Figure 35:
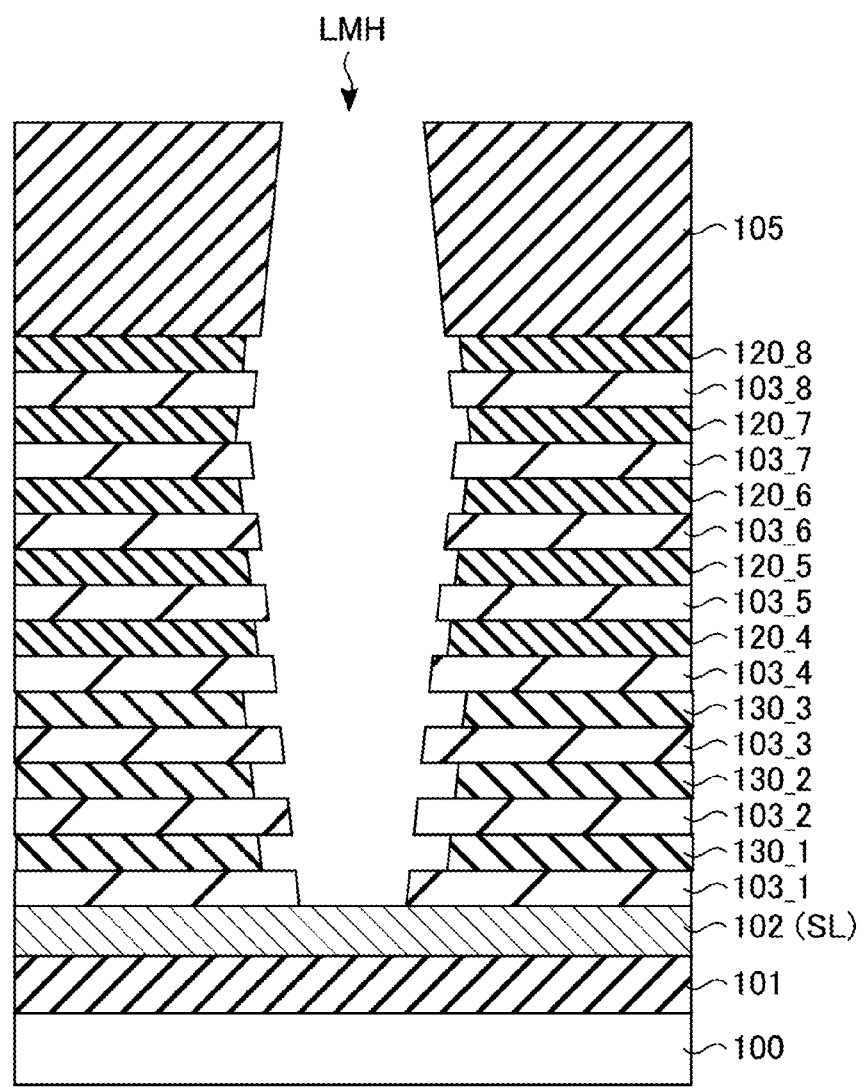

As shown in FIG. 35, recess etching on the sacrificial layers 120 and 130 is performed (step S43 in FIG. 32). More specifically, the side surfaces of the sacrificial layers 120 and 130 exposed in the hole LMH are wet-etched. Then, recess regions extending from the hole LMH are formed. In a case where the cross section of the hole LMH on the XY plane has a circular shape, the recess regions extend concentrically from the hole LMH. At this time, the wet etching condition is a condition in which etching rates of the sacrificial layers 120 and 130 are higher than those of the insulating layers 103. In addition, the etching rate of the sacrificial layers 130 is higher than that of the sacrificial layers 120. The recess regions in the sacrificial layers 130_1 to 130_3 correspond to the protrusion parts PR3. The recess regions in the sacrificial layers 120_4 to 120_8 correspond to the protrusion parts PR1. Therefore, the recess or step width of the recess regions in the sacrificial layers 130_1 to 130_3 is greater than that of the recess regions in the sacrificial layers 120_4 to 120_8.

Figure 36:
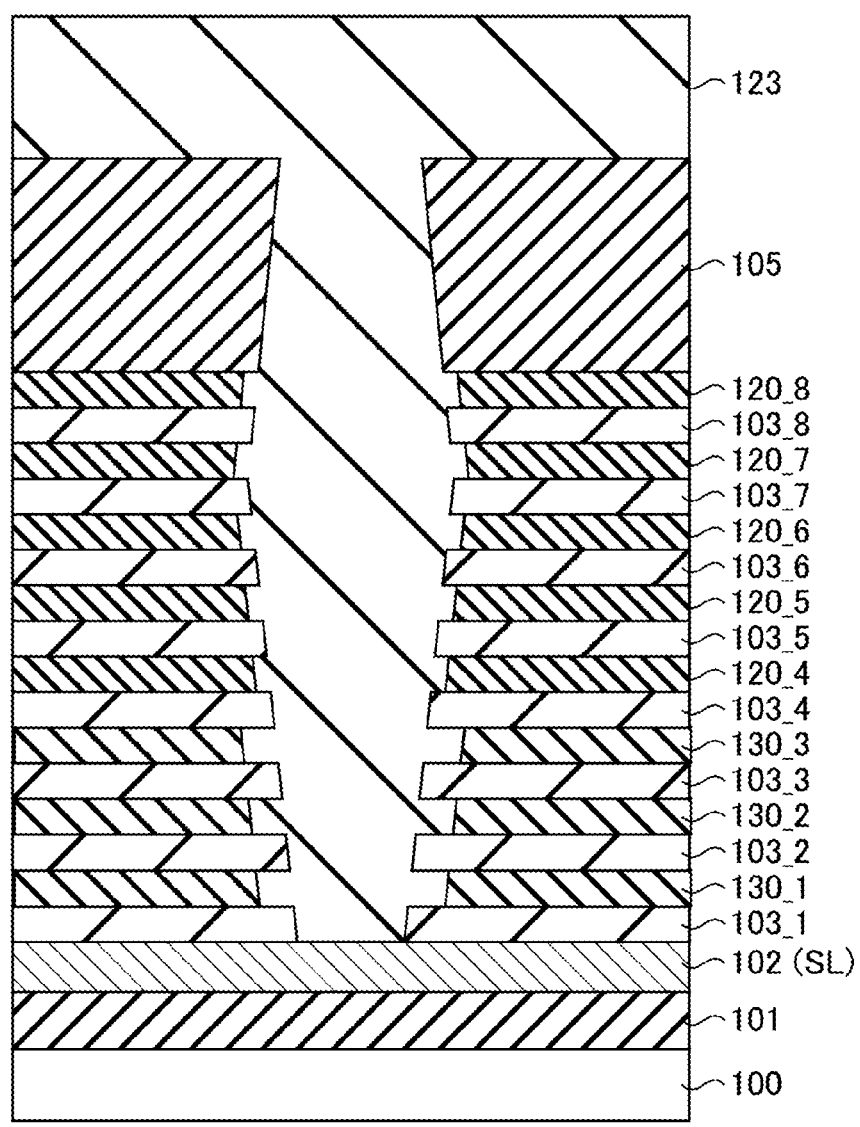

As shown in FIG. 36, the hole LMH is filled with the sacrificial layer 123 (step S44 in FIG. 6). In the present embodiment, the sacrificial layer 123 is filled in the entire hole LMH.

Steps S45 to S47 are the same as steps S8 to S10 in the first embodiment.

Figure 37:
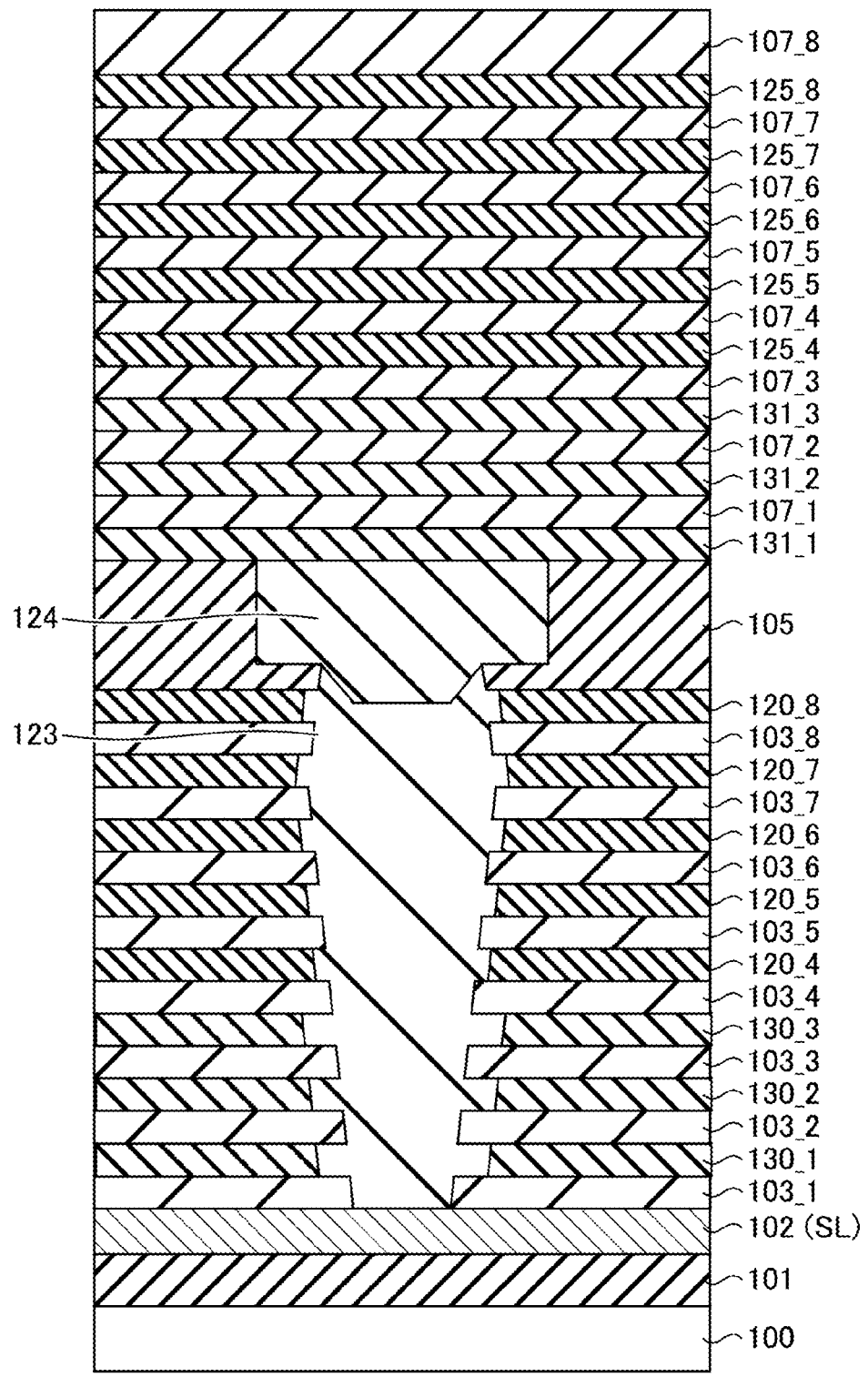

As shown in FIG. 37, the plurality of sacrificial layers 125, the plurality of sacrificial layers 131, and the plurality of insulating layers 107 are formed on the insulating layer 105 and the sacrificial layer 124 (step S48 in FIG. 32). More specifically, the sacrificial layer 131_1 is formed on the insulating layer 105 and the sacrificial layer 124. The insulating layer 107_1 is formed on the sacrificial layer 131_1. The sacrificial layer 131_2 is formed on the insulating layer 107_1. The insulating layer 107_2 is formed on the sacrificial layer 131_2. The sacrificial layer 131_3 is formed on the insulating layer 107_2. The insulating layer 107_3 is formed on the sacrificial layer 131_3. The sacrificial layer 125_4 is formed on the insulating layer 107_3. The insulating layer 107_4 is formed on the sacrificial layer 125_4. The sacrificial layer 125_5 is formed on the insulating layer 107_4. The insulating layer 107_5 is formed on the sacrificial layer 125_5. The sacrificial layer 125_6 is formed on the insulating layer 107_5. The insulating layer 107_6 is formed on the sacrificial layer 125_6. The sacrificial layer 125_7 is formed on the insulating layer 107_6. The insulating layer 107_7 is formed on the sacrificial layer 125_7. The sacrificial layer 125_8 is formed on the insulating layer 107_7. The insulating layer 107_8 is formed on the sacrificial layer 125_8.

The sacrificial layers 131_1 to 131_3 correspond to the wiring layers 106_1 to 106_3, respectively. The sacrificial layers 130_1 to 130_3 will be later replaced with the wiring layers 106_1 to 106_3, respectively. For the sacrificial layers 131 (131_1 to 131_3), a material capable of providing a sufficient wet etching selectivity with respect to the insulating layers 107 is used. Further, for the sacrificial layers 131, a material having a higher etching rate in wet etching than the sacrificial layers 125 is used. For example, in a case where the sacrificial layers 125 are SiN, SiN having a density lower than that of the sacrificial layers 125 or silicon nitride (SiN) containing impurities (e.g., oxygen (O)) may be used for the sacrificial layers 131, similarly to the sacrificial layers 130.

Figure 38:
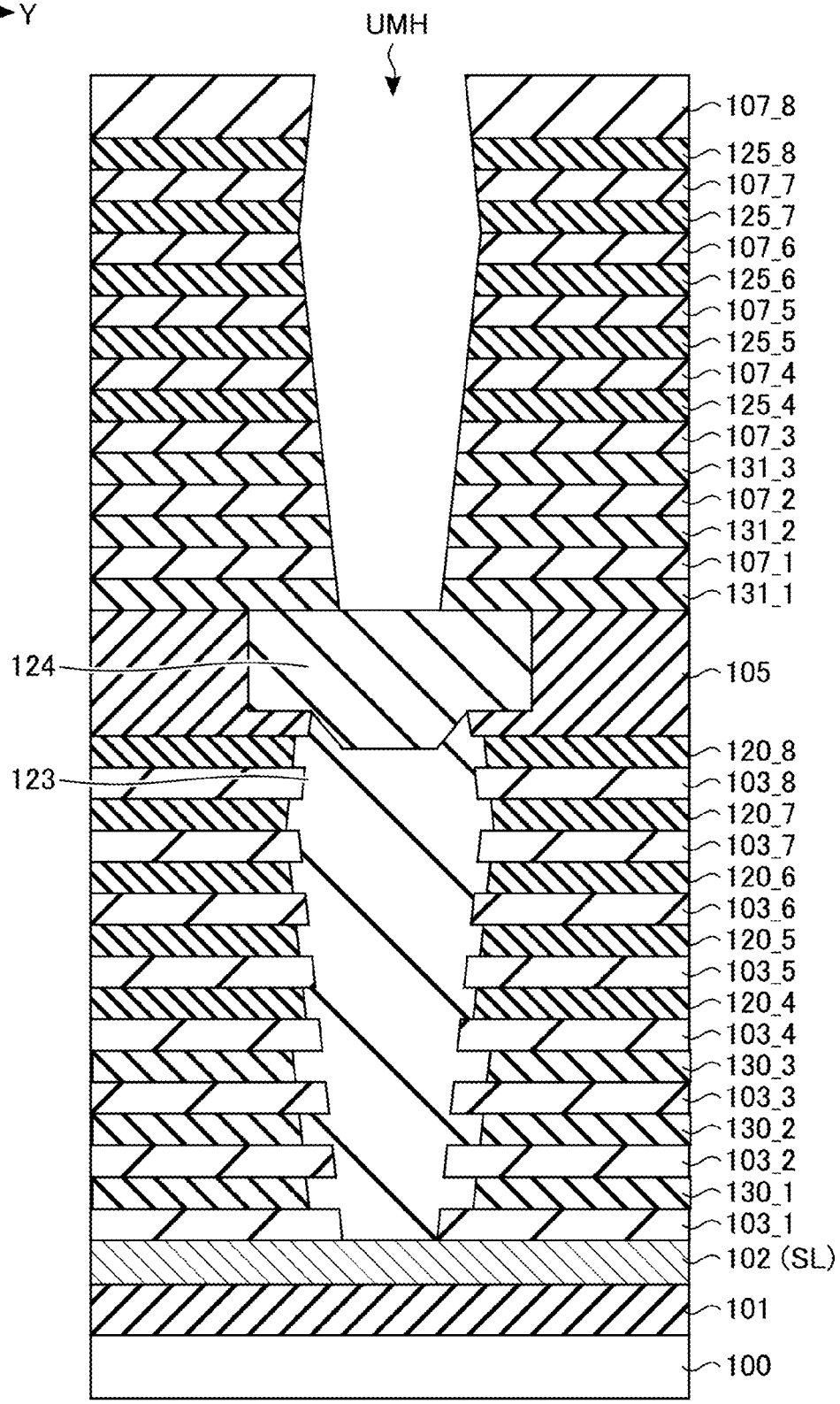

As shown in FIG. 38, the hole UMH is formed on the sacrificial layer 124 (step S49 in FIG. 32). More specifically, the hole UMH penetrates the three sacrificial layers 131_1 to 131_3, the five sacrificial layers 125_4 to 125_8, and the eight insulating layers 107_1 to 107_8. The bottom surface of the hole UMH reaches the sacrificial layer 124. Further, the shape of the opening part of the hole UMH is not limited to a perfect circular shape. The shape of the opening part of the hole UMH may be an elliptical shape or a rectangular shape. In addition, the cross section of the hole UMH may have a taper shape, a straight shape, or a bowing shape.

Figure 39:
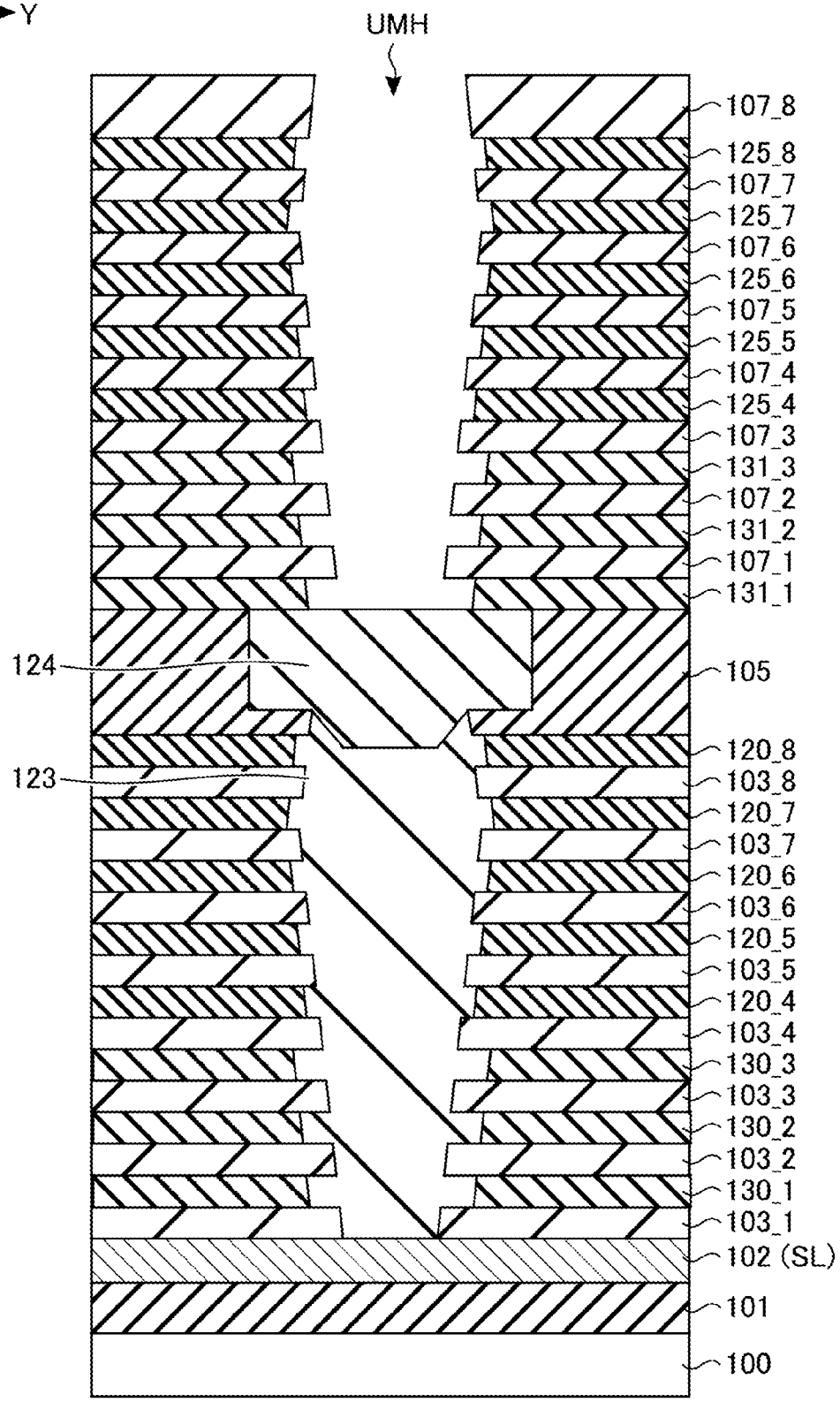

As shown in FIG. 39, recess etching on the sacrificial layers 125 and 131 is performed (step S50 in FIG. 32). More specifically, the side surfaces of the sacrificial layers 125 and 131 exposed in the hole UMH are wet-etched. Then, a recess region extending from the hole UMH is formed. In a case where the cross section of the hole UMH on the XY plane has a circular shape, the recess regions extend concentrically from the hole UMH. At this time, the wet etching condition is a condition in which etching rates of the sacrificial layers 125 and 131 are higher than those of the insulating layers 107 and the sacrificial layer 124. Furthermore, an etching rate of the sacrificial layers 131 is higher than that of the sacrificial layers 125. The recess regions in the sacrificial layer 131_1 to 131_3 correspond to the protrusion parts PR3. The recess regions in the sacrificial layers 125_4 to 125_8 correspond to the protrusion parts PR1. Therefore, the recess or step width of the recess regions in the sacrificial layers 131_1 to 131_3 is greater than that of the recess regions in the sacrificial layers 125_4 to 125_8.

Figure 40:
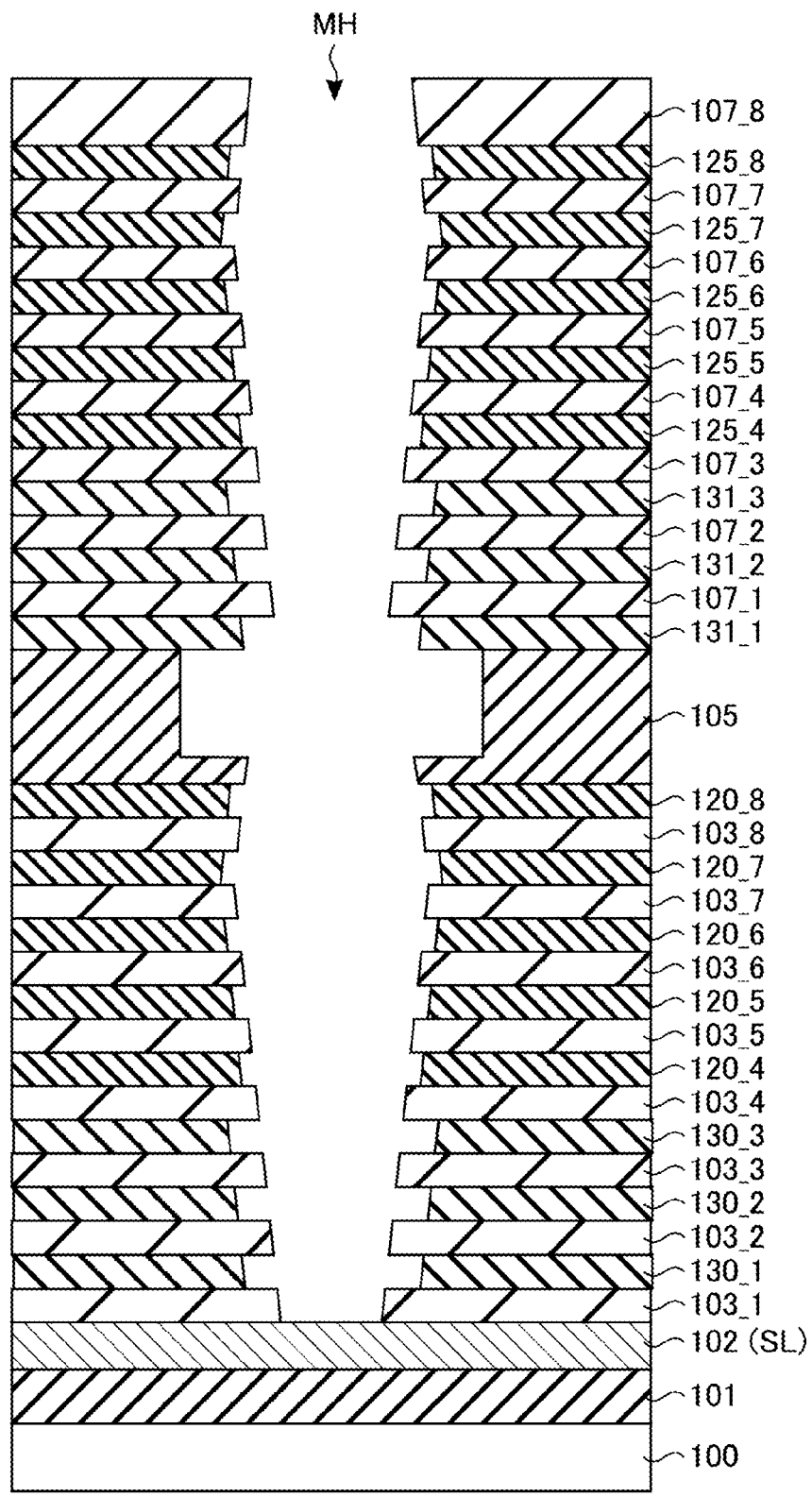

As shown in FIG. 40, the sacrificial layers 123 and 124 are removed by wet etching (step S51 in FIG. 32). At this time, the etching condition is a condition in which etching rates of the sacrificial layers 123, and 124 are higher than those of the wiring layer 102, the insulating layers 103, 105, and 107, and the sacrificial layers 120, 125, 130, and 131. As a result, the hole MH is formed.

Next, similarly to step S15 in the first embodiment, in step S52, the lower memory pillar LMP, the connecting portion JC, and the upper memory pillar UMP are collectively formed.

Next, replacement is executed in steps S53 and S54 of FIG. 32.

Figure 41:
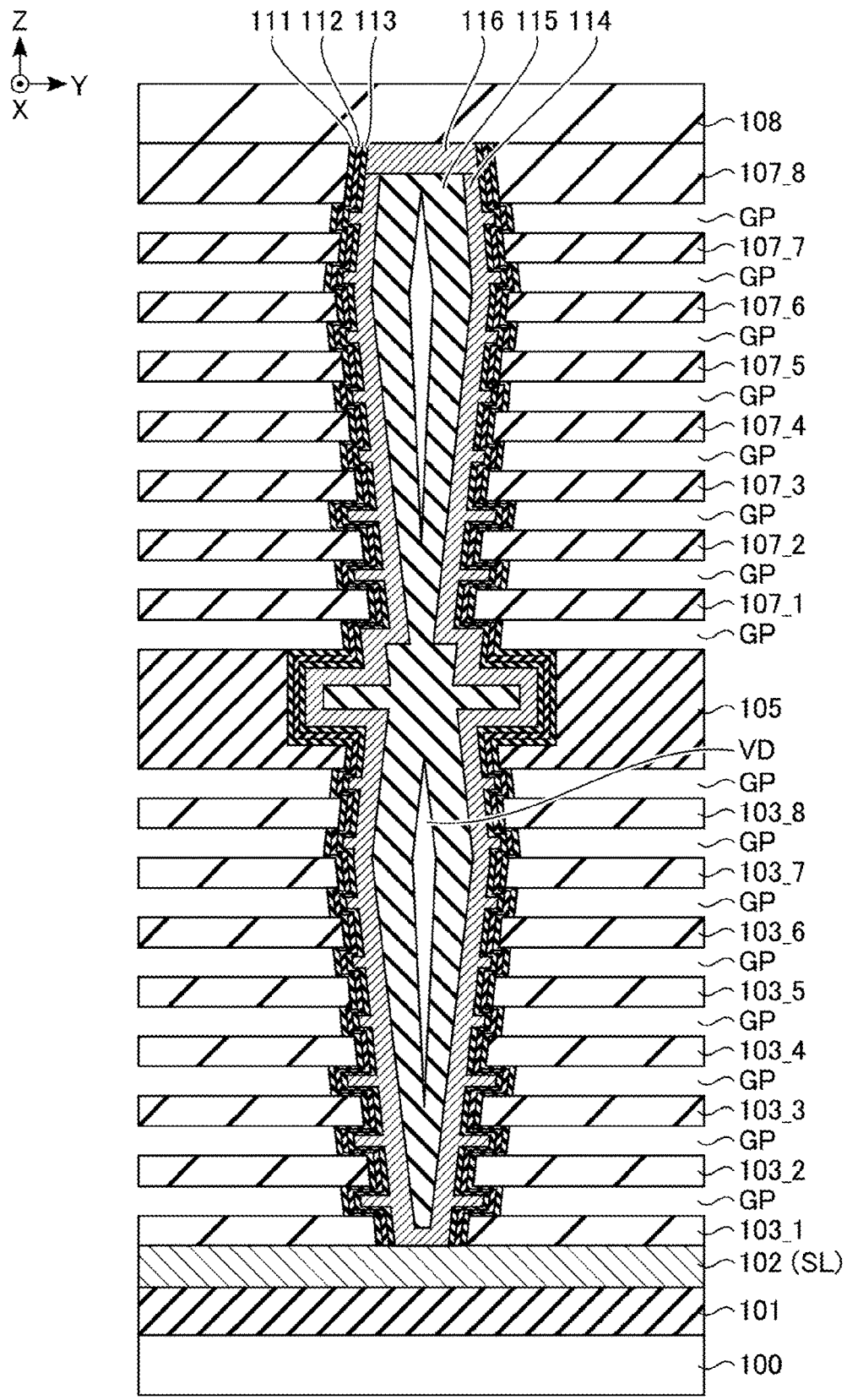

As shown in FIG. 41, first, the sacrificial layers 120, 125, 130, and 131 are removed by wet etching (step S53 in FIG. 7). More specifically, in a region that is not specifically depicted, a slit in which the sacrificial layers 120, 125, 130 and 131 are exposed is formed along the Z direction. That is, the slit penetrates or passes the sacrificial layers 130_1 to 130_3, the sacrificial layers 120_4 to 120_8, the sacrificial layers 131_1 to 131_3, and the sacrificial layers 125_4 to 125_8. After forming the slit, the sacrificial layers 130_1 to 130_3, the sacrificial layers 120_4 to 120_8, the sacrificial layers 131_1 to 131_3, and the sacrificial layers 125_4 to 125_8 are removed via a side surface of the slit by wet etching. At this time, the etching uses conditions for which etching rates of the sacrificial layers 120, 125, 130, and 131 are higher than those of the insulating layers 103, 105, 107, and the block insulating film 111. As a result, gaps GP corresponding to the wiring layers 104_1 to 104_8 and the wiring layers 106_1 to 106_8 are formed.

Figure 42:
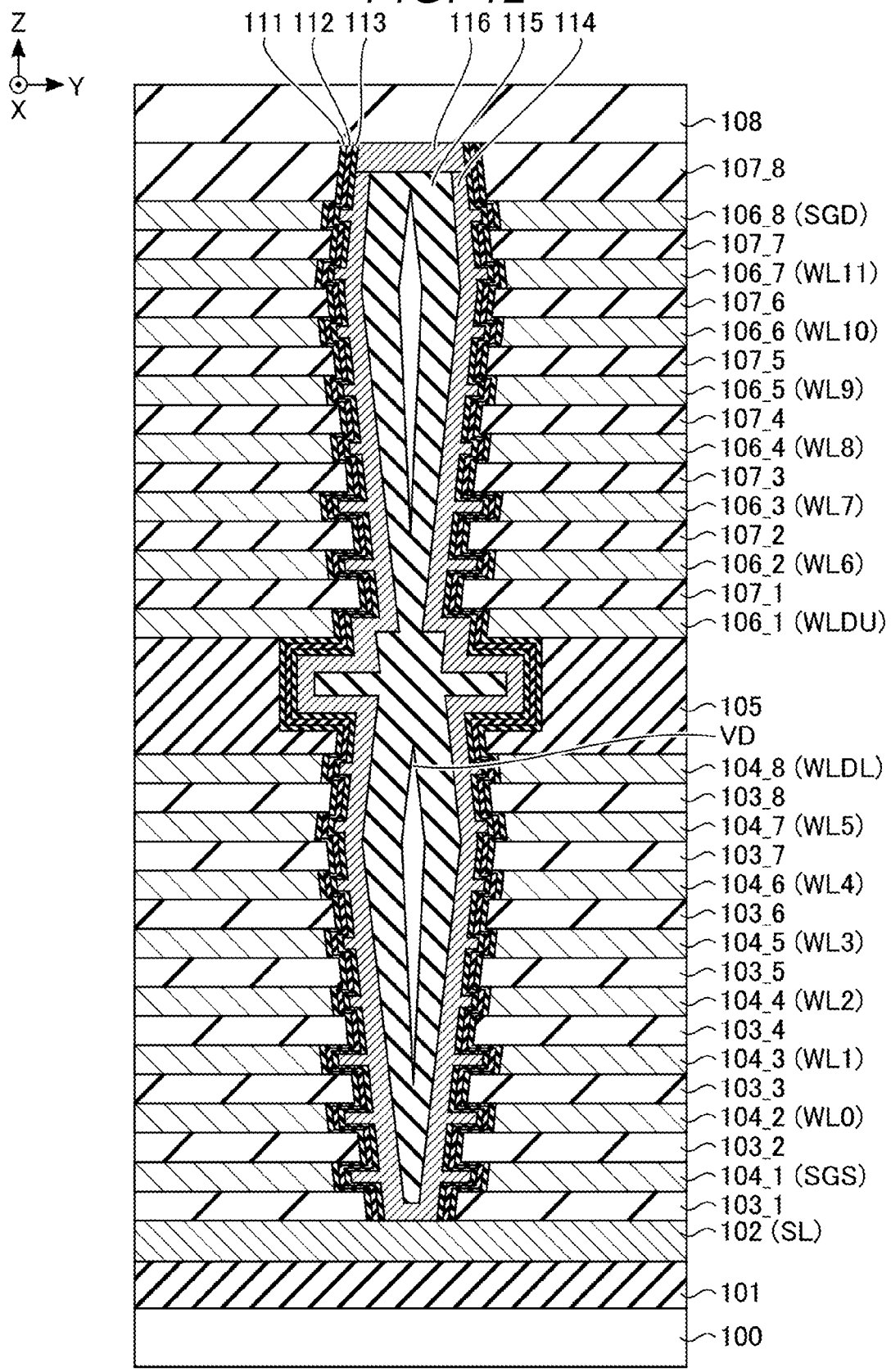

As shown in FIG. 42, the wiring layers 104 and 106 are formed in the same manner as in step S17 of the first embodiment (step S54 in FIG. 38).

3.4 Effect of Present Embodiment

For example, in a case where the memory pillar MP has a taper shape, the memory cell transistors MC at the lower end side of the memory pillar MP becomes thinner. In a case where the cross section of the memory pillar MP on the XY plane has a circular shape, a diameter of the memory cell transistors MC at the lower end side of the memory pillar MP becomes smaller. That is, the thickness or diameter of the plurality of memory cell transistors MC varies in the memory pillar MP. In a case where the memory cell transistors MC become thinner or the diameter of the memory cell transistors MC becomes smaller, a channel region of the memory cell transistors MC becomes narrower. Therefore, the memory cell transistors MC which is thin or has a small diameter have a higher electric field strength between the gate and the channel than those which is thick or has a large diameter. Therefore, in the memory cell transistors MC which is thin or has a small diameter, variation in threshold is likely to occur due to a read operation (in the following, referred to as "read disturbance").

In contrast, in a configuration according to the present embodiment, protrusion parts having different protruding amounts can be formed on the side surface of the memory pillar MP in the plurality of wiring layers 104. That is, in a region where the memory pillar MP becomes thinner or smaller in diameter, the memory pillar MP can be made relatively thick or large in diameter by making the protruding amount of the protrusion parts relatively large. As a result, variations in the thickness or diameter of each memory cell transistor MC in the memory pillar MP can be suppressed. Accordingly, variations in the electric field strength between the gate and the channel in each memory cell transistor MC can be suppressed. That is, read disturbance can be reduced. Therefore, the reliability of the semiconductor storage device 1 can be improved.

Further, a third embodiment may be combined with the first embodiment or the second embodiment.

4. Modification Examples

According to the above-described embodiments, the semiconductor storage device includes the first wiring layer 104_6, the first insulating layer 103_7 disposed on the first wiring layer, the second wiring layer 104_7 disposed on the first insulating layer, the second insulating layer 103_8 disposed on the second wiring layer, the third wiring layer 104_8 disposed on the second insulating layer, and the first pillar (LMP) that extends along the Z direction, and passes through the first wiring layer, the first insulating layer, the second wiring layer, the second insulating layer, and the third wiring layer, and includes the first semiconductor layer 114. The width of a first step W1 between a first surface of the first wiring layer facing the first pillar and a second surface of the first insulating layer facing the first pillar is greater than (i) the width of a second step W2 between a third surface of the second wiring layer facing the first pillar and a fourth surface of the second insulating layer facing the first pillar and (ii) the width of a third step W3 between the fourth surface and a fifth surface of the third wiring layer facing the first pillar.

The foregoing embodiments may be applicable to provide a semiconductor storage device, thereby improving reliability.

Further, embodiments of such a semiconductor storage device are not limited to the above-described embodiments, and various modifications may be made thereto.

Figure 43:
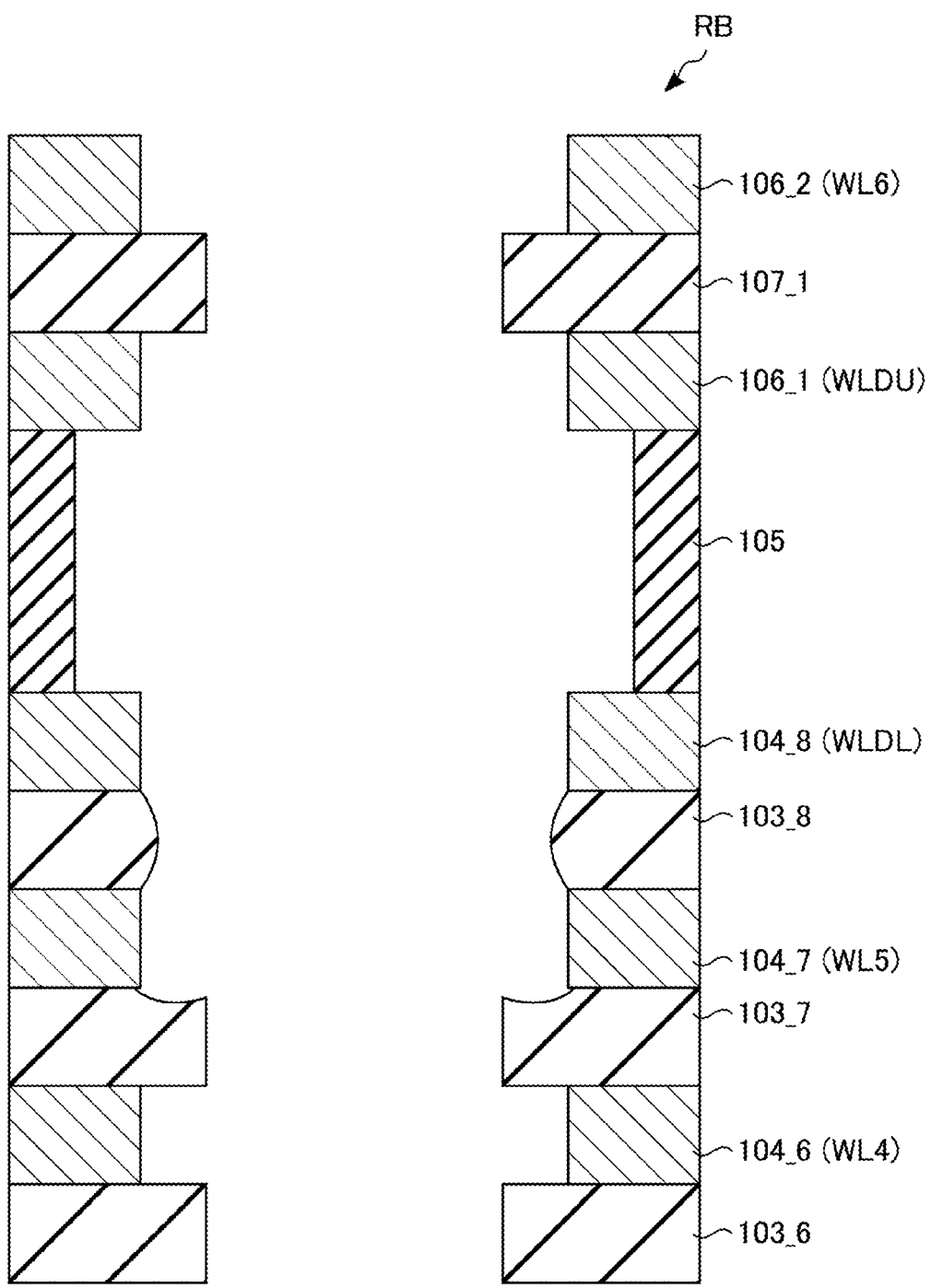
FIG. 43 is a cross-sectional view of a memory cell array according to a modification example.

For example, in the second embodiment, as shown in FIG. 43, the side surface of the insulating layer 103_8 may be curved to protrude from the wiring layers 104_7 and 104_8. FIG. 43 is an enlarged view of the region RB of FIG. 25 in the second embodiment. For example, in a case where the insulating layer 103_8 is etched by wet etching in step S20 described with reference to FIG. 28 in the second embodiment, the shape of the end part of the insulating layer 103_8 may be curved.

Moreover, the term "connection" in the above-described embodiments also includes a state in which two components are indirectly connected by another component such as a transistor or a resistor interposed therebetween.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a first wiring layer;
a first insulating layer on the first wiring layer;
a second wiring layer on the first insulating layer;
a second insulating layer on the second wiring layer;
a third wiring layer on the second insulating layer; and
a first pillar that passes through the first, second, and third wiring layers and the first and second insulating layers along a first direction and includes a first semiconductor layer, wherein
a first distance between a side surface of the first wiring layer facing the first pillar and a side surface of the first insulating layer facing the first pillar in a second direction perpendicular to the first direction is greater than a second distance between a side surface of the second wiring layer facing the first pillar and a side surface of the second insulating layer facing the first pillar in the second direction and a third distance between the side surface of the second insulating layer and a side surface of the third wiring layer facing the first pillar in the second direction.

2. The semiconductor storage device according to claim 1, further comprising:
a connecting portion on the first pillar; and
a second pillar on the connecting portion and extending along the first direction, wherein
the first semiconductor layer is included in the connecting portion and the second pillar.

3. The semiconductor storage device according to claim 2, wherein the third wiring layer is adjacent to the connecting portion via a third insulating layer in the first direction.

4. The semiconductor storage device according to claim 2, wherein the third wiring layer is in contact with a third insulating layer in the first direction.

5. The semiconductor storage device according to claim 2, further comprising:
a fourth wiring layer on the connecting portion;
a fourth insulating layer on the fourth wiring; and
a fifth wiring layer on the fourth insulating layer, wherein
the second pillar passes through the fourth wiring layer, the fourth insulating layer, and the fifth wiring layer along the first direction.

6. The semiconductor storage device according to claim 5, wherein a fourth distance between a side surface of the fourth wiring layer facing the second pillar and a side surface of the fourth insulating layer facing the second pillar in the second direction is substantially equal to a fifth distance between the side surface of the fourth insulating layer and a side surface of the fifth wiring layer facing the second pillar in the second direction.

7. The semiconductor storage device according to claim 6, wherein
the second distance is less than each of the fourth and fifth distances, and the third distance is less than each of the fourth and fifth distances.

8. The semiconductor storage device according to claim 1, wherein the side surfaces of the first and second insulating layers and the second and third wiring layers are substantially flat.

9. The semiconductor storage device according to claim 1, wherein
the side surfaces of the second insulating layer and the second and third wiring layers are substantially flat, and
a sixth distance between the side surfaces of the first insulating layer and the second wiring layer in the second direction is greater than each of the second and third distances.

10. The semiconductor storage device according to claim 1, wherein the first insulating layer has a concave in a surface perpendicular to the side surface of thereof and closer to the second wiring layer than the first wiring layer in the first direction.

* * * * *